United States Patent
Yamazaki et al.

(10) Patent No.: US 11,417,773 B2
(45) Date of Patent: Aug. 16, 2022

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Erika Takahashi, Kanagawa (JP); Hiroaki Honda, Kanagawa (JP); Kentaro Sugaya, Kanagawa (JP); Shinya Sasagawa, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 76 days.

(21) Appl. No.: 17/049,042

(22) PCT Filed: May 14, 2019

(86) PCT No.: PCT/IB2019/053959
§ 371 (c)(1),
(2) Date: Oct. 20, 2020

(87) PCT Pub. No.: WO2019/224656
PCT Pub. Date: Nov. 28, 2019

(65) Prior Publication Data
US 2021/0242345 A1    Aug. 5, 2021

(30) Foreign Application Priority Data
May 25, 2018    (JP) ............... JP2018-100621

(51) Int. Cl.
*H01L 21/02*    (2006.01)
*H01L 29/24*    (2006.01)
(Continued)

(52) U.S. Cl.
CPC .... *H01L 29/7869* (2013.01); *H01L 21/02554* (2013.01); *H01L 29/045* (2013.01); *H01L 29/24* (2013.01); *H01L 29/66742* (2013.01)

(58) Field of Classification Search
CPC .......... H01L 21/8234; H01L 21/02554; H01L 21/308; H01L 21/8239; H01L 21/768;
(Continued)

(56) References Cited

U.S. PATENT DOCUMENTS 9,082,861 B2    7/2015 Yamazaki
9,331,156 B2    5/2016 Yamazaki et al.
(Continued)

FOREIGN PATENT DOCUMENTS

CN    103107200 A    5/2013
CN    107210227 A    9/2017
(Continued)

OTHER PUBLICATIONS

International Search Report (Application No. PCT/IB2019/053959) dated Aug. 27, 2019.
(Continued)

*Primary Examiner* — Nikolay K Yushin
(74) *Attorney, Agent, or Firm* — Nixon Peabody LLP; Jeffrey L. Costellia

(57) ABSTRACT

A semiconductor device with favorable reliability is provided. The semiconductor device includes a first oxide, a second oxide, a first conductor, a second conductor, a third conductor, a first insulator, and a second insulator. The first conductor is provided in contact with a top surface of the first oxide. The second conductor is provided in contact with the top surface of the first oxide. The first insulator is provided over the first conductor and the second conductor. The second oxide is provided in contact with the top surface of the first oxide. The second insulator is provided over the
(Continued)

second oxide. The third conductor is provided over the second insulator. The first insulator has a function of inhibiting diffusion of oxygen. The first oxide includes indium, an element M (M is gallium, yttrium, or tin), and zinc. The first oxide includes a first region overlapping with the third conductor. A region of the first region in contact with the second oxide includes a region in which an atomic ratio of aluminum (Al) to the element M is less than 0.1.

12 Claims, 27 Drawing Sheets

(51) Int. Cl.
*H01L 29/786* (2006.01)
*H01L 29/04* (2006.01)
*H01L 29/66* (2006.01)

(58) Field of Classification Search
CPC . H01L 27/088; H01L 27/1156; H01L 27/108; H01L 29/7869; H01L 29/24; H01L 29/517
See application file for complete search history.

(56) References Cited

U.S. PATENT DOCUMENTS

| 10,186,614 | B2 | 1/2019 | Asami |
| 2013/0119373 | A1 | 5/2013 | Yamazaki |
| 2018/0019343 | A1 | 1/2018 | Asami |
| 2020/0373430 | A1 | 11/2020 | Shima et al. |

FOREIGN PATENT DOCUMENTS

| JP | 2010-267763 A | 11/2010 |
| JP | 2012-109562 A | 6/2012 |
| JP | 2013-123045 A | 6/2013 |
| JP | 2016-029730 A | 3/2016 |
| KR | 2013-0052513 A | 5/2013 |
| KR | 2017-0107997 A | 9/2017 |
| TW | 201234577 | 8/2012 |
| WO | WO-2012/057196 | 5/2012 |
| WO | WO-2016/125052 | 8/2016 |

OTHER PUBLICATIONS

Written Opinion (Application No. PCT/IB2019/053959) dated Aug. 27, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

1471

1472

1473

1474

1475

1476

1477

1478

FIG. 23A
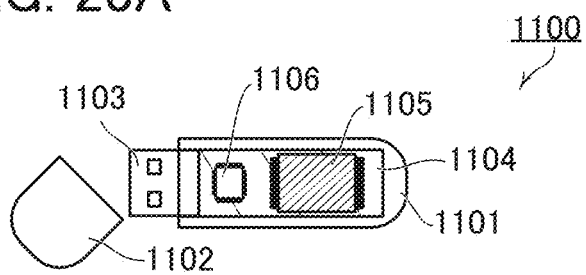
FIG. 23B    FIG. 23C
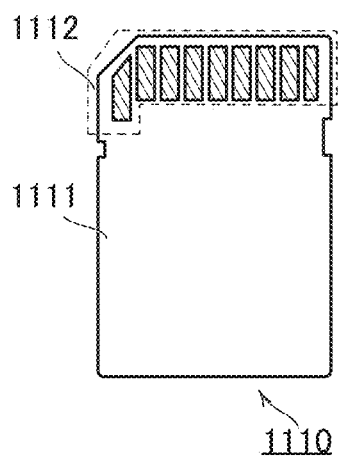 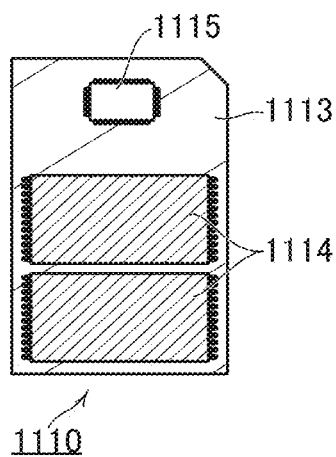
FIG. 23D    FIG. 23E
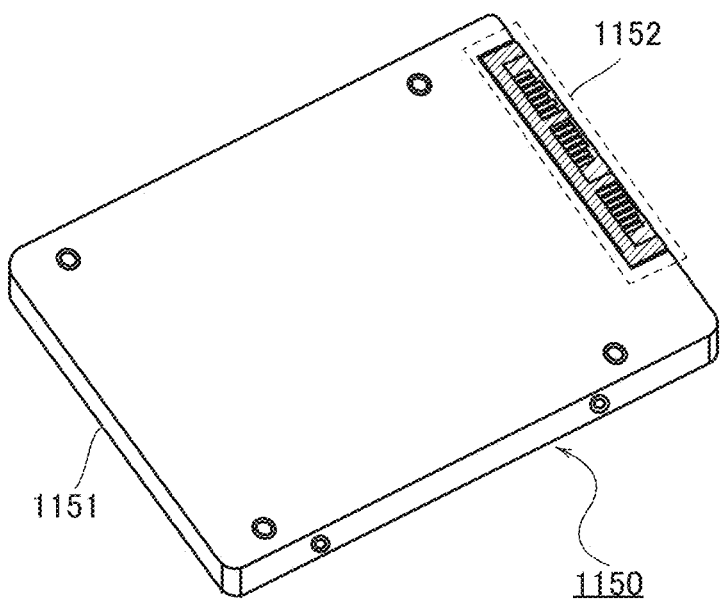 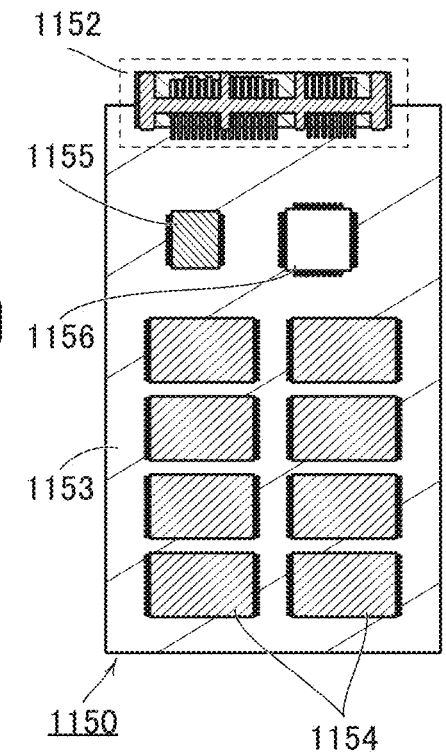

5nm

5nm

5nm

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Alternatively, one embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

As semiconductor thin films applicable to the transistors, silicon-based semiconductor materials have been widely known, but oxide semiconductors have been attracting attention as alternative materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a CAAC (c-axis aligned crystalline) structure and an nc (nanocrystalline) structure, which are not single crystal nor amorphous, have been found (see Non-Patent Documents 1 to 3). In Non-Patent Documents 1 and 2, a technique for fabricating a transistor using an oxide semiconductor having the CAAC structure is disclosed. Moreover, Non-Patent Documents 4 and 5 disclose that a fine crystal is included even in an oxide semiconductor which has lower crystallinity than an oxide semiconductor having the CAAC structure or the nc structure.

In addition, a transistor which includes IGZO as an active layer has an extremely low off-state current (see Non-Patent Document 6), and an LSI and a display utilizing the transistor characteristics have been reported (see Non-Patent Documents 7 and 8).

REFERENCE

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

[Non-Patent Document 3] S. Ito et al., "The Proceedings of AM-FPD'13 Digest of Technical Papers", 2013, p. 151-154

[Non-Patent Document 4] S. Yamazaki et al., "ECS Journal of Solid State Science and Technology", 2014, volume 3, issue 9, p. Q3012-Q3022

[Non-Patent Document 5] S. Yamazaki, "ECS Transactions", 2014, volume 64, issue 10, p. 155-164

[Non-Patent Document 6] K. Kato et al., "Japanese Journal of Applied Physics", 2012, volume 51, p. 021201-1-021201-7

[Non-Patent Document 7] S. Matsuda et al., "2015 Symposium on VLSI Technology Digest of Technical Papers", 2015, p. T216-T217

[Non-Patent Document 8] S. Amano et al., "SID Symposium Digest of Technical Papers", 2010, volume 41, issue 1, p. 626-629

SUMMARY OF THE INVENTION

Problems to be Solved by the Invention

An object of one embodiment of the present invention is to provide a highly reliable semiconductor device. Another object of one embodiment of the present invention is to provide a semiconductor device having favorable electrical characteristics. Another object of one embodiment of the present invention is to provide a semiconductor device with high on-state current. Another object of one embodiment of the present invention is to provide a semiconductor device having high frequency characteristics. Another object of one embodiment of the present invention is to provide a semiconductor device that can be miniaturized or highly integrated. Another object of one embodiment of the present invention is to provide a semiconductor device with high productivity.

An object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device with low power consumption. Another object of one embodiment of the present invention is to provide a novel semiconductor device.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a semiconductor device which includes a first oxide, a second oxide, a first conductor, a second conductor, a third conductor, a first insulator, and a second insulator. The first conductor is provided in contact with a top surface of the first oxide. The second conductor is provided in contact with the top surface of the first oxide. The first insulator is provided over the first conductor and the second conductor. The second oxide is provided in contact with the top surface of the first oxide. The second insulator is provided over the second oxide. The third conductor is provided over the second insulator. The first insulator has a function of inhibiting diffusion of oxygen. The first oxide includes indium, an element M (M is gallium, yttrium, or tin), and zinc. The first oxide includes a first region overlapping with the third conductor. A region of the first region in contact with the second oxide includes a region in which an atomic ratio of aluminum to the element M is less than 0.1.

One embodiment of the present invention is a semiconductor device which includes a first oxide, a second oxide, a first conductor, a second conductor, a third conductor, a first insulator, and a second insulator. The first conductor is provided in contact with a top surface of the first oxide. The second conductor is provided in contact with the top surface of the first oxide. The first insulator is provided over the first conductor and the second conductor. The second oxide is in contact with the top surface of the first oxide. The second insulator is provided over the second oxide. The third conductor is provided over the second insulator. The first insulator includes aluminum. The first oxide includes indium, an element M (M is gallium, yttrium, or tin), and zinc. The first oxide includes a first region overlapping with the third conductor. A region of the first region in contact with the second oxide includes a region in which an atomic ratio of aluminum to the element M is less than 0.1.

One embodiment of the present invention is a semiconductor device which includes a first oxide, a second oxide, a third oxide, a first conductor, a second conductor, a third conductor, a fourth conductor, a first insulator, a second insulator, a third insulator, a fourth insulator, and a fifth insulator. The fifth insulator is provided over the fourth conductor. The third insulator is provided over the fifth insulator. The third oxide is provided over the third insulator. The first oxide is provided over the third oxide. The first conductor is provided in contact with a top surface of the first oxide. The second conductor is provided in contact with the top surface of the first oxide. The first insulator is provided over the first conductor and the second conductor. The fourth insulator is provided over the first insulator. An opening reaching the first oxide is provided in the first insulator and the fourth insulator. The second oxide is provided in contact with the top surface of the first oxide to cover an inner wall of the opening. The second insulator is provided to cover the inner wall of the opening with the second oxide therebetween. The third conductor is provided to be embedded in the opening with the second insulator and the second oxide therebetween. The first insulator includes aluminum. The first oxide includes indium, an element M (M is gallium, yttrium, or tin), and zinc. The first oxide includes a first region overlapping with the third conductor. A region of the first region in contact with the second oxide includes a region in which an atomic ratio of aluminum to the element M is less than 0.1. The fourth conductor includes a region overlapping with the third conductor with the first region therebetween.

In the semiconductor device described above, it is preferable that the second oxide include indium, the element M (M is gallium, yttrium, or tin), and zinc and the first region include a channel formation region. In a cross section in a channel width direction, a region of the first region in contact with the second oxide preferably includes a region including a c-axis aligned crystal along a normal direction to a bottom surface of the first oxide, and a region of the second oxide in contact with the first region preferably includes a region including a c-axis aligned crystal along the normal direction to the bottom surface of the first oxide.

In the semiconductor device described above, it is preferable that the first oxide include a second region in contact with the first conductor and a third region in contact with the second conductor. A thickness of the first oxide in the first region is preferably smaller than a thickness of the first oxide in the second region. A thickness of the first oxide in the first region is preferably smaller than a thickness of the first oxide in the third region.

One embodiment of the present invention is a fabrication method of a semiconductor device including a first oxide, a second oxide, a third oxide, a first conductor, a second conductor, a third conductor, a first insulator, a second insulator, a third insulator, and a fourth insulator. The following are performed: forming the third insulator; forming the third oxide over the third insulator; forming the first oxide over the third oxide using a target including indium, an element M (M is gallium, yttrium, or tin), and zinc by a sputtering method; forming a conductive film to be the first conductor and the second conductor over the first oxide; processing the third oxide, the first oxide, and the conductive film into an island shape; forming the first insulator so as to include aluminum over the third insulator and the conductive film; forming the fourth insulator over the first insulator; forming an opening from which the first oxide is exposed in the fourth insulator, the first insulator, and the conductive film, so that the first conductor and the second conductor are formed; removing part of the exposed first oxide; forming the second oxide over part of the first oxide and the fourth insulator; forming the second insulator over the second oxide; forming the third conductor over the second insulator; and removing part of the second oxide, the second insulator, and the third conductor to expose part of the fourth insulator.

In the fabrication method of the semiconductor device described above, a removal of part of the first region is performed by using diluted ammonia water.

In the fabrication method of the semiconductor device described above, an ammonia concentration of the diluted ammonia water is greater than or equal to 0.1% and less than or equal to 0.5%.

In the fabrication method of the semiconductor device described above, a region of the first oxide in contact with the second oxide includes a region in which an atomic ratio of aluminum to the element M is less than 0.1.

Effect of the Invention

According to one embodiment of the present invention, it is possible to provide a highly reliable semiconductor device. According to another embodiment of the present invention, a semiconductor device having favorable electrical characteristics can be provided. According to another embodiment of the present invention, a semiconductor device with high on-state current can be provided. According to another embodiment of the present invention, a semiconductor device having high frequency characteristics can be provided. According to another embodiment of the present invention, a semiconductor device that can be miniaturized or highly integrated can be provided. According to another embodiment of the present invention, a semiconductor device with high productivity can be provided.

A semiconductor device capable of retaining data for a long time can be provided. A semiconductor device with high-speed data writing can be provided. A semiconductor device with high design flexibility can be provided. Alternatively, a semiconductor device with low power consumption can be provided. A novel semiconductor device can be provided.

Note that the descriptions of the effects do not disturb the existence of other effects. One embodiment of the present invention does not have to have all of these effects. Effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 23 (A) to (E) Schematic views of memory devices of one embodiment of the present invention.

MODE FOR CARRYING OUT THE INVENTION

Figure 1A:
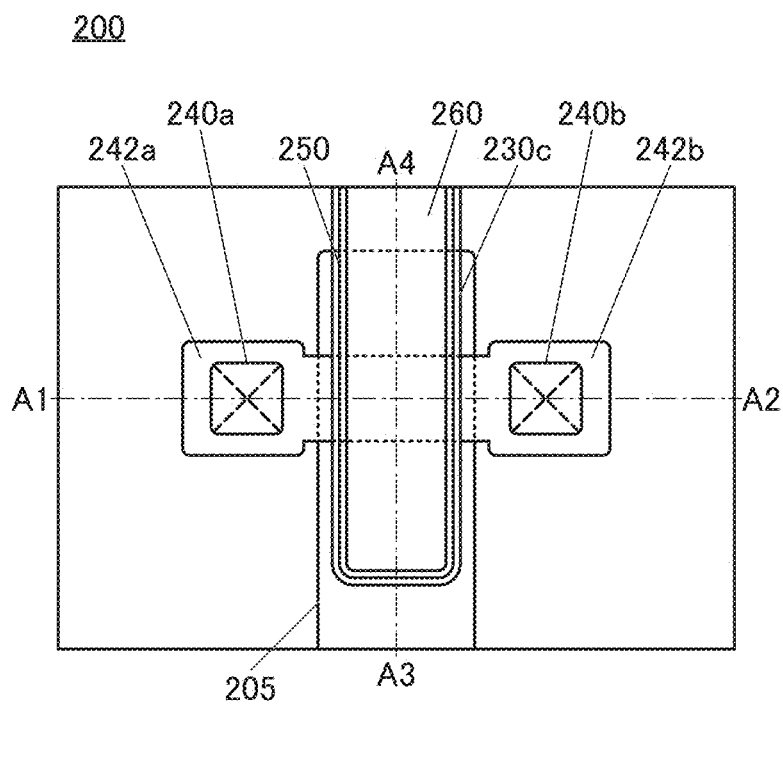
FIG. 1 (A) A top view of a semiconductor device of one embodiment of the present invention. (B), (C) Cross-sectional views of the semiconductor device of one embodiment of the present invention.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In addition, in the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

In a top view (also referred to as a plan view), a perspective view, or the like, particularly, some components might not be illustrated for easy understanding of the invention. In addition, some hidden lines and the like might not be shown.

Note that the ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which are used to specify one embodiment of the present invention in some cases.

In addition, in this specification and the like, terms for describing arrangement, such as "over" and "below", are used for convenience to describe the positional relationship between components with reference to drawings. Furthermore, the positional relationship between components is changed as appropriate in accordance with a direction in which the components are described. Thus, terms for the description are not limited to terms used in the specification, and description can be made appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or text, a connection relationship other than a connection relationship shown in drawings or text is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel region refers to a region through which current mainly flows.

Furthermore, functions of a source and a drain might be interchanged with each other when a transistor of opposite polarity is employed or when the direction of current is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, and the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, and the average value in a channel formation region.

Note that in this specification and the like, depending on the transistor structure, a channel width in a region where a channel is actually formed (hereinafter also referred to as an effective channel width) is different from a channel width shown in a top view of a transistor (hereinafter also referred to as an apparent channel width) in some cases. For example, in a transistor whose gate electrode covers the side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in a side surface of the semiconductor is increased in some cases. In that case, effective channel width is greater than apparent channel width.

In such a case, effective channel width is sometimes difficult to estimate by actual measurement. For example, estimation of effective channel width from a design value requires assumption that the shape of a semiconductor is known. Accordingly, in the case where the shape of a semiconductor is not known accurately, it is difficult to measure effective channel width accurately.

Furthermore, in this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed by the mixing of impurities, for example. Furthermore, when the semiconductor is silicon, examples of the impurity that changes characteristics of the semiconductor include oxygen, Group 1 elements except for hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, the term "insulator" can be replaced with an insulating film or an insulating layer. Furthermore, the term "conductor" can be replaced with a conductive film or a conductive layer.

Moreover, the term "semiconductor" can be replaced with a semiconductor film or a semiconductor layer.

In addition, in this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In addition, in this specification and the like, "normally off" means that current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

Figure 1C:
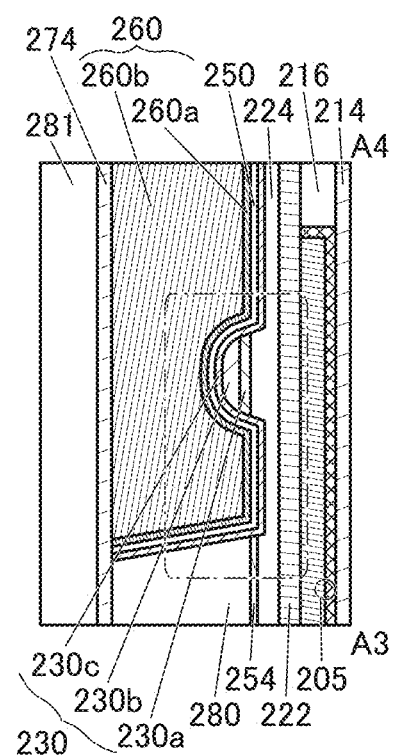
Figure 1B:
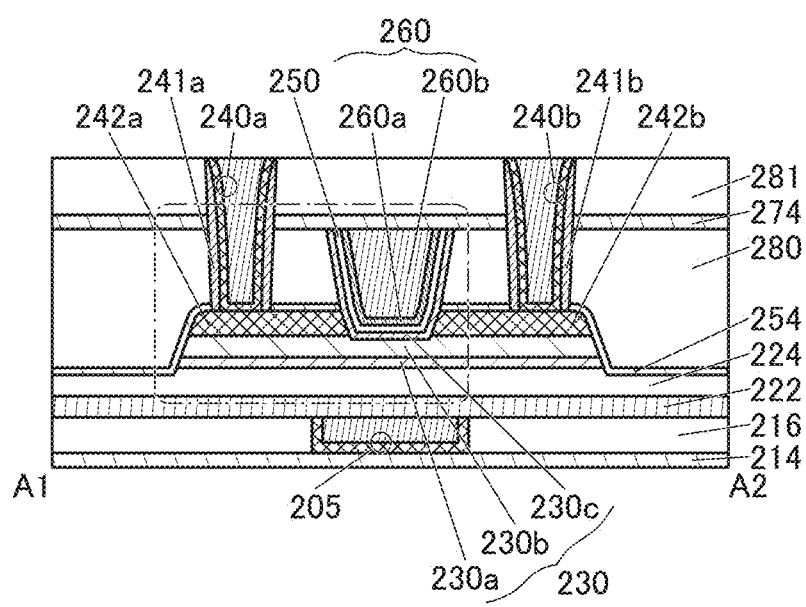

In this embodiment, an example of a semiconductor device including a transistor 200 of one embodiment of the present invention is described below.
<Structure Example 1 of Semiconductor Device>
FIGS. 1(A) to 1(C) are a top view and cross-sectional views of the transistor 200 of one embodiment of the present invention and the periphery of the transistor 200.

FIG. 1(A) is a top view of a semiconductor device including the transistor 200. FIGS. 1(B) and 1(C) are cross-sectional views of the semiconductor device. Here, FIG. 1(B) is a cross-sectional view of a portion indicated by a dashed-dotted line A1-A2 in FIG. 1(A), and is a cross-sectional view in the channel length direction of the transistor 200. In addition, FIG. 1(C) is a cross-sectional view of a portion indicated by a dashed-dotted line A3-A4 in FIG. 1(A), and is a cross-sectional view in the channel width direction of the transistor 200. Note that for clarity of the drawing, some components are not illustrated in the top view of FIG. 1(A).

The semiconductor device of one embodiment of the present invention includes the transistor 200, and an insulator 214, an insulator 216, an insulator 280, an insulator 274, and an insulator 281 that function as interlayer films. A conductor 240 (a conductor 240a and a conductor 240b) functioning as a plug and being electrically connected to the transistor 200 is also included. Note that an insulator 241 (an insulator 241a and an insulator 241b) is provided in contact with a side surface of the conductor 240 functioning as a plug.

In contact with the inner wall of an opening formed in the insulator 280, the insulator 274, and the insulator 281, the insulator 241 is provided. In contact with its side surface, a first conductor of the conductor 240 is provided, and a second conductor of the conductor 240 is further provided on the inner side. Here, the level of a top surface of the conductor 240 and the level of a top surface of the insulator 281 can be substantially the same. Note that although the transistor 200 having a structure in which the first conductor of the conductor 240 and the second conductor of the conductor 240 are stacked is shown, the present invention is not limited thereto. For example, the conductor 240 may be provided as a single layer or to have a stacked-layer structure of three or more layers. In the case where a structure body has a stacked-layer structure, layers may be distinguished by ordinal numbers corresponding to the formation order.
[Transistor 200]
As shown in FIGS. 1(A) to 1(C), the transistor 200 is positioned over a substrate (not shown) and includes a conductor 205 to be embedded in the insulator 216; an insulator 222 positioned over the insulator 216 and the conductor 205; an insulator 224 positioned over the insulator 222; an oxide 230 (an oxide 230a, an oxide 230b, and an oxide 230c) positioned over the insulator 224; an insulator 250 positioned over the oxide 230; a conductor 260 (a conductor 260a and a conductor 260b) positioned over the insulator 250; a conductor 242a and a conductor 242b in contact with part of a top surface of the oxide 230b; and the insulator 254 positioned in contact with part of a top surface of the insulator 224, a side surface of the oxide 230a, a side surface of the oxide 230b, a side surface of the conductor 242a, a top surface of the conductor 242a, a side surface of the conductor 242b, and a top surface of the conductor 242b.

The oxide 230 preferably includes the oxide 230a positioned over the insulator 224, the oxide 230b positioned over the oxide 230a, and the oxide 230c that is positioned over the oxide 230b and that is at least partly in contact with the top surface of the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

In the transistor 200, a metal oxide functioning as a semiconductor is preferably used in the oxide 230 including the channel formation region.

The transistor 200 using an oxide semiconductor in the channel formation region has an extremely low leakage current (off-state current) in a non-conduction state; thus, a semiconductor device with low power consumption can be provided. An oxide semiconductor can be deposited by a sputtering method or the like, and thus can be used as the transistor 200 included in a highly integrated semiconductor device.

For example, for the oxide 230, a metal oxide such as In-M-Zn oxide (the element M is one or more kinds selected from gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, gallium, yttrium, or tin is preferably used as the element M. Furthermore, In-M oxide, In—Zn oxide, or M-Zn oxide may be used as the oxide 230.

The conductor 260 functions as a first gate (also referred to as top gate) electrode of the transistor 200, and the conductor 242a and the conductor 242b function as a source electrode and a drain electrode. In the transistor 200, the conductor 260 functioning as the first gate electrode is formed in a self-aligned manner to fill an opening formed in the insulator 280 and the like. The formation of the conductor 260 in this manner allows the conductor 260 to be positioned certainly in the region between the conductor 242a and the conductor 242b without alignment.

Note that the conductor 260 preferably includes the conductor 260a and the conductor 260b positioned over the conductor 260a. For example, the conductor 260a is preferably positioned so as to cover the bottom surface and side surface of the conductor 260b. Moreover, as shown in FIG. 1(B), a top surface of the conductor 260 is substantially aligned with a top surface of the insulator 250 and a top surface of the oxide 230c.

The conductor 205 sometimes functions as a second gate (also referred to as bottom gate) electrode. In that case, by changing the potential applied to the conductor 205 not in conjunction with but independently of the potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, drain current when a potential applied to the conductor 260 is 0 V can be lower in the case where a negative potential is applied to the conductor 205 than in the case where the negative potential is not applied to the conductor 205.

The insulator 222 and the insulator 254 preferably have a function of inhibiting diffusion of hydrogen (for example, at least one of a hydrogen atom, a hydrogen molecule, and the like). In addition, the insulator 222 and the insulator 254 preferably have a function of inhibiting diffusion of oxygen (for example, at least one of an oxygen atom and an oxygen molecule, and the like). For example, the insulator 222 and the insulator 254 preferably have a function of inhibiting diffusion of one or both of hydrogen and oxygen than the insulator 224. The insulator 222 and the insulator 254 preferably have a function of inhibiting diffusion of one or both of hydrogen and oxygen than the insulator 250. The insulator 222 and the insulator 254 preferably have a function of inhibiting diffusion of one or both of hydrogen and oxygen than the insulator 280.

Note that in this specification, a film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. A barrier film having conductivity is sometimes referred to as a conductive barrier film.

As shown in FIG. 1(B), the insulator 254 is preferably in contact with the top surfaces of the conductor 242a and the conductor 242b, the side surfaces of the conductor 242a and the conductor 242b except facing side surfaces of the conductor 242a and the conductor 242b, the side surfaces of the oxide 230a and the oxide 230b, and the part of the top surface of the insulator 224. Thus, the insulator 280 is isolated from the insulator 224, the oxide 230a, and the oxide 230b by the insulator 254. Thus, impurities such as hydrogen contained in the insulator 280 or the like can be inhibited from entering the insulator 224, the oxide 230a, and the oxide 230b, which can give favorable electrical characteristics and reliability to the transistor 200.

As shown in FIG. 1B, the transistor 200 has a structure in which the insulator 274 is in contact with the top surfaces of the conductor 260, the insulator 250, and the oxide 230c.

With such a structure, impurities such as hydrogen contained in the insulator 281 and the like can be inhibited from entering the insulator 250. Thus, adverse effects on the electric characteristics of the transistor and the reliability of the transistor can be suppressed.

In the case where an element included in the conductor 242 (the conductor 242a and the conductor 242b) functioning as a source electrode and a drain electrode and provided over and in contact with the oxide 230 has a function of absorbing oxygen in the oxide 230, a low-resistance region is sometimes partly formed between the oxide 230 and the conductor 242, or in the vicinity of the surface of the oxide 230. In this case, in the low-resistance region, an impurity (hydrogen, nitrogen, a metal element, or the like) that has entered an oxygen vacancy serves as a donor, so that the carrier density increases in some cases.

Figure 2A:
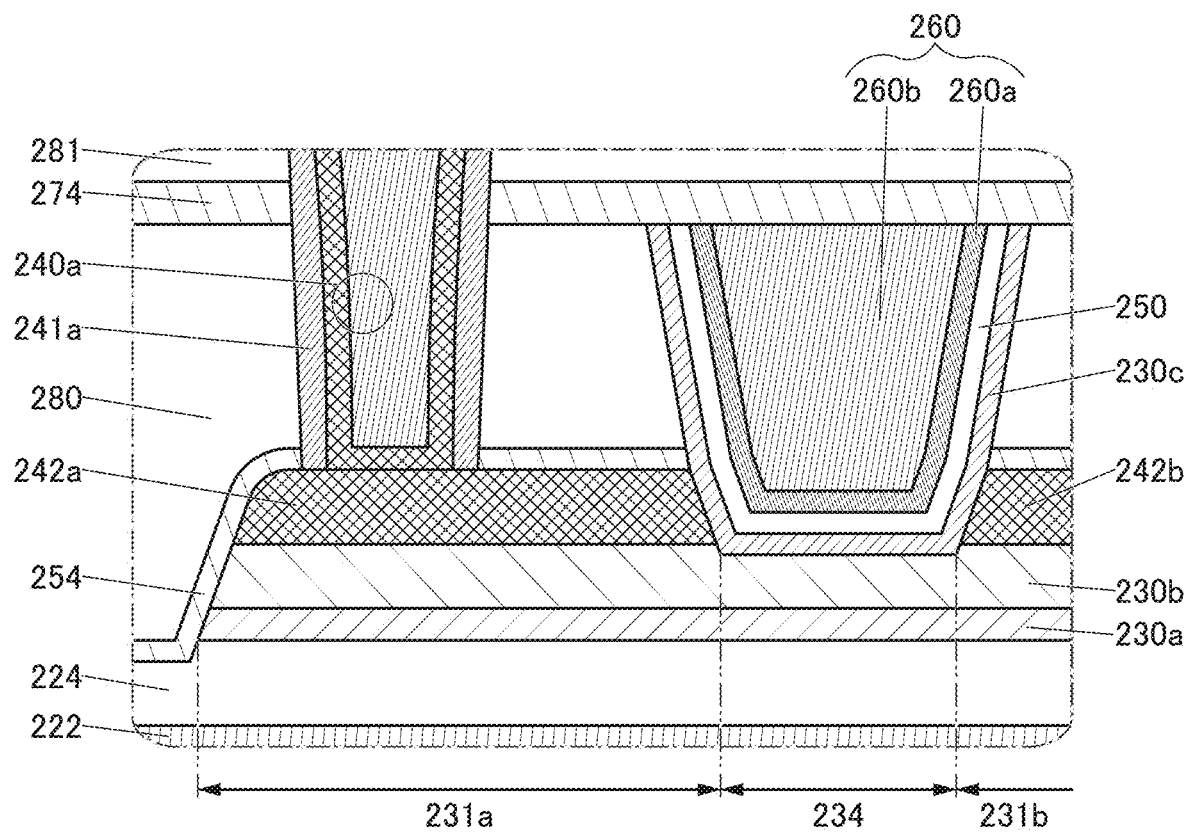
FIG. 2 (A), (B) Cross-sectional views of a semiconductor device of one embodiment of the present invention.

Here, an enlarged view of a region surrounded by a dashed dotted line in FIG. 1(B) is shown in FIG. 2(A). As shown in FIG. 2(A), the oxide 230 includes a region 234 functioning as a channel formation region of the transistor 200 and a region 231 (a region 231a and a region 231b) functioning as a source region and a drain region of the transistor 200. The region 231 is a region with a high carrier density and a low resistance. In addition, the region 231 may include part of the low-resistance region. The region 234 has a lower carrier density than the region 231.

In FIG. 2(A), the region 231 and the region 234 are formed in the oxide 230b; however, the present invention is not limited thereto. The region 231 and the region 234 may be formed in the oxide 230a and the oxide 230c, for example. Furthermore, although the boundaries between the regions are shown as being substantially perpendicular to a top surface of the oxide 230b in FIG. 2(A), this embodiment is not limited thereto. For example, in some cases, the region 234 extends toward the conductor 240 around the surface of the oxide 230b and is narrowed around a bottom surface of the oxide 230b.

A transistor using an oxide semiconductor is likely to change its electrical characteristics when impurities and oxygen vacancies exist in a channel formation region of the oxide semiconductor, which might affect the reliability. Examples of the impurities include aluminum (Al) and silicon (Si). Entry of the impurities into the channel formation region forms defect states or oxygen vacancies in some cases. Moreover, when the channel formation region includes oxygen vacancies, the transistor tends to have normally-on characteristics. Therefore, the impurities and oxygen vacancies are preferably reduced as much as possible in the channel formation region of the oxide semiconductor and in the vicinity thereof.

If the impurities exist in the channel formation region of the oxide semiconductor, the crystallinity of the channel formation region may decrease, and the crystallinity of an oxide in contact with the channel formation region may decrease. For example, the ion radii of Al and Si are smaller than the ion radii of In and Zn. Therefore, when In-M-Zn oxide is used as the oxide semiconductor and Al or Si is contained in the oxide semiconductor, the crystal structure of the oxide semiconductor is distorted, whereby crystallinity of the oxide semiconductor is decreased. Low crystallinity of the channel formation region tends to result in deterioration in stability or reliability of the transistor. Moreover, if the crystallinity of the oxide in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor, Specifically, the concentration of the above impurities obtained by secondary ion mass spectrometry (SIMS) is lower than or equal to $1\times10^{18}$ atoms/cm$^3$, preferably lower than or equal to $2\times10^{16}$ atoms/cm$^3$ in and around the channel formation region of the oxide semiconductor. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

As shown in FIG. 2(A), the channel formation region of the transistor 200 is formed in the region 234 of the oxide 230b. The oxide 230c is provided over the oxide 230b in the region 234. That is, as the vicinity of the channel formation region, the interface between the oxide 230b and the oxide 230c in the region 234 and the oxide 230c on the side in contact with the region 234 of the oxide 230b are included in some cases. In addition, an opening for providing the oxide 230c or the like is formed in the insulator 280 and the insulator 254, the region 234 of the oxide 230b is exposed, and then the oxide 230c is formed. Thus, the above impurities are presumed to be derived from components of the films which are partly removed (the insulator 280 and the insulator 254) and from components included in a member that is used in a device used for the formation of the opening.

Thus, in order to reduce the impurity concentration in the channel formation region and in the vicinity thereof, cleaning treatment is preferably performed after the opening is formed and before the oxide 230c is formed. In the cleaning treatment, for example, an aqueous solution in which hydrofluoric acid or ammonia water is diluted with carbonated water or pure water, pure water, or carbonated water is preferably used. Note that in this specification, in some cases, an aqueous solution in which commercial hydrofluoric acid is diluted with pure water is referred to as diluted hydrofluoric acid, and an aqueous solution in which commercial ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid may be higher than or equal to 0.01 ppm and lower than or equal to 100 ppm, preferably higher than or equal to 0.1 ppm and lower than or equal to 10 ppm.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water. For the cleaning treatment, particularly for the first cleaning treatment, diluted ammonia water is preferably used. The first cleaning treatment preferably removes impurities attached to the region 234 of the oxide 230b and the second cleaning treatment preferably removes the cleaning liquid used for the first cleaning treatment.

Furthermore, ultrasonic cleaning may be performed using diluted hydrofluoric acid, diluted ammonia water, pure water, carbonated water, or the like as the cleaning treatment above. Ultrasonic cleaning gets cleaning effect by the combination of chemical and physical effect, whereby impurities can be effectively reduced.

In ultrasonic cleaning, ultrasonic is applied to a liquid such as a chemical solution or pure water used for the cleaning treatment to vibrate the molecule in the liquid, which increases cleaning effect. In addition, when ultrasonic is applied, vacuum bubbles that are called cavitation are generated in the liquid in some cases. The cavitation is repeatedly generated and collapses by application of ultrasonic. The cavitation collapse generates shock waves to further increase the cleaning effect. On the other hand, the shock wave by the cavitation collapse may cause damage to precision devices such as a semiconductor device or the like. In general, it is known that when the frequency more than or equal to 10 kHz and 200 kHz is applied to a liquid in the ultrasonic cleaning, vibration acceleration of the molecule in a liquid is small but cavitation is generated a lot; the higher the frequency becomes, the larger the vibration acceleration of the molecule in a liquid becomes and cavitation generation decreases. Therefore, the frequency for the ultrasonic cleaning can be determined in consideration of the cleaning effect and the damage to a semiconductor device to be cleaned.

In this embodiment, the frequency more than or equal to 10 kHz and less than 200 kHz, more than or equal to 200 kHz and less than 900 kHz, or more than or equal to 900 kHz and less than or equal to 3 MHz can be used for the ultrasonic cleaning. A frequency of more than or equal to 200 kHz and preferably more than or equal to 900 kHz is used for suppressing cavitation generation. With the use of the frequency, cavitation generation can be suppressed and damage to an exposed film at the cleaning treatment can be reduced while high cleaning effect is kept.

The cleaning treatment can remove impurities attached to the region 234 of the oxide 230b. Note that the kind and concentration of the liquid used for the cleaning treatment, the frequency used for the ultrasonic cleaning, and the combination of cleaning methods are appropriately selected depending on the impurities to be removed and the structure of the semiconductor device to be cleaned.

Removal of the impurities can reduce the density of defect states of the region 234. Furthermore, the crystallinity of the oxide 230b in the region 234 and the oxide 230c on the side in contact with the region 234 can be increased. Thus, the stability or reliability of the transistor can be improved, so that a transistor having favorable electrical characteristics or high reliability can be obtained. Note that the above cleaning treatment may reduce the thickness of the oxide 230b in the region 234 as shown in FIG. 2(A). In that case, the thickness of the oxide 230b in the region 234 is smaller than the thickness of the oxide 230b in the region 231.

Alternatively, among insulating materials having a function of inhibiting diffusion of hydrogen or oxygen, an insulating material not containing an impurity element for the oxide semiconductor is preferably used as a main component for the insulator 254. For example, it is preferable to use an insulating material containing at least one of the elements contained in the oxide semiconductor as a main component. In that case, when part of the insulator 254 is removed, impurities from the insulator 254 are not generated, so that the attachment of impurities to the region 234 in the oxide 230b can be suppressed.

When an. In-M-Zn oxide is used as the oxide 230b, for example, an oxide containing the element M, an M-Zn oxide, an In-M-Zn oxide, or the like can be used as the insulator 254. Note that when an In-M-Zn oxide is used as the insulator 254, the atomic ratio of the element M to indium is preferably large. For example, the atomic ratio is set to greater than or equal to 1. When the atomic ratio is increased, the insulating property of the oxide can become high.

The above-described cleaning treatment or using the above insulating material for the insulator 254 can increase the crystallinity of the oxide 230b and the oxide 230c. For example, the c-axis of the crystal included in the oxide 230b is parallel to the c-axis of the crystal included in the oxide 230c at the interface between the top surface of the oxide 230b and the oxide 230c and in the vicinity thereof, and a low crystallinity region is not observed in the region between the crystal included in the oxide 230b and the crystal included in the oxide 230c. In this specification, such a case may be expressed that the crystal has continuity. Specifically, when the crystal structure of the oxide semiconductor included in the oxide 230b and oxide 230c has a CAAC structure, a layered crystal structure is observed from the top surface of the oxide 230b to the bottom surface of the oxide 230c, When the crystal has continuity at the interface between the top surface of the oxide 230b and the oxide 230c and in the vicinity thereof, defect states of the oxide at the interface and in the vicinity thereof can be reduced, and favorable transistor characteristics can be obtained.

In the case where the In-M-Zn oxide is deposited by a sputtering method, the crystal included in the In-M-Zn oxide is likely to have c-axis alignment in a normal direction of the surface on which the oxide film is formed. In the cross section of the transistor 200 in the channel width direction of the transistor 200, a region of the oxide 230b in contact with the oxide 230c includes a c-axis-aligned crystal along a normal direction of the bottom surface of the oxide 230b, and a region of the oxide 230c in contact with the oxide 230b includes a c-axis-aligned crystal along a normal direction of the top surface of the oxide 230b. Furthermore, when the impurity concentration of the surface of the oxide 230b is reduced, a region with low crystallinity is not observed in a region between these crystals.

Note that the transistor 200 has a structure in which three layers of the oxide 230a, the oxide 230b, and the oxide 230c are stacked in a channel formation region and its vicinity; however, the present invention is not limited thereto. For example, the oxide 230 may be a single layer of the oxide 230b or has a two-layer structure of the oxide 230a and the oxide 230b, a two-layer structure of the oxide 230b and the oxide 230c, or a stacked-layer structure including four or more layers. Alternatively, each of the oxide 230a, the oxide 230b, and the oxide 230c may have a stacked-layer structure.

Figure 2B:
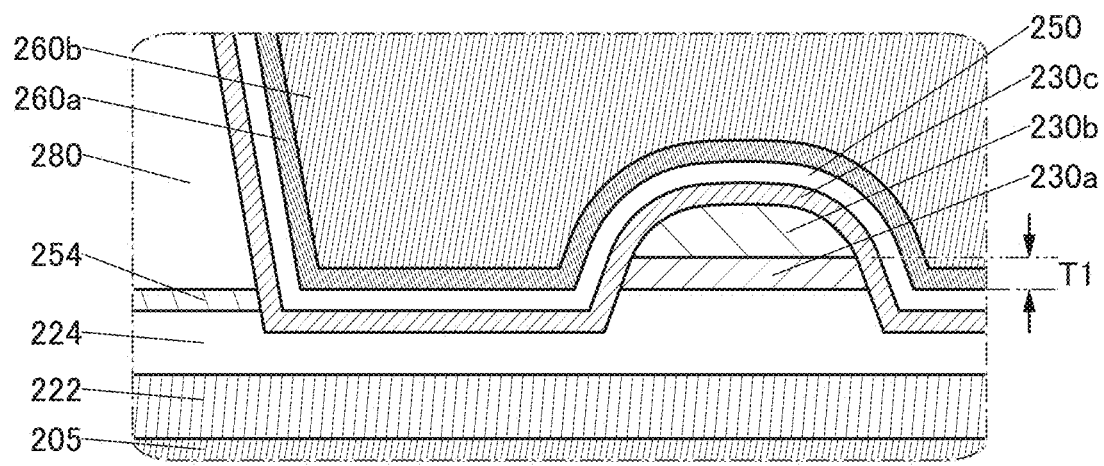

FIG. 2(B) shows an enlarged view of a region surrounded by the dashed-dotted line in FIG. 1(C). As shown in FIG. 2(B), in the channel width direction of the transistor 200, the level of the bottom surface of the conductor 260 in a region where the conductor 260 and the oxide 230b do not overlap with each other is preferably lower than the level of the bottom surface of the oxide 230b. When the conductor 260 functioning as the gate electrode covers the side and top surfaces of the channel formation region of the oxide 230b with the insulator 250 and the like therebetween, the electric field of the conductor 260 is likely to affect the entire channel formation region of the oxide 230b. Thus, the on-state current of the transistor 200 can be increased and the frequency characteristics of the transistor 200 can be improved. When the bottom surface of the insulator 222 is a reference and the difference between the level of the bottom surface of the conductor 260 in a region where the conductor 260, the oxide 230a, and the oxide 230b do not overlap with each other and the level of the bottom surface of the oxide 230b is T1, T1 is greater than or equal to 0 nm and less than or equal to 100 Lim, preferably greater than or equal to 3 JIM and less than or equal to 50 nm, further preferably greater than or equal to 5 nm and less than or equal to 20 nm.

According to the above, a highly reliable semiconductor device can be provided. In addition, a semiconductor device having favorable electrical characteristics can be provided. A semiconductor device including a transistor with a high on-state current can be provided. A semiconductor device including a transistor having high frequency characteristics can be provided. In addition, a semiconductor device including a transistor having a low off-state current can be provided.

<Specific Structure of Semiconductor Device>

The detailed structure of the semiconductor device including the transistor 200 according to one embodiment of the present invention is described below.

The insulator 214 preferably functions as an insulating barrier film that inhibits diffusion of impurities such as water and hydrogen into the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (an insulating material through which the above impurities are less likely to pass). Alternatively, it is preferable to use an insulating material having a function of inhibiting diffusion of oxygen (e.g., at least one of an oxygen atom, an oxygen molecule, and the like).

For example, aluminum oxide, silicon nitride, or the like is preferably used as the insulator 214. Accordingly, impurities such as water and hydrogen can be inhibited from diffusing into the transistor 200 side from the side closer to the substrate than the insulator 214. Alternatively, oxygen contained in the insulator 224 and the like can be prevented from being diffused to the substrate side of the insulator 214. Note that the insulator 214 may have a stacked-layer structure of aluminum oxide and silicon nitride.

Furthermore, the insulator 214 is preferably formed of silicon nitride by a sputtering method, for example. Specifically, a silicon target is used and a mixed gas of argon and nitrogen is used as the sputtering gas in the formation of the insulator 214. Since hydrogen is not used for forming the insulator 214, the hydrogen concentration in the insulator 214 can be low, and impurities such as water and hydrogen can be prevented from being diffused into the transistor 200 side from the substrate side through the insulator 214. Specifically, the hydrogen concentration in the insulator 214 measured by SIMS is set lower than $5\times10^{21}$ atoms/cm$^3$, preferably lower than $5\times10^{20}$ atoms/cm$^3$, further preferably lower than $1\times10^{20}$ atoms/cm$^3$.

The permittivity of the insulator 216, the insulator 280, and the insulator 281 each functioning as an interlayer film is preferably lower than that of the insulator 214. When a material with a low permittivity is used as an interlayer film, the parasitic capacitance generated between wirings can be reduced. For example, as the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The insulator 216 preferably includes a region that has a low hydrogen concentration and contains oxygen in excess of that in the stoichiometric composition (hereinafter also referred to as an excess-oxygen region), or preferably contains oxygen that is released by heating (hereinafter also referred to as excess oxygen). This can inhibit entry of hydrogen into the oxide 230 or reduce oxygen vacancies in the oxide 230 by supplying oxygen to the oxide 230. Thus, a transistor that has stable electrical characteristics with a small variation in electrical characteristics and improved reliability can be provided.

In the insulator with low hydrogen concentration and an excess oxygen region or excess oxygen, specifically, the hydrogen concentration measured by SIMS is set to lower than $5 \times 10^{20}$ atoms/cm$^3$, preferably lower than $1 \times 10^{20}$ atoms/cm$^3$, more preferably lower than $5 \times 10^{19}$ atoms/cm'. Furthermore, in the TDS (Thermal Desorption Spectroscopy) analysis, the amount of released oxygen molecules is greater than or equal to $2.0 \times 10^{14}$ molecules/cm$^2$, preferably greater than or equal to $1.0 \times 10^{15}$ molecules/cm$^2$. Note that the temperature of the film surface in the TDS analysis is preferably within the range of 100° C. to 700° C., or within the range of 100° C. to 500° C. For the insulator, for example, silicon oxide deposited by a sputtering method under an oxygen-containing atmosphere can be used.

The insulator 216 may have a stacked-layer structure. For example, the insulator 216 may have a structure where an insulator similar to the insulator 214 is provided at least in a portion that is in contact with a side surface of the conductor 205. With such a structure, oxidization of the conductor 205 due to oxygen contained in the insulator 216 can be inhibited. Alternatively, decrease in an oxygen amount contained in the insulator 216 by the conductor 205 can be inhibited.

The conductor 205 is provided to overlap with the oxide 230 and the conductor 260. Furthermore, the conductor 205 is preferably provided to be embedded in the insulator 214 or the insulator 216. Preferably, the planarity of the top surface of the conductor 205 is made favorable. For example, the average surface roughness (Ra) of the top surface of the conductor 205 is less than or equal to 1 urn, preferably less than or equal to 0.5 nm, further preferably less than or equal to 0.3 nm. This achieves favorable planarity of the insulator 224 formed over the conductor 205 and the increase in crystallinity of the oxide 230a, the oxide 230b, and the oxide 230c.

Note that as shown in FIG. 1(B), the conductor 205 is preferably provided larger than the channel formation region in the oxide 230. As shown in FIG. 1(C), it is preferable that the conductor 205 also extend to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction. Since the above-described structure is included, the channel formation region of the oxide 230 can be electrically surrounded by the electric field of the conductor 260 functioning as the first gate electrode and the electric field of the conductor 205 functioning as the second gate electrode.

Furthermore, as shown in FIG. 1(C), the conductor 205 is extended to function as a wiring as well. However, not limited to this structure, a structure where a conductor functioning as a wiring is provided below the conductor 205 may be employed. In addition, the conductor 205 is not necessarily provided in each transistor. For example, the conductor 205 may be shared by a plurality of transistors.

Although a first conductor of the conductor 205 and a second conductor of the conductor 205 are stacked in the transistor 200, the present invention is not limited thereto. For example, the conductor 205 may have a single-layer structure or a stacked-layer structure of three or more layers.

Here, for the first conductor of the conductor 205, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom is preferably used. Alternatively, it is preferable to use a conductive material having a function of inhibiting diffusion of oxygen (e.g., at least one of an oxygen atom, an oxygen molecule, and the like). Note that in this specification, a function of inhibiting diffusion of impurities or oxygen means a function of inhibiting diffusion of any one or all of the impurities and the oxygen.

When a conductive material having a function of inhibiting oxygen diffusion is used as the first conductor of the conductor 205, the conductivity of the second conductor of the conductor 205 can be inhibited from being lowered because of oxidation. As the conductive material which has a function of inhibiting diffusion of oxygen, for example, tantalum, tantalum nitride, ruthenium, or ruthenium oxide is preferably used. Accordingly, the first conductor of the conductor 205 is a single layer or stacked layers of the above conductive materials. For example, the first conductor of the conductor 205 may be a stack of tantalum, tantalum nitride, ruthenium, or ruthenium oxide and titanium or titanium nitride.

A conductive material containing tungsten, copper, or aluminum as its main component is preferably used as the second conductor of the conductor 205. Note that the second conductor of the conductor 205 is shown as a single layer but may have a stacked-layer structure; for example, the second conductor of the conductor 205 may be a stack of the above conductive material and titanium or titanium nitride.

Furthermore, a structure where three layers (the first conductor of the conductor 205, the second conductor of the conductor 205 and a third conductor of the conductor 205) are stacked may be employed for the conductor 205. For example, after the first conductor of the conductor 205 and the second conductor of the conductor 205 are formed, part of the second conductor of the conductor 205 may be removed to form a groove in the second conductor of the conductor 205, and the third conductor of the conductor 205 may be embedded in the groove. Thus, the conductor 205 whose top surface is flat can be formed. The improvement in planarity of the top surfaces of the insulator 216 and the conductor 205 can improve crystallinity of the oxide 230a, the oxide 230b, and the oxide 230c. Note that the third conductor of the conductor 205 is preferably formed using a material similar to that for the first conductor of the conductor 205 or the second conductor of the conductor 205.

The insulator 222 and the insulator 224 each have a function of a gate insulator.

The insulator 222 preferably functions as an insulating barrier film that inhibits diffusion of impurities such as water and hydrogen into the transistor 200 from the substrate side. For example, the insulator 222 preferably has lower hydrogen permeability than the insulator 224. By surrounding the insulator 224, the oxide 230, and the like with the insulator 222 and the insulator 254, the entry of impurities such as water and hydrogen from the outside into the insulator 224 and the oxide 230 can be inhibited.

It is preferable that the insulator 222 have a function of inhibiting diffusion of oxygen (e.g., at least one of oxygen atoms, oxygen molecules, and the like). For example, the insulator 222 preferably has lower oxygen permeability than the insulator 224. When the insulator 222 has a function of inhibiting diffusion of oxygen or impurities, oxygen contained in the oxide 230 can be inhibited from diffusing into the substrate side, which is preferable. Furthermore, the conductor 205 can be inhibited from reacting with oxygen contained in the insulator 224 and the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and diffusion of impurities such as hydrogen from the periphery of the transistor 200 into the oxide 230.

In addition, aluminum oxide, bismuth oxide, germanium oxide, niobium oxide, silicon oxide, titanium oxide, tungsten oxide, yttrium oxide, or zirconium oxide may be added to the above insulator, for example. In addition, these insulators may be subjected to nitriding treatment.

A stack of silicon oxide, silicon oxynitride, or silicon nitride over these insulators may be used as the insulator 222.

Alternatively, for example, a single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 222. With miniaturization and high integration of transistors, a problem such as leakage current may arise because of a thinner gate insulator. When a high-k material is used as an insulator functioning as the gate insulator, a gate potential during operation of the transistor can be reduced while the physical thickness of the gate insulator is kept.

Here, it is preferable that oxygen be released from the insulator 224 in contact with the oxide 230 by heating. For example, silicon oxide, silicon oxynitride, or the like is used as appropriate for the insulator 224. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide in which the amount of released oxygen converted into oxygen atoms is greater than or equal to $1.0 \times 10^{18}$ atoms/$cm^3$, preferably greater than or equal to $1.0 \times 10^{19}$ atoms/$cm^3$, further preferably greater than or equal to $2.0 \times 10^{19}$ atoms/$cm^3$ or greater than or equal to $3.0 \times 10^{20}$ atoms/$cm^3$ in TDS analysis. Note that the temperature of the film surface in the TDS analysis is preferably within the range of 100° C. to 700° C., or 100° C. to 400° C.

The insulator 224 preferably has a low hydrogen concentration and includes an excess-oxygen region or excess oxygen, and may be formed using a material similar to that used as the insulator 216, for example.

Note that the insulator 222 and the insulator 224 may each have a stacked-layer structure of two or more layers. In that case, not limited to a stacked-layer structure formed of the same material, a stacked-layer structure formed of different materials may be employed. For example, an insulator similar to the insulator 224 may be provided below the insulator 222.

A metal oxide functioning as an oxide semiconductor is preferably used as the oxide 230. For example, as the metal oxide to be the channel formation region, it is preferable to use a metal oxide having a band gap of 2 eV or more, preferably 2.5 eV or more. With the use of a metal oxide having such a wide band gap, the off-state current of the transistor can be reduced. With the use of such a transistor, a semiconductor device with low power consumption can be provided.

Note that the oxide 230 preferably has a stacked-layer structure using oxides with different chemical compositions. Specifically, the atomic ratio of the element M to metal elements of main components in the metal oxide used as the oxide 230a is preferably greater than the atomic ratio of the element M to metal elements of main components in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

The oxide 230b and the oxide 230c preferably have crystallinity. For example, a CAAC-OS (c-axis aligned crystalline oxide semiconductor) described later is preferably used. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

The conduction band minimum of each of the oxide 230a and the oxide 230c is preferably closer to the vacuum level than the conduction band minimum of the oxide 230b. In other words, the electron affinity of each of the oxide 230a and the oxide 230c is preferably smaller than the electron affinity of the oxide 230b. In that case, a metal oxide that can be used as the oxide 230a is preferably used as the oxide 230c. At this time, the oxide 230b serves as a main carrier path.

The conduction band minimum gradually changes at a junction portion of the oxide 230a, the oxide 230b, and the oxide 230c. In other words, the conduction band minimum at a junction portion of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b or the oxide 230b and the oxide 230c contain the same element as a main component in addition to oxygen, a mixed layer with a low density of defect states can be formed. For example, in the case where the oxide 230b is an In—Ga—Zn oxide, an In—Ga—Zn oxide, a Ga—Zn oxide, a gallium oxide, or the like may be used as the oxide 230a and the oxide 230c.

Specifically, as the oxide 230a, a metal oxide with In:Ga:Zn=1:3:4 [atomic ratio] or 1:1:0.5 [atomic ratio] is used. As the oxide 230b, a metal oxide having In:Ga:Zn=1:1:1 [atomic ratio], In:Ga:Zn=4:2:3 [atomic ratio], or In:Ga:Zn=3:1:2 [atomic ratio], or Ga:Zn=2:5 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used.

When the metal oxide is deposited by a sputtering method, the atomic ratio is not limited to the atomic ratio of the deposited metal oxide and may be the atomic ratio of a sputtering target used for depositing the metal oxide.

When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and high frequency characteristics.

The oxide 230c may have a stacked-layer structure of two or more layers.

The conductor 242 (the conductor 242a and the conductor 242b) functioning as the source electrode and the drain electrode is provided over the oxide 230h The thickness of the conductor 242 is within the range of 1 nm to 50 nm, preferably within the range of 2 nm to 25 nm, for example.

For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like for forming the conductor 242. These materials are preferable because they are a conductive material that is not easily oxidized or a material that maintains the conductivity even when absorbing oxygen.

Like the insulator 214 and the like, the insulator 254 preferably functions as a barrier film that inhibits the diffusion of impurities such as water or hydrogen into the transistor 200 from the insulator 280 side. For example, the insulator 254 preferably has lower hydrogen permeability than the insulator 224.

It is also preferable that the insulator 254 have a function of inhibiting diffusion of oxygen (e.g., at least one of oxygen atoms, oxygen molecules, and the like). For example, the insulator 254 preferably has lower oxygen permeability than the insulator 280 or the insulator 224.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Accordingly, oxygen can be supplied from the region to the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 into the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably deposited as the insulator 254, for example. In this case, the insulator 254 is preferably deposited using an atomic layer deposition (ALD) method. An ALD method is a deposition method that provides good coverage, and thus can prevent formation of disconnection or the like due to unevenness of the insulator 254.

An insulator containing aluminum nitride may be used as the insulator 254, for example. It is preferable to use a nitride insulator that satisfies the composition formula $AlN_x$ (x is a real number greater than 0 and less than or equal to 2, preferably x is a real number greater than 0.5 and less than or equal to 1.5) as the insulator 254. Accordingly, a film having an excellent insulating property and high thermal conductivity can be obtained, and thus dissipation of heat generated in driving the transistor 200 can be increased. Alternatively, aluminum titanium nitride, titanium nitride, or the like can be used as the insulator 254. In that case, deposition by a sputtering method is preferable because deposition can be performed without using a highly-oxidizing gas such as oxygen or ozone as a deposition gas. Alternatively, silicon nitride, silicon nitride oxide, or the like can be used.

Alternatively, an oxide containing gallium may be used as the insulator 254, for example. An oxide containing gallium is preferable because it sometimes has a function of inhibiting diffusion of at least one of hydrogen and oxygen. Note that gallium oxide, gallium zinc oxide, indium gallium zinc oxide, or the like can be used as an oxide containing gallium. Note that when indium gallium zinc oxide is used as the insulator 254, the atomic ratio of gallium to indium is preferably large. When the atomic ratio is increased, the insulating property of the oxide can be high.

The insulator 254 can have a multilayer structure of two or more layers. For example, the insulator 254 may have a two-layer structure in which the first layer is deposited by a sputtering method in an oxygen-containing atmosphere, after which the second layer is deposited by an ALD method. An ALD method is a deposition method achieving excellent step coverage, and thus can prevent formation of disconnection or the like due to unevenness of the first layer. Note that in the case where the insulator 254 has a multi-layer structure of two or more layers, the multi-layer structure may be formed of different materials. For example, a stacked-layer structure of silicon oxide, silicon oxynitride, silicon nitride oxide, or silicon nitride and an insulator having a function of inhibiting permeation of oxygen and impurities such as hydrogen. As the insulator having a function of inhibiting permeation of oxygen and impurities such as hydrogen, an insulator containing an oxide of one or both of aluminum and hafnium can be used, for example.

The insulator 250 functions as a gate insulator. The insulator 250 is preferably positioned in contact with at least part of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with at least part of the oxide 230c, oxygen can be efficiently supplied to the channel formation region of the oxide 230b and oxygen defects in the channel formation region of the oxide 230b can be reduced. Thus, a transistor that has stable electrical characteristics with a small variation in electrical characteristics and improved reliability can be provided. Furthermore, as in the insulator 224, the concentration of impurities such as water and hydrogen in the insulator 250 is preferably reduced. The thickness of the insulator 250 is preferably within the range of 1 nm to 20 nm.

Furthermore, a metal oxide may be provided between the insulator 250 and the conductor 260. The metal oxide preferably inhibits diffusion of oxygen from the insulator 250 to the conductor 260. Provision of the metal oxide that inhibits diffusion of oxygen inhibits diffusion of oxygen from the insulator 250 to the conductor 260. That is, a reduction in the amount of oxygen supplied to the oxide 230 can be inhibited. In addition, oxidation of the conductor 260 due to oxygen from the insulator 250 can be inhibited.

Note that the metal oxide functions as part of the gate insulator in some cases. Therefore, when silicon oxide, silicon oxynitride, or the like is used as the insulator 250, a metal oxide that is a high-k material with a high dielectric constant is preferably used as the metal oxide. When the gate insulator has a stacked-layer structure of the insulator 250 and the metal oxide, the stacked-layer structure can have thermal stability and high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

The metal oxide may function as part of the first gate electrode. For example, an oxide semiconductor that can be used as the oxide 230 can be used as the metal oxide. In that case, when the conductor 260 is deposited by a sputtering method, the metal oxide can have a reduced electric resistance to be a conductor.

With the metal oxide, the on-state current of the transistor 200 can be increased without a reduction in the influence of the electric field from the conductor 260. Since the distance between the conductor 260 and the oxide 230 is kept by the physical thicknesses of the insulator 250 and the metal oxide, a leakage current between the conductor 260 and the oxide 230 can be reduced. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

Specifically, a metal oxide containing one kind or two or more kinds selected from hafnium, aluminum, gallium, yttrium, zirconium, tungsten, titanium, tantalum, nickel, germanium, magnesium, and the like can be used. In particular, an insulator containing an oxide of one or both of aluminum and hafnium is preferably used. Furthermore, the oxide semiconductor that can be used as the oxide 230 can also be used as the metal oxide when the resistance thereof is reduced.

Although FIGS. 1(B) and 1(C) shows the conductor 260 having a two-layer structure of the conductor 260a and the conductor 260b, the conductor 260 may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule, and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As the conductive material which has a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, for the conductor 260b, a conductive material containing tungsten, copper, or aluminum as its main component can be used. The conductor 260b may have a stacked-layer structure, for example, a stacked-layer structure of any of the above conductive materials and titanium or titanium nitride.

The insulator 280 is provided over the insulator 224, the oxide 230, and the conductor 242 with the insulator 254 therebetween. For example, as the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water and hydrogen in the insulator 280 is preferably reduced. In addition, the insulator 280 may have a stacked-layer structure of two or more layers. In addition, a top surface of the insulator 280 may be planarized. Moreover, the insulator 280 preferably has a low hydrogen concentration and includes an excess-oxygen region or excess oxygen, and may be formed using a material similar to that for the insulator 216, for example.

As in the insulator 214 or the like, the insulator 274 preferably functions as an insulating barrier film that inhibits impurities such as water and hydrogen from diffusing into the insulator 280 from above. In addition, the insulator 274 preferably has a low hydrogen concentration and has a function of inhibiting diffusion of hydrogen. As the insulator 274, for example, an insulator that can be used as the insulator 214, the insulator 254, or the like may be used.

An insulator 281 functioning as an interlayer film is preferably provided over the insulator 274. As in the insulator 224 or the like, the concentration of impurities such as water and hydrogen in the insulator 281 is preferably reduced.

The conductor 240a and the conductor 240b are placed in openings formed in the insulator 281, the insulator 274, the insulator 280, and the insulator 254. The conductor 240a and the conductor 240b are provided to face each other with the conductor 260 therebetween. Note that the level of the top surfaces of the conductor 240a and the conductor 240b may be on the same surface as the top surface of the insulator 281.

Note that the insulator 241a is provided in contact with the sidewall of the opening of the insulator 281, the insulator 274, the insulator 280, and the insulator 254 and the first conductor of the conductor 240a is formed on the side surface. The conductor 242a is positioned on at least part of the bottom portion of the opening, and thus the conductor 240a is in contact with the conductor 242a. Similarly, the insulator 241b is provided in contact with the sidewall of the opening of the insulator 281, the insulator 274, the insulator 280, and the insulator 254, and the first conductor of the conductor 240b is formed on the side surface. The conductor 242b is positioned on at least part of the bottom portion of the opening, and thus the conductor 240b is in contact with the conductor 242b.

For the conductor 240a and the conductor 240b, a conductive material containing tungsten, copper, or aluminum as its main component is preferably used. In addition, the conductor 240a and the conductor 240b may each have a stacked-layer structure.

When the conductor 240a and the conductor 240b have a stacked-layer structure, a conductor having a function of inhibiting permeation of an impurity such as water or hydrogen is preferably used as a conductor in contact with the conductor 242 and in contact with the insulator 254, the insulator 280, the insulator 274, and the insulator 281 with the insulator 241 therebetween. For example, tantalum, tantalum nitride, titanium, titanium nitride, ruthenium, ruthenium oxide, or the like is preferably used. The conductive material having a function of inhibiting the permeation of impurities such as water and hydrogen may be used as a single layer or stacked layers. The use of the conductive material can prevent oxygen added to the insulator 280 from being absorbed by the conductor 240a and the conductor 240b. Moreover, impurities such as water and hydrogen contained in a layer above the insulator 281 can be inhibited from entering the oxide 230 through the conductor 240a and the conductor 240b.

For the insulator 241a and the insulator 241b, an insulator that can be used as the insulator 254 is used, for example. Since the insulator 241a and the insulator 241b are provided in contact with the insulator 254, impurities such as water and hydrogen contained in the insulator 280 or the like can be inhibited from diffusing into the oxide 230 through the conductor 240a and the conductor 240b. In addition, oxygen contained in the insulator 280 can be prevented from being absorbed by the conductor 240a and the conductor 240b. Note that the insulator 241a and the insulator 241b can be formed by an ALD method or a chemical vapor deposition (CVD) method.

In addition, although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure; for example, stacked layers of the above conductive material, and titanium or titanium nitride. Note that the conductor may be formed to be embedded in an opening provided in an insulator.

In addition, although not shown, an insulator having resistivity within the range of $1.0 \times 10^{13}$ Ωcm to $1.0 \times 10^{15}$ Ωcm, preferably within the range of $5.0 \times 10^{13}$ Ωcm to $5.0 \times 10^{14}$ Ωcm is preferably provided to cover the conductor. It is preferable that an insulator having resistivity in the above range be provided over the conductor, in which case the insulator can disperse electric charge accumulated in the transistor 200 or between wirings of the conductor or the like and can inhibit defects in characteristics and electrostatic breakdown of the transistor and an electronic device including the transistor due to the electric charge, while maintaining the insulating property.

<Constituent Material of Semiconductor Device>

Constituent materials that can be used for the semiconductor device are described below.

<<Substrate>>

As a substrate over which the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

As miniaturization and high integration of the transistor progress, for example, a problem such as leakage current may arise because of a thinner gate insulator. When a high-k material is used as the insulator functioning as a gate insulator, the voltage when the transistor operates can be reduced while keeping the physical thickness of the gate insulator. In contrast, when a material with low relative permittivity is used as the insulator functioning as an interlayer film, parasitic capacitance generated between wirings can be reduced. Thus, a material is preferably selected depending on the function of an insulator.

In addition, examples of the insulator with high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of the insulator with low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting the permeation of oxygen and impurities such as hydrogen (e.g., the insulator 214, the insulator 222, the insulator 254, the insulator 274, and the like), the electrical characteristics of the transistor can be stable. As the insulator having a function of inhibiting the transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting the permeation of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be compensated for.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used as the channel formation region of the transistor, a stacked-layer structure in which a material containing the above metal element and a conductive material containing oxygen are combined is preferably used as the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

As the oxide 230, a metal oxide functioning as an oxide semiconductor is preferably used. A metal oxide that can be applied to the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

<Structure of Metal Oxide>

Oxide semiconductors (metal oxides) can be classified into a single crystal oxide semiconductor and a non-single-crystal oxide semiconductor. Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as a grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide including few impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (for example, a region within a size of 1 nm to 10 nm, in particular, a region within a size of 1 nm to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that In—Ga—Zn oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Metal Oxide>

Next, the case where the above metal oxide is used in a channel formation region of a transistor is described.

Note that when the above metal oxide is used in a channel formation region of a transistor, a transistor having high field-effect mobility can be achieved. In addition, the transistor having high reliability can be achieved.

Furthermore, a metal oxide with a low carrier density is preferably used as the transistor. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. For example, a metal oxide has a carrier density lower than $8 \times 10^{11}/cm^{-3}$, preferably lower than $1 \times 10^{11}/cm^{-3}$, further preferably lower than $1 \times 10^{10}/cm^{-3}$, and higher than or equal to $1 \times 10^{-9}/cm^{-3}$.

The highly purified intrinsic or substantially highly purified intrinsic metal oxide has a low density of defect states and accordingly has a low density of trap states in some cases.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1 \times 10^{18}$ atoms/cm$^3$, preferably lower than or equal to $2 \times 10^{16}$ atoms/cm$^3$.

Hydrogen contained in a metal oxide reacts with oxygen bonded to a metal atom to be water, and thus forms an oxygen vacancy in some cases. Moreover, when the channel formation region of the metal oxide includes oxygen vacancies, the transistor tends to have normally-on characteristics. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide Obtained by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide in which the impurities are sufficiently reduced is used in a channel formation region of a transistor, stable electrical characteristics can be given.

Note that as a metal oxide used as a semiconductor of a transistor, a thin film having high crystallinity is preferably used. With use of the thin film, the stability or reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, manufacturing cost is increased, and throughput is decreased.

Non-Patent Document 1 and Non-Patent Document 2 have reported that an. In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). Here, it has been reported that nc-IGZO has a periodic atomic arrangement in a microscopic region (for example, a region within a size of 1 nm to 3 nm and there is no regularity of crystal orientation between different regions.

Non-Patent Document 4 and Non-Patent Document 5 have shown changes in average crystal size due to electron beam irradiation to thin films of CAAC-IGZO, nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used as the semiconductor of the transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a low-power-consumption CPU applying a characteristic of low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as drive frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate can reduce the power consumption of the display device. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristic of a low leakage current of the transistor have been studied.

<Manufacturing Method of Semiconductor Device>

Next, a method for manufacturing a semiconductor device including the transistor 200 according to one embodiment of the present invention, which is shown in FIGS. 1(A) to 1(C), is described with reference to FIG. 3(A) to FIG. 10(C).

FIG. 3(A), FIG. 4(A), FIG. 5(A), FIG. 6(A), FIG. 7(A), FIG. 8(A), FIG. 9(A), and FIG. 10(A) are top views. FIG. 3(B), FIG. 4(B), FIG. 5(B), FIG. 6(B), FIG. 7(B), FIG. 8(B), FIG. 9(B), and FIG. 10(B) each are cross-sectional views of a portion along the dashed-dotted line A1-A2 in FIG. 3(A), FIG. 4(A), FIG. 5(A), FIG. 6(A), FIG. 7(A), FIG. 8(A), FIG. 9(A), and FIG. 10(A) and cross sectional views of the transistor 200 in the channel length direction. FIG. 3(C), FIG. 4(C), FIG. 5(C), FIG. 6(C), FIG. 7(C), FIG. 8(C), FIG. 9(C), and FIG. 10(C) each are cross-sectional views of a portion along the dashed-dotted line A3-A4 in FIG. 3(A), FIG. 4(A), FIG. 5(A), FIG. 6(A), FIG. 7(A), FIG. 8(A), FIG. 9(A), and FIG. 10(A) and cross sectional views of the transistor 200 in the channel width direction. Note that for simplification, some components are not shown in the top views of FIG. 3(A), FIG. 4(A), FIG. 5(A), FIG. 6(A), FIG. 7(A), FIG. 8(A), FIG. 9(A), and FIG. 10(A).

First, a substrate (not shown) is prepared, and the insulator 214 is deposited over the substrate. The insulator 214 can be deposited by a sputtering method, a CVD method, a molecular beam epitaxy (MBE) method, a pulsed laser deposition (PLD) method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, the thermal CVD method does not cause plasma damage during deposition, so that a film with few defects can be obtained.

In an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a plasma enhanced ALD (PEALD) method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a film formation method in which particles ejected from a target or the like are deposited, a CVD method and an ALD method are film deposition methods in which a film is deposited by reaction at a surface of an object. Thus, a CVD method and an ALD method are film deposition methods that enable favorable step coverage almost regardless of the shape of an object. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another film deposition method with a high deposition rate, such as a CVD method, in some cases.

When a CVD method or an ALD method is used, the composition of a film to be deposited can be controlled with a flow rate ratio of source gases. For example, by a CVD method or an ALD method, a film with a certain composition can be deposited depending on the flow rate ratio of the source gases. Moreover, with a CVD method or an ALD method, by changing the flow rate ratio of the source gases while depositing the film, a film whose composition is continuously changed can be formed. In the case of depositing a film while changing the flow rate ratio of source gases, as compared with the case of depositing a film with use of a plurality of deposition chambers, the time taken for the deposition can be shortened because the time taken for transfer and pressure adjustment is not required. Thus, the productivity of the semiconductor device can be increased in some cases.

In this embodiment, for the insulator 214, aluminum oxide is deposited by a sputtering method. In addition, the insulator 214 may have a multilayer structure. For example, a structure may be employed in which aluminum oxide is deposited by a sputtering method and aluminum oxide is deposited over the aluminum oxide by an ALD method. Alternatively, a structure may be employed in which aluminum oxide is deposited by an ALD method and aluminum oxide is deposited over the aluminum oxide by a sputtering method.

Next, the insulator 216 is deposited over the insulator 214. The insulator 216 can be deposited by a sputtering method, a CVD method, an MBE method, a PLD method, an ALD method, or the like. In this embodiment, for the insulating film to be the insulator 216, silicon oxynitride is deposited by a CVD method.

Then, an opening reaching the insulator 214 is formed in the insulator 216. Note that examples of the opening include a groove and a slit. A region where the opening is formed may be referred to as an opening portion. Wet etching can be used for the formation of the openings; however, dry etching is preferably used for microfabrication. As the insulator 214, it is preferable to select an insulator that functions as an etching stopper film used in forming the groove by etching the insulator 216. For example, in the case where a silicon oxynitride is used as the insulator 216 in which the groove is to be formed, silicon nitride, aluminum oxide, or hafnium oxide is preferably used as the insulator 214.

As a dry etching apparatus, a capacitively coupled plasma (CCP) etching apparatus including parallel plate electrodes can be used. The capacitively coupled plasma etching apparatus including the parallel plate type electrodes may have a structure in which a high-frequency voltage is applied to one of the parallel plate type electrodes. Alternatively, a structure may be employed in which different high-frequency voltages are applied to one of the parallel plate type electrodes. Alternatively, a structure may be employed in which high-frequency voltages with the same frequency are applied to the parallel plate type electrodes. Alternatively, a structure may be employed in which high-frequency voltages with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the first conductor of the conductor 205 is deposited. The conductive film preferably includes a conductor that has a function of inhibiting the transmission of oxygen. For example, tantalum nitride, tungsten nitride, or titanium nitride can be used. Alternatively, a stacked-layer film of the conductor which has a function of inhibiting the transmission of oxygen and tantalum, tungsten, titanium, molybdenum, aluminum, copper, or a molybdenum-tungsten alloy can be used. The conductive film can be formed by a sputtering method, a CVD method, an MBE method, a PLD method, an ALD method, or the like.

In this embodiment, as the conductive film to be the first conductor of the conductor 205, a tantalum nitride film or a film of tantalum nitride and titanium nitride stacked thereover is deposited by a sputtering method. With the use of such a metal nitride as the first conductor of the conductor 205, even when a metal that is easy to diffuse, such as copper, is used for the second conductor of the conductor 205 described later, the metal can be inhibited from being diffused outward through the first conductor of the conductor 205.

Next, a conductive film to be the second conductor of the conductor 205 is deposited over the conductive film to be the first conductor of the conductor 205. The conductive film can be deposited by a plating method, a sputtering method, a CVD method, an MBE method, a PLD method, an ALD method, or the like. In this embodiment, tungsten is deposited for the conductive film.

Next, chemical mechanical polishing (CMP) treatment is performed to remove part of the conductive film to be the first conductor of the conductor 205 and part of the conductive film to be the second conductor of the conductor 205 to expose the insulator 216, As a result, the conductive film to be the first conductor of the conductor 205 and the conductive film to be the second conductor of the conductor 205 remain only in the opening portion. Thus, the conductor 205 including the first conductor of the conductor 205 and the second conductor of the conductor 205, which has a flat top surface, can be formed (see FIGS. 3(A) to 3(C)). Note that the insulator 216 is partly removed by the CMP treatment in some cases. The improvement in planarity of the top surfaces of the insulator 216 and the conductor 205 results in improved crystallinity of the CAAC-OS that forms the oxide 230b and the oxide 230c.

Note that after the conductor 205 is formed, the following steps may be performed: part of the second conductor of the conductor 205 is removed, a conductive film is formed over the conductor 205 and the insulator 216, and then CMP treatment is performed. By the CMP treatment, part of the conductive film is removed to expose the insulator 216. Note that part of the second conductor of the conductor 205 is preferably removed by a dry etching method or the like. Note that the conductive film is preferably formed using a material similar to that for the first conductor or the second conductor of the conductor 205.

Through the above process, the conductor 205 containing the conductive film can be formed. The improvement in planarity of the top surfaces of the insulator 216 and the conductor 205 results in the improved crystallinity of the CAAC-OS that forms the oxide 230b and the oxide 230c.

Here, a method for forming the conductor 205 which is different from the above will be described below.

Next, the conductive film to be the conductor 205 is deposited over the insulator 214. The conductive film can be formed by a sputtering method, a CVD method, an MBE method, a PLD method, an ALD method, or the like. In addition, the conductive film can be a multilayer film. For example, tungsten is deposited as the conductive film.

Next, the conductive film to be the conductor 205 is processed by a lithography method, so that the conductor 205 is formed.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after thy etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 205, forming a resist mask thereover, and then etching the hard mask material. The etching of the conductive film to be the conductor 205 may be performed after removing the resist mask or with the resist mask remaining. In the latter case, the resist mask sometimes disappears during the etching. The hard mask may be removed by etching after the etching of the conductive film to be the conductor 205. Meanwhile, the hard mask is not necessarily removed when the hard mask material does not affect a post-process or can be utilized in the post-process.

Next, an insulating film to be the insulator 216 is deposited over the insulator 214 and the conductor 205. The insulating film is formed to be in contact with the top surface and side surface of the conductor 205. The insulating film can be deposited by a sputtering method, a CVD method, an MBE method, a PLD method, an ALD method, or the like.

Here, the thickness of the insulating film to be the insulator 216 is preferably greater than or equal to the thickness of the conductor 205. For example, when the thickness of the conductor 205 is 1, the thickness of the insulating film is within the range of 1 to 3.

Next, CMP treatment is performed on the insulating film to be the insulator 216, so that part of the insulating film to be the insulator 216 is removed and a surface of the conductor 205 is exposed. Thus, the conductor 205 and the insulator 216 in contact with the side surface of the conductor 205, each of which has a flat top surface, can be formed. The above is the different forming method of the conductor 205.

Next, the insulator 222 is deposited over the insulator 216 and the conductor 205. An insulator containing an oxide of one or both of aluminum and hafnium is preferably deposited as the insulator 222. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from being diffused into the transistor 200 through the insulator 222, and the generation of oxygen vacancies in the oxide 230 can be inhibited.

The insulator 222 can be deposited by a sputtering method, a CVD method, an MBE method, a PLD method, an ALD method, or the like. In this embodiment, hafnium oxide or aluminum oxide is deposited by an ALD method for the insulator 222.

Next, heat treatment is preferably performed. The heat treatment may be performed at a temperature within the range of 250° C. to 650° C., preferably within the range of 300° C. to 500° C., further preferably within the range of 320° C. and to 450° C. Note that the heat treatment is performed in a nitrogen gas or inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

In this embodiment, the heat treatment is performed in such a manner that treatment is performed at 400° C. in a nitrogen atmosphere for one hour after the deposition of the insulator 222, and then another treatment is successively performed at 400° C. in an oxygen atmosphere for one hour. By the heat treatment, impurities such as water and hydrogen contained in the insulator 222 can be removed. The heat treatment can also be performed after the deposition of the insulator 224, for example.

Next, the insulator 224 is deposited over the insulator 222. The insulator 224 can be deposited by a sputtering method, a CVD method, an MBE method, a PLD method, an ALD method, or the like. In this embodiment, for the insulator 224, a silicon oxynitride film is deposited by a CVD method.

Here, in order to form an excess-oxygen region in the insulator 224, plasma treatment containing oxygen may be performed under reduced pressure. For the plasma treatment containing oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be produced, and RF application to the substrate side allows the oxygen radicals produced by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen contained in the insulator 224 can be removed by selecting the conditions for the plasma treatment as appropriate. In that case, the heat treatment does not need to be performed.

Here, after aluminum oxide is deposited over the insulator 224 by a sputtering method, for example, the aluminum oxide may be subjected to CMP treatment until the insulator 224 is reached. The CMP treatment can planarize and smooth the surface of the insulator 224. When the CMP treatment is performed on the aluminum oxide placed over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can improve the coverage with an oxide deposited later and a decrease in the yield of the semiconductor device in some cases. The deposition of aluminum oxide over the insulator 224 by a sputtering method is preferred because oxygen can be added to the insulator 224.

Figure 3A:
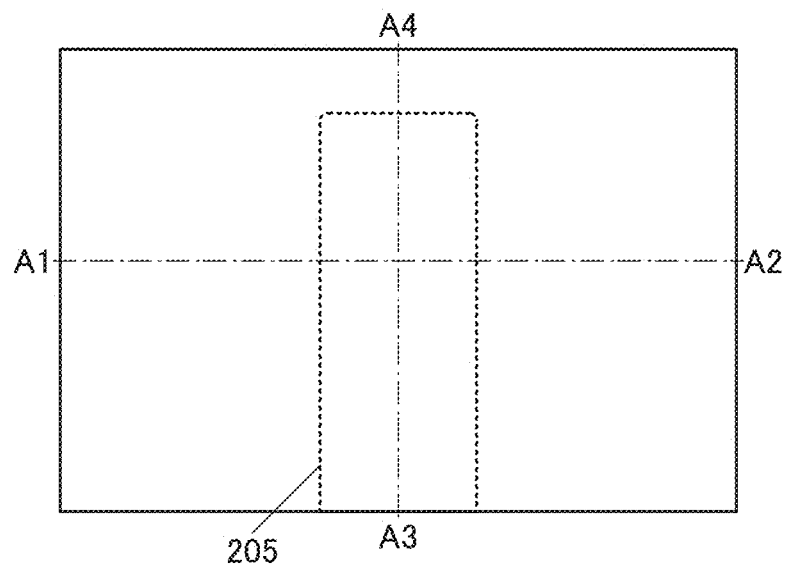
FIG. 3 (A) A top view showing a method for manufacturing a semiconductor device of one embodiment of the present invention. (B), (C) Cross-sectional views showing a method for manufacturing a semiconductor device of one embodiment of the present invention.
Figure 3C:
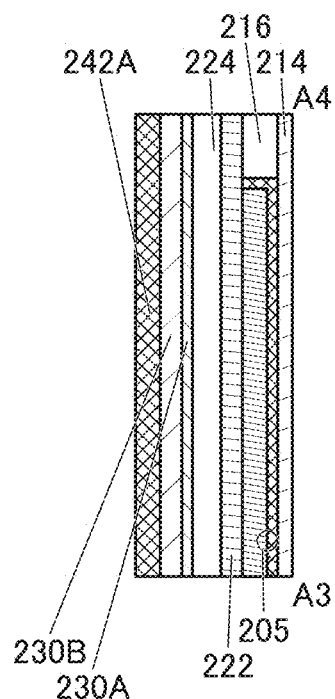
Figure 3B:
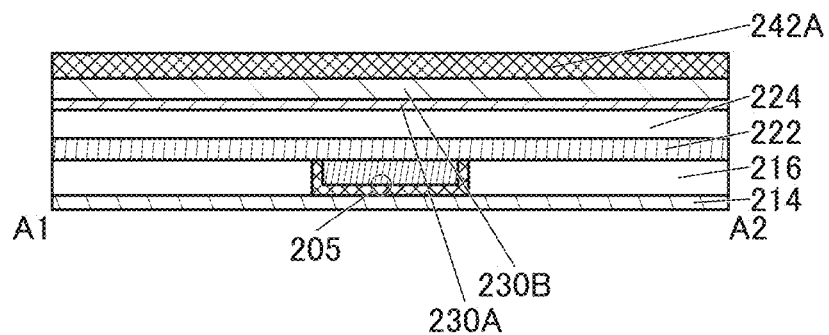
Figure 4A:
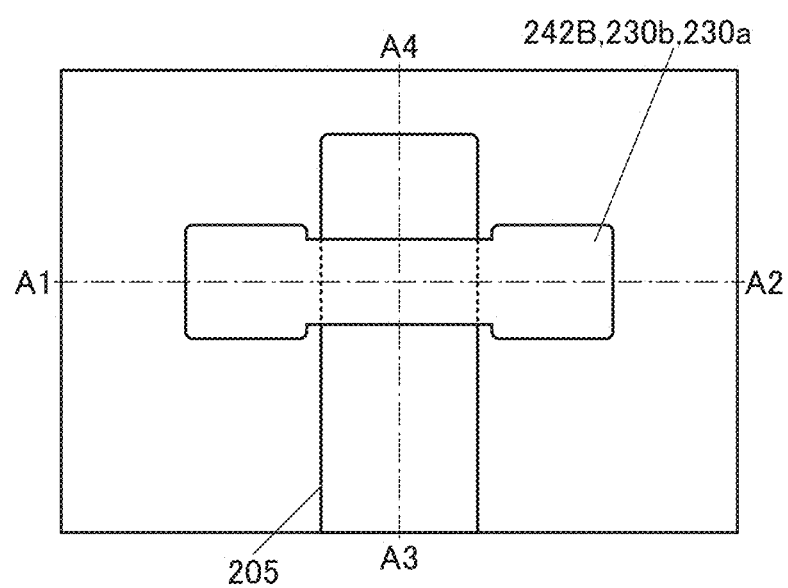
FIG. 4 (A) A top view showing a method for manufacturing a semiconductor device of one embodiment of the present invention. (B), (C) Cross-sectional views showing a method for manufacturing a semiconductor device of one embodiment of the present invention.
Figure 4C:
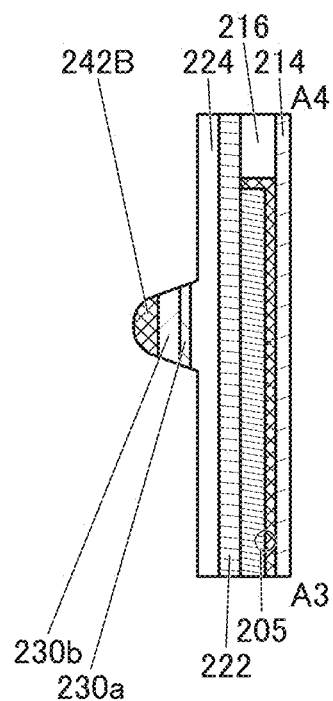
Figure 4B:
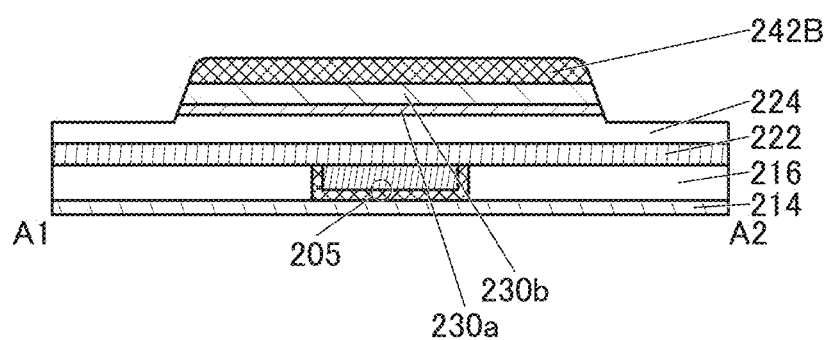

Next, an oxide film 230A to be the oxide 230a and an oxide film 230B to be the oxide 230b are deposited in this order over the insulator 224 (see FIGS. 3(B) and 3(C)). Note that it is preferable to form the oxide film 230A and the oxide film 230B successively without exposure to the air. By the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas are used as a sputtering gas. Increasing the proportion of oxygen contained in the sputtering gas can increase the amount of excess oxygen in the deposited oxide films. In the case where the oxide films are deposited by a sputtering method, the above In-M-Zn oxide target and the like can be used. Furthermore, a direct current (DC) power source or an alternating current (AC) power source such as a radio frequency (RF) power source is connected to a target, and required power can be applied depending on the electric conductivity of the target.

In particular, part of oxygen contained in the sputtering gas is supplied to the insulator 224 during the deposition of the oxide film 230A in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is more than 30% and less than or equal to 100%, preferably within the range of 70% to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen in the sputtering gas is within the range of 1% to 30%, preferably within the range of 5% to 20%, an oxygen-deficient oxide semiconductor is formed. In a transistor in which an oxygen-deficient oxide semiconductor is used for its channel formation region, comparatively high field-effect mobility can be obtained. Furthermore, when deposition is performed while the substrate is heated, the crystallinity of the oxide film can be improved.

In this embodiment, the oxide film 230A is deposited by a sputtering method using an In—Ga—Zn oxide target with In:Ga:Zn=1:3:4 [atomic ratio]. The oxide film 230B is deposited by a sputtering method using an In—Ga—Zn oxide target with In:Ga:Zn=4:2:4.1 [atomic ratio]. Note that each of the oxide films is formed to have characteristics required for the oxide 230 by selecting the deposition condition and the atomic ratio as appropriate.

Here, the insulator 222, the insulator 224, the oxide film 230A, and the oxide film 230B are preferably formed without exposure to the air. For example, a multi-chamber deposition apparatus can be used.

Next, heat treatment may be performed. For the heat treatment, the conditions for the above-described heat treatment can be used. Through the heat treatment, impurities such as water and hydrogen in the oxide film 230A and the oxide film 230B can be removed, for example. In this embodiment, treatment is performed at 400° C. in a nitrogen atmosphere for 1 hour, and treatment is successively performed at 400° C. in an oxygen atmosphere for 1 hour.

Next, a conductive film 242A is deposited over the oxide film 230B. The conductive film 242A can be deposited by a sputtering method, a CVD method, an MBE method, a PLD method, an ALD method, or the like (see FIGS. 3(B) and 3(C)). Note that heat treatment may be performed before the formation of the conductive film 242A. Heat treatment may be performed under reduced pressure, and the conductive film 242A may be successively deposited without exposure to the air. The treatment can remove moisture and hydrogen adsorbed onto the surface of the oxide film 230B and the like, and further can reduce the moisture concentration and the hydrogen concentration of the oxide film 230A and the oxide film 230B. The heat treatment is preferably performed at a temperature within the range of 100° C. to 400° C. In this embodiment, the heat treatment is performed at 200° C.

Next, the oxide film 230A, the oxide film 230B, and the conductive film 242A are processed into island shapes to form the oxide 230a, the oxide 230b, and a conductive layer 242B. Note that in this step, the thickness of the insulator 224 in a region that does not overlap with the oxide 230a is reduced in some cases (see FIGS. 4(A) to 4(C)).

Here, the oxide 230a, the oxide 230b, and the conductive layer 242B are formed to at least partly overlap with the conductor 205. It is preferable that the side surfaces of the oxide 230a, the oxide 230b, and the conductive layer 242B be substantially perpendicular to the top surface of the insulator 224. When the side surfaces of the oxide 230a, the oxide 230b, and the conductive layer 242B are substantially perpendicular to the top surface of the insulator 224, the plurality of transistors 200 can be provided in a smaller area at a higher density. Alternatively, a structure may be employed in which an angle formed by the side surfaces of the oxide 230a, the oxide 230b, and the conductive layer 242B and the top surface of the insulator 224 is a small angle. In that case, the angle formed by the side surfaces of the oxide 230a, the oxide 230b, and the conductive layer 242B and the top surface of the insulator 224 is preferably greater than or equal to 60° and less than 70°. With such a shape, coverage with the insulator 254 and the like can be improved in a later step, so that defects such as voids can be reduced.

There is a curved surface between the side surface of the conductive layer 242B and a top surface of the conductive layer 242B. That is, an end portion of the side surface and an end portion of the top surface are preferably curved (such a shape is hereinafter also referred to as a rounded shape). The radius of curvature of the curved surface at the end portion of the conductive layer 242B is within the range of 3 nm to 10 nm, preferably within the range of 5 nm to 6 nm, for example. When the end portions are not angular, coverage with films in later deposition steps is improved.

Note that for the processing of the oxide film 230A, the oxide film 230B, and the conductive film 242A, a lithography method can be employed. A dry etching method or a wet etching method can be used for the processing. Processing by a dry etching method is suitable for microfabrication. The oxide film 230A, the oxide film 230B, and the conductive film 242A may be processed under different conditions.

Figure 5A:
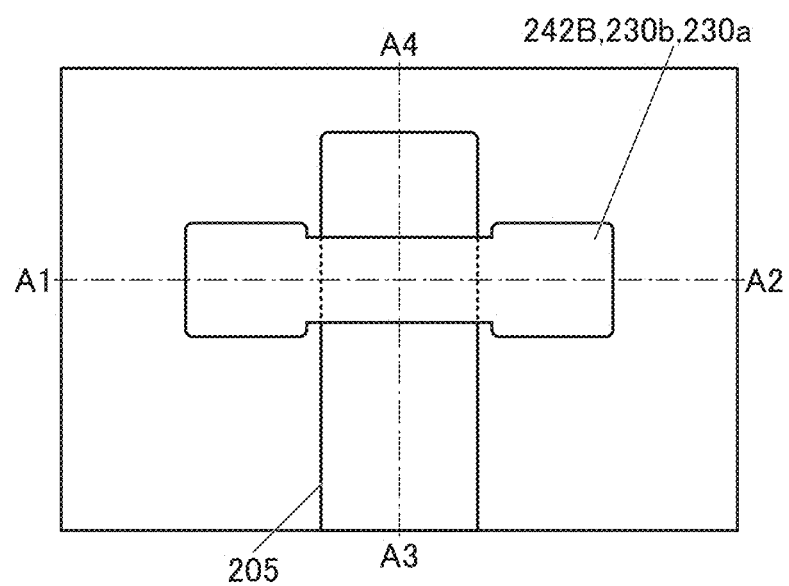
FIG. 5 (A) A top view showing a method for manufacturing a semiconductor device of one embodiment of the present invention. (B), (C) Cross-sectional views showing a method for manufacturing a semiconductor device of one embodiment of the present invention.
Figure 5C:
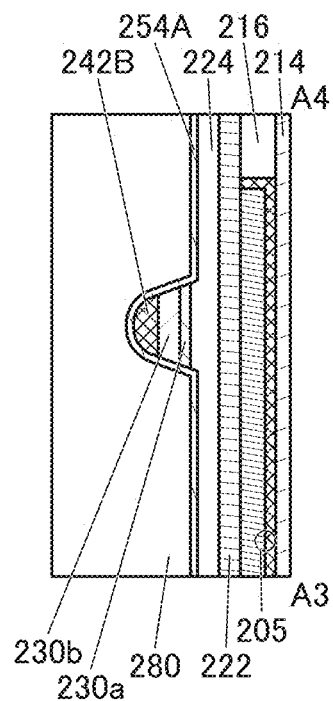
Figure 5B:
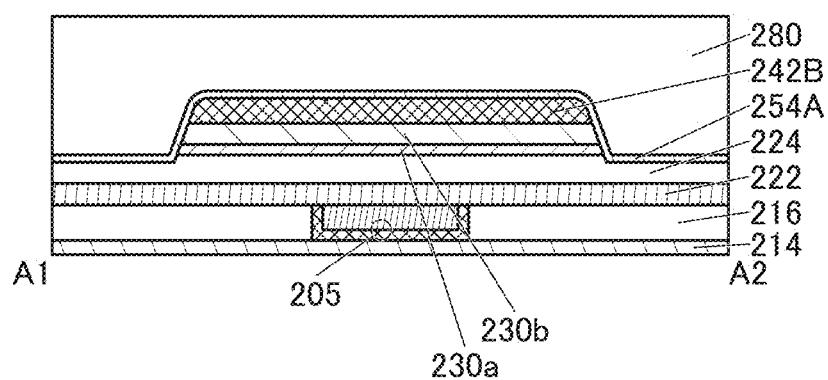
Figure 6A:
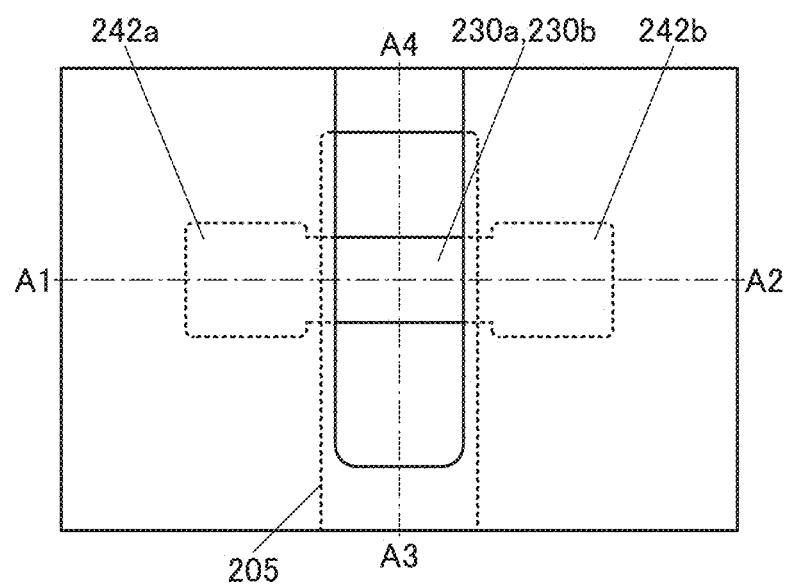
FIG. 6 (A) A top view showing a method for manufacturing a semiconductor device of one embodiment of the present invention. (B), (C) Cross-sectional views showing a method for manufacturing a semiconductor device of one embodiment of the present invention.
Figure 6C:
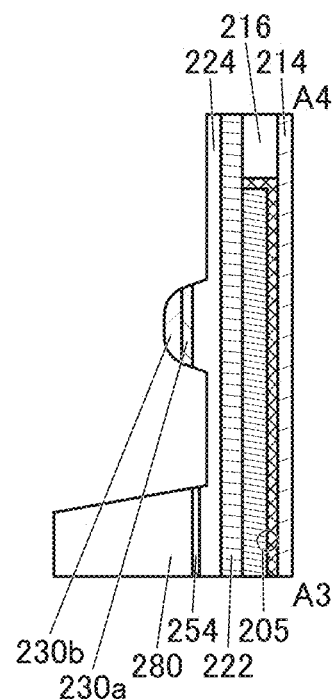
Figure 6B:
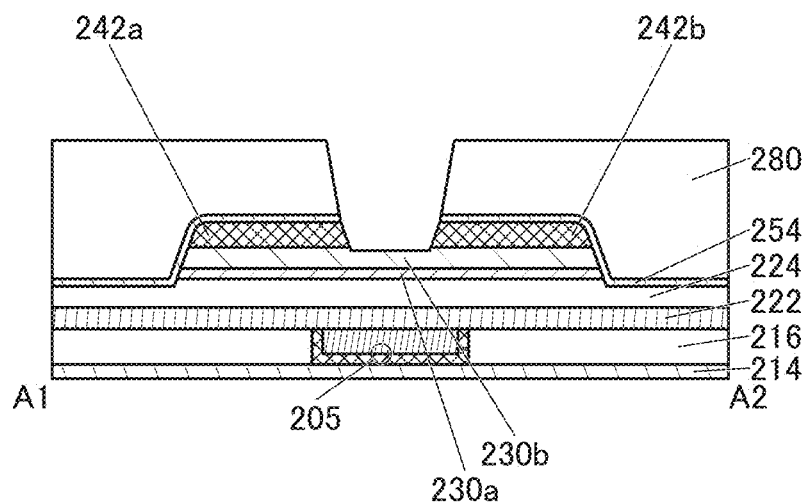
Figure 7A:
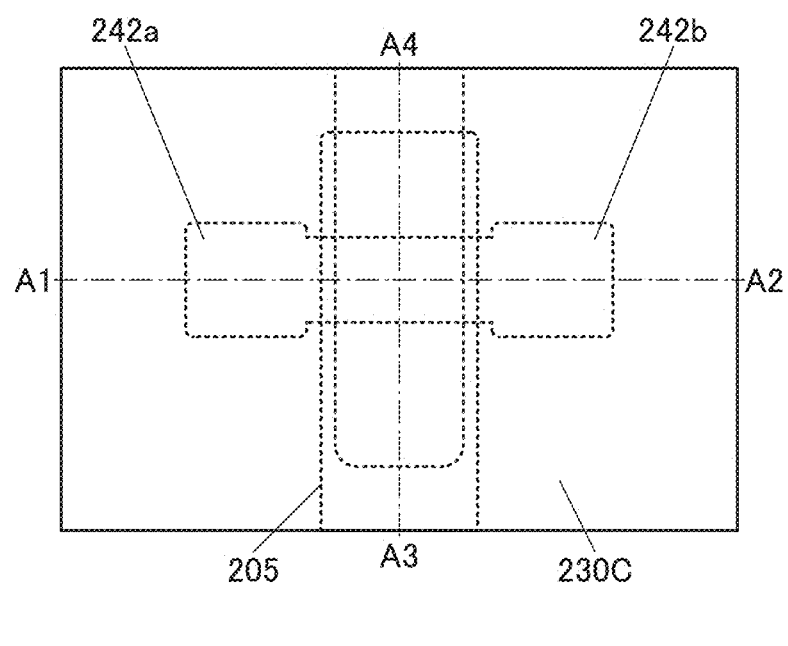
FIG. 7 (A) A top view showing a method for manufacturing a semiconductor device of one embodiment of the present invention. (B), (C) Cross-sectional views showing a method for manufacturing a semiconductor device of one embodiment of the present invention.
Figure 7C:
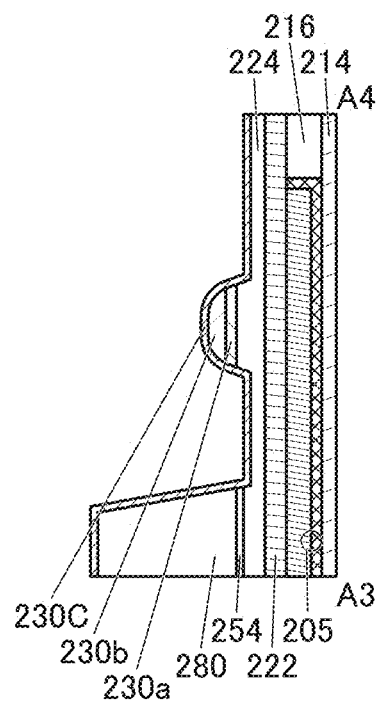
Figure 7B:
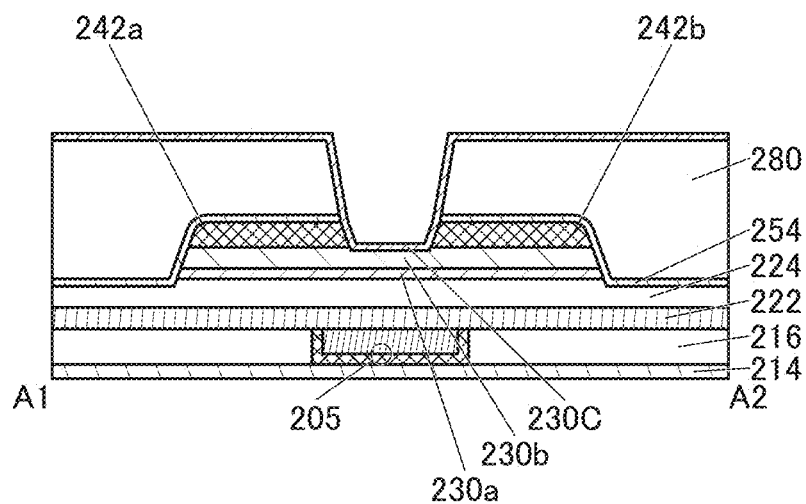
Figure 8A:
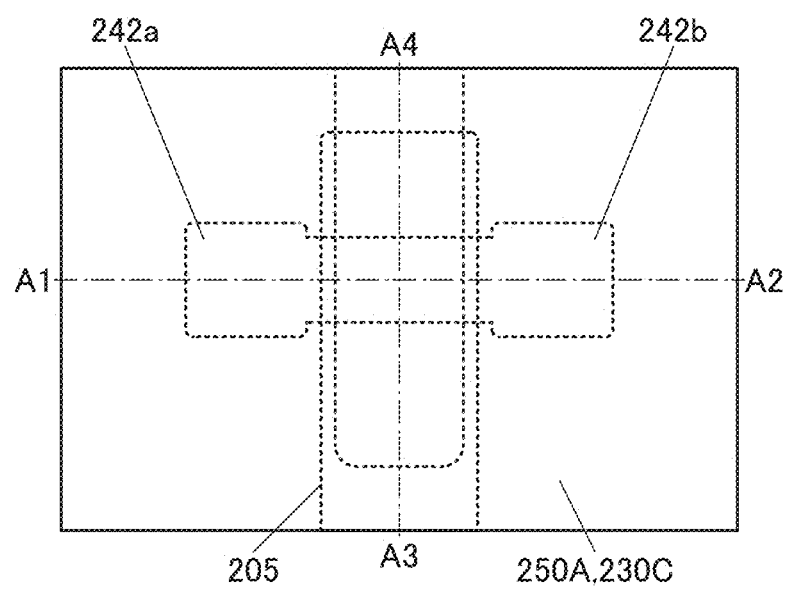
FIG. 8 (A) A top view showing a method for manufacturing a semiconductor device of one embodiment of the present invention. (B), (C) Cross-sectional views showing a method for manufacturing a semiconductor device of one embodiment of the present invention.
Figure 8C:
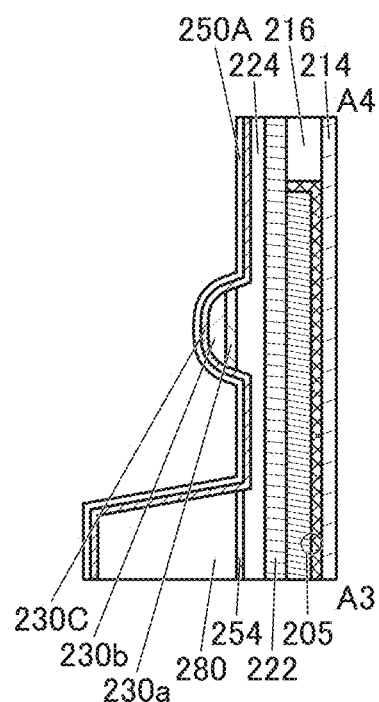
Figure 8B:
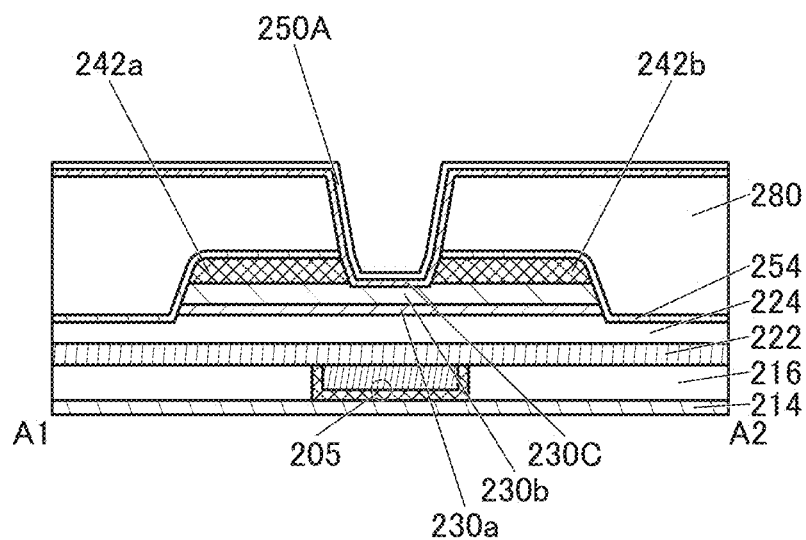
Figure 9A:
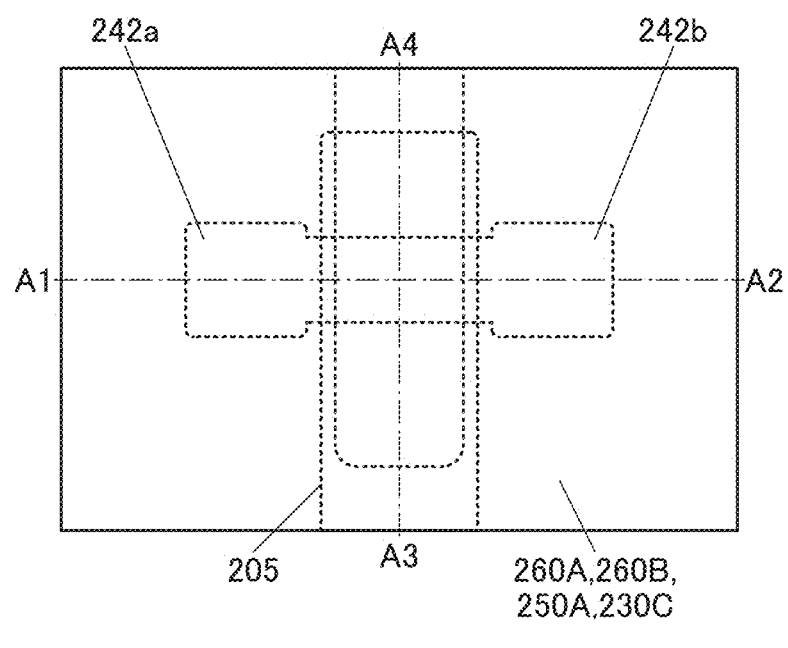
FIG. 9 (A) A top view showing a method for manufacturing a semiconductor device of one embodiment of the present invention. (B), (C) Cross-sectional views showing a method for manufacturing a semiconductor device of one embodiment of the present invention.
Figure 9C:
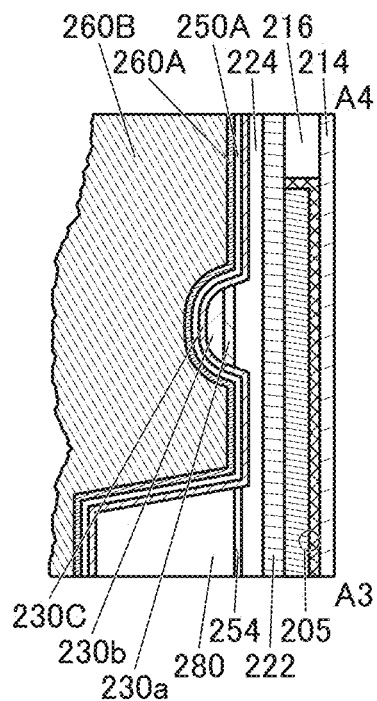
Figure 9B:
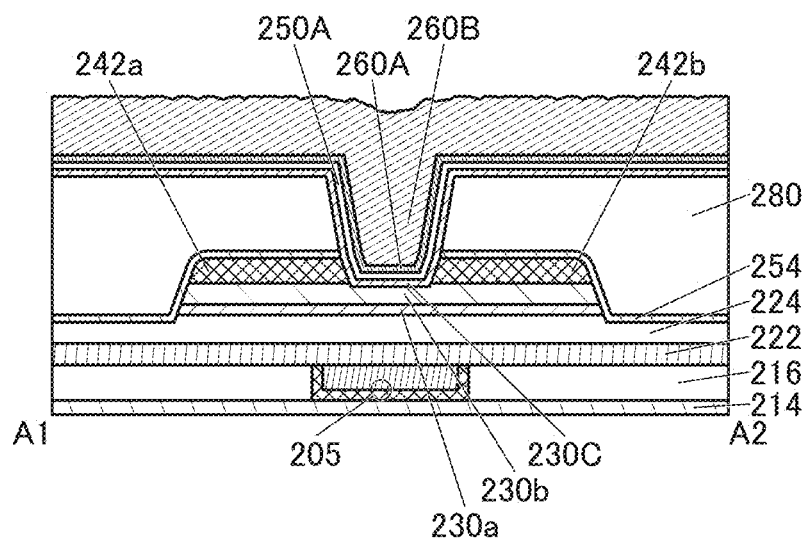

Next, an insulating film 254A to be the insulator 254 is deposited over the insulator 224, the oxide 230a, the oxide 230b, and the conductive layer 242B (see FIGS. 5(B) and 5(C)).

The insulating film 254A can be deposited by a sputtering method, a CVD method, an MBE method, a PLD method, an ALD method, or the like. As the insulating film 254A, an insulating film having a function of inhibiting transmission of oxygen is preferably used. For example, silicon nitride, silicon oxide, or aluminum oxide is deposited by a sputtering method. Materials that can be used as the oxide 230a or the oxide 230b can be used as the insulator 254. For example, as the insulator 254, a metal oxide with In:Ga:Zn=1:3:4 [atomic ratio] or 1:1:0.5 [atomic ratio] is preferably used.

The insulating film 254A may have a stacked-layer structure of two layers. The lower layer of the insulating film 254A and the upper layer of the insulating film 245A can be formed by the above method, and may be formed by the same method or different methods. The lower layer and the upper layer of the insulating film 254A can be formed using any of the above materials; the lower layer and the upper layer of the insulating film 254A may be formed using the same material or different materials. For example, an aluminum oxide film may be formed by a sputtering method as the lower layer of the insulating film 254A, and an aluminum oxide film may be formed by an ALD method as the upper layer of the insulating film 254A. Alternatively, an aluminum oxide film may be formed by a sputtering method as the lower layer of the insulating film 254A, and a silicon nitride film may be formed by an ALD method as the upper layer of the insulating film 254A.

Next, an insulating film to be the insulator 280 is deposited over the insulating film 254A. The insulating film can be deposited by a sputtering method, a CVD method, an MBE method, a PLD method, an ALD method, or the like. In this embodiment, as the insulating film, a silicon oxide film is formed by a CVD method or a sputtering method. The heat treatment may be performed before the insulating film is deposited. Heat treatment may be performed under reduced pressure, and the insulating film may be successively deposited without exposure to the air. The treatment can remove moisture and hydrogen adsorbed onto a surface of the insulating film 254A and the like, and further can reduce the moisture concentration and the hydrogen concentration of the oxide 230a, the oxide 230b, and the insulating film 254A. The conditions for the above heat treatment can be used.

The insulating film to be the insulator 280 may have a multilayer structure. The insulating film to be the insulator 280 may have a structure in which a silicon oxide film is formed by a sputtering method and another silicon oxide film is formed thereover by a CVD method, for example.

Next, the insulating film to be the insulator 280 is subjected to CMP treatment, so that the insulator 280 having a flat top surface is formed (see FIGS. 5(B) and 5(C)).

Then, part of the insulator 280, part of the insulating film 254A, and part of the conductive layer 242B are processed to form an opening reaching the oxide 230b. The opening is preferably formed to overlap with the conductor 205. The conductor 242a, the conductor 242b, and the insulator 254 are formed by the opening (see FIGS. 6(A) to 6(C)).

Part of the insulator 280, part of the insulating film 254A, and part of the conductive layer 242B may be processed under different conditions. For example, part of the insulator 280 may be processed by a dry etching method, part of the insulating film 254A may be processed by a wet etching method, and part of the conductive layer 242B may be processed by a dry etching method.

Here, it is preferable to remove impurities that are attached onto the surfaces of the oxides 230a and 230b or diffused into the oxide 230a and the oxide 230b, for example. The impurities result from components contained in the insulator 280, the insulating film 254A, and the conductive layer 242B; components contained in a member of an apparatus used to form the opening; and components contained in a gas or a liquid used for etching, for instance. Examples of the impurities include aluminum, silicon, tantalum, fluorine, and chlorine.

In order to remove the impurities and the like, cleaning treatment is performed. Examples of the cleaning method include wet cleaning using a cleaning solution and the like, plasma treatment using plasma, and cleaning by heat treatment, and any of these cleanings may be performed in appropriate combination.

The wet cleaning may be performed using pure water, carbonated water, or an aqueous solution in which ammonia water, oxalic acid, phosphoric acid, hydrofluoric acid, or the like is diluted with carbonated water or pure water, for instance. Alternatively, ultrasonic cleaning using pure water, carbonated water, or the aqueous solution may be performed. Further alternatively, such cleaning methods may be performed in combination as appropriate. A frequency greater than or equal to 200 kHz, preferably greater than or equal to 900 kHz is preferably used for the ultrasonic cleaning. Damage to the oxide 230b and the like can be reduced with this frequency.

As the cleaning treatment in this embodiment, wet cleaning using diluted hydrofluoric acid or diluted ammonia water is performed and then, wet cleaning using pure water or carbonated water is performed. The cleaning treatment can remove impurities that are attached onto the surfaces of the oxide 230a, the oxide 230b, and the like or diffused into the oxide 230a, the oxide 230b, and the like. Alternatively, the crystallinity of the oxide 230c over the oxide 230b can be increased.

Next, heat treatment may be performed. Heat treatment may be performed under reduced pressure, and an oxide film 230C may be successively deposited without exposure to the air. The treatment can remove moisture and hydrogen adsorbed onto the surface of the oxide 230b and the like, and further can reduce the moisture concentration and the hydrogen concentration of the oxide 230a and the oxide 230b. The temperature at the heat treatment is preferably within the range of 100° C. to 400° C. In this embodiment, the heat treatment is performed at 200° C. (see FIGS. 7(A) to 7(C)).

The oxide film 230C can be deposited by a sputtering method, a CVD method, an MBE method, a PLD method, an ALD method, or the like. The oxide film 230C is deposited by a deposition method similar to that for the oxide film 230A or the oxide film 230B depending on characteristics required for the oxide film 2300, In this embodiment, the oxide film 230C is deposited by a sputtering method using an In—Ga—Zn oxide target with In:Ga:Zn=1:3:4 [atomic ratio] or 4:2:4.1 [atomic ratio]. Alternatively, the oxide film 230C is formed by a sputtering method in the following manner: a film is formed using an In—Ga—Zn oxide target having an atomic ratio of In:Ga:Zn=4:2:4.1 [atomic ratio], and another film is formed thereover using an In—Ga—Zn oxide target having an atomic ratio of In:Ga:Zn=1:3:4 [atomic ratio].

In particular, in the deposition of the oxide film 230C, part of oxygen contained in the sputtering gas is sometimes supplied to the oxide 230a and the oxide 230b. Therefore, the proportion of oxygen contained in the sputtering gas for the oxide film 230C is higher than or equal to 70%, preferably higher than or equal to 80%, further preferably 100%.

Next, heat treatment may be performed. Heat treatment may be performed under reduced pressure, and an insulating film 250A may be successively deposited without exposure to the air. The treatment can remove moisture and hydrogen adsorbed onto the surface of the oxide film 230C and the like, and further can reduce the moisture concentration and the hydrogen concentration of the oxide 230a, the oxide 230b, and the oxide film 230C. The heat treatment is preferably performed at a temperature within the range of 100° C. to 400° C. (see FIGS. 8(A) to 8(C)).

The insulating film 250A can be deposited by a sputtering method, a CVD method, an MBE method, a PLD method, an ALD method, or the like. In this embodiment, silicon oxynitride is formed by a CVD method as the insulating film 250A. Note that the deposition temperature at the time of the deposition of the insulating film 250A is preferably more than or equal to 350° C. to lower than 450° C., particularly preferably approximately 400° C. When the insulating film 250A is deposited at 400° C., an insulating film having few impurities can be deposited.

Next, a conductive film 260A and a conductive film 260B are formed in this order. The conductive film 260A and the conductive film 260B can be deposited by a sputtering method, a CVD method, an MBE method, a PLD method, an ALD method, or the like. A CVD method is preferably used, for example. In this embodiment, the conductive film 260A is deposited by an ALD method, and the conductive film 260B is deposited by a CVD method (see FIGS. 9(A) to 9(C)).

Figure 10A:
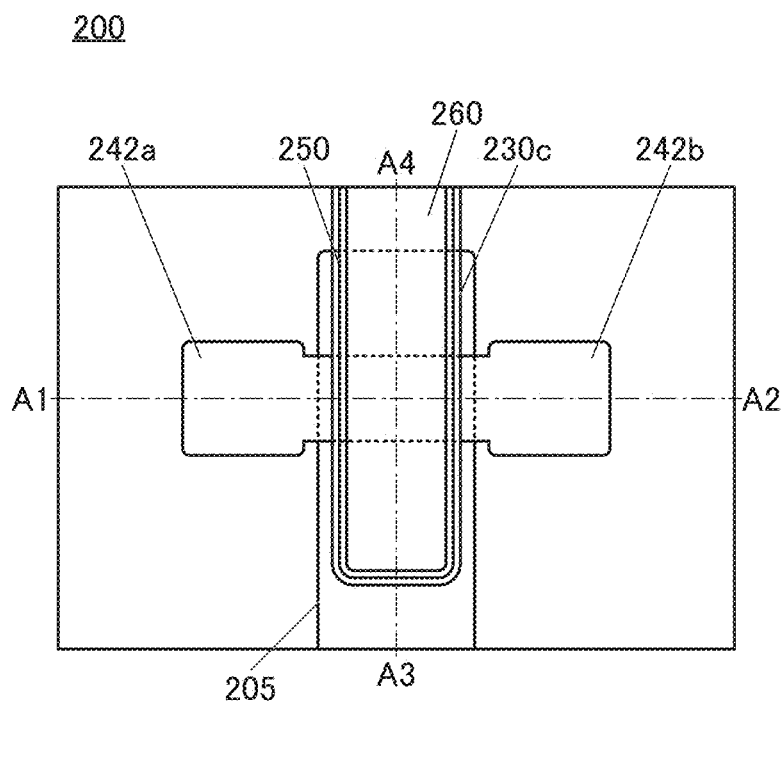
FIG. 10 (A) A top view showing a method for manufacturing a semiconductor device of one embodiment of the present invention. (B), (C) Cross-sectional views showing a method for manufacturing a semiconductor device of one embodiment of the present invention.
Figure 10C:
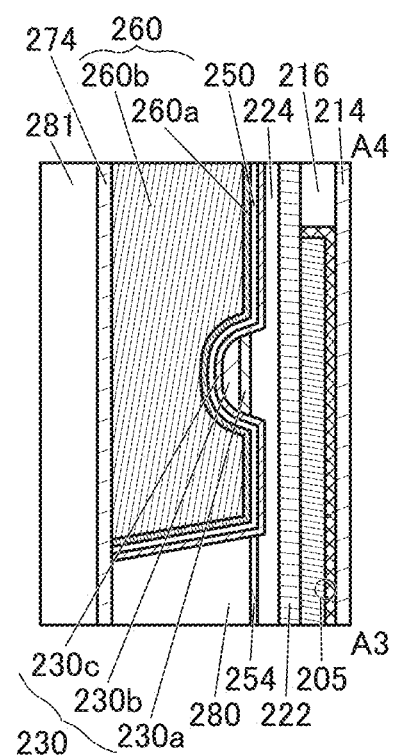
Figure 10B:
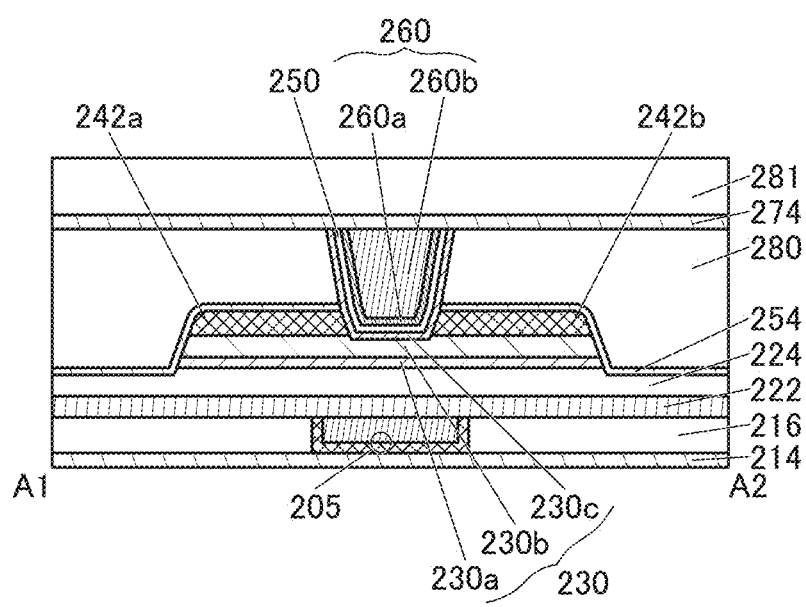

Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIGS. 10(A) to 10(C)). Accordingly, the oxide 230c is positioned to cover the inner wall (the side wall and bottom surface) of the opening that reaches the oxide 230b. The insulator 250 is positioned to cover the inner wall of the opening with the oxide 230c therebetween. The conductor 260 is positioned to fill the opening with the oxide 230c and the insulator 250 therebetween.

Next, heat treatment may be performed. In this embodiment, the treatment is performed at 400° C. in a nitrogen atmosphere for one hour. The heat treatment can reduce the moisture concentration and the hydrogen concentration in the insulator 250 and the insulator 280.

Next, the insulator 274 may be deposited over the oxide 230c, the insulator 250, the conductor 260, and the insulator 280. The insulator 274 can be deposited by a sputtering method, a CVD method, an MBE method, a PLD method, an ALD method, or the like. An aluminum oxide film or a silicon nitride film is preferably deposited as the insulator 274 by a sputtering method, for example. When an aluminum oxide film or a silicon nitride film is deposited by a sputtering method, diffusion of hydrogen contained in the insulator 281 into the oxide 230 can be inhibited in some cases. Forming the insulator 274 to be in contact with the conductor 260 is preferable, in which case oxidation of the conductor 260 can be inhibited.

When an aluminum oxide film is formed as the insulator 274 by a sputtering method, oxygen can be supplied to the insulator 280. Oxygen supplied to the insulator 280 is sometimes supplied to the channel formation region included in the oxide 230b through the oxide 230c. Furthermore, when oxygen is supplied to the insulator 280, oxygen that is contained in the insulator 280 before the formation of the insulator 274 may be supplied to the channel formation region included in the oxide 230b through the oxide 230c.

In addition, the insulator 274 may have a multilayer structure. For example, a structure may be employed in which an aluminum oxide film is deposited by a sputtering method and silicon nitride is deposited over the aluminum oxide film by a sputtering method.

Next, heat treatment may be performed. For the heat treatment, the conditions for the above heat treatment can be used. The heat treatment can reduce the moisture concentration and hydrogen concentration in the insulator 280. Moreover, oxygen contained in the insulator 274 can be injected into the insulator 280.

As the formation method of the insulator 274, the following steps may be performed: first, an aluminum oxide film is formed over the insulator 280 and the like by a sputtering method, heat treatment is performed under the above heat treatment conditions, then the aluminum oxide film is removed by CMP treatment, and then the insulator 274 is formed. By this method, a larger number of excess-oxygen regions can be formed in the insulator 280. Note that in the step of removing the insulating film, part of the insulator 280, part of the conductor 260, part of the insulator 250, and part of the oxide 230c are removed in some cases.

An insulator may be provided between the insulator 280 and the insulator 274. As the insulator, silicon oxide deposited by a sputtering method can be used, for example. Providing the insulator can form an excess-oxygen region in the insulator 280.

Next, the insulator 281 may be deposited over the insulator 274. The insulator 281 can be deposited by a sputtering method, a CVD method, an MBE method, a PLD method, an ALD method, or the like (see FIGS. 10(B) and 10(C)).

Then, openings that reach the conductor 242a and the conductor 242b are formed in the insulator 254, the insulator 280, the insulator 274, and the insulator 281. The openings are formed by a lithography method.

Next, an insulating film to be the insulator 241 is deposited and the insulating film is subjected to anisotropic etching, so that the insulator 241 is formed. The insulating film can be deposited by a sputtering method, a CVD method, an MBE method, a PLD method, an ALD method, or the like. As the insulating film, an insulating film having a function of inhibiting transmission of oxygen is preferably used. For example, an aluminum oxide film is preferably deposited by an ALD method. Alternatively, a silicon nitride film may be formed by an ALD method or a CVD method. In the case where a silicon nitride film is formed by an ALD method, a precursor containing silicon and halogen or precursors of aminosilanes can be used. As the precursor containing silicon and halogen, $SiCl_4$, $SiH_2Cl_2$, $Si_2Cl_6$, $Si_3Cl_8$, or the like can be used. As the precursors of aminosilanes, monovalent, divalent, or trivalent aminosilanes can be used. Moreover, as a nitriding gas, ammonia or hydrazine can be used. For the anisotropic etching, a dry etching method or the like may be employed, for example. When the side wall portions of the openings have such a structure, transmission of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240a and the conductor 240b is deposited. The conductive film desirably has a stacked-layer structure that includes a conductor having a function of inhibiting diffusion of impurities such as water and hydrogen. For example, a stacked layer of tantalum nitride, titanium nitride, or the like and tungsten, molybdenum, copper, or the like can be employed. The conductive film can be formed by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIGS. 1(A) to 1(C)). Note that the insulator 281 is partly removed by the CMP treatment in some cases.

In the above manner, the semiconductor device shown in FIGS. 1(A) to 1(C) in which impurities in the channel formation region and the vicinity thereof are reduced can be fabricated.

According to one embodiment of the present invention, it is possible to provide a highly reliable semiconductor device. According to one embodiment of the present invention, a semiconductor device having favorable electrical characteristics can be provided. According to one embodiment of the present invention, a semiconductor device with a high on-state current can be provided. According to one embodiment of the present invention, a semiconductor device having high frequency characteristics can be provided. According to one embodiment of the present invention, a semiconductor device that can be miniaturized or highly integrated can be provided. According to one embodiment of the present invention, a semiconductor device with low off-state current can be provided. According to one embodiment of the present invention, a semiconductor device with reduced power consumption can be provided. According to one embodiment of the present invention, a semiconductor device with high productivity can be provided.

<Structure Example 2 of Semiconductor Device>

Figure 11A:
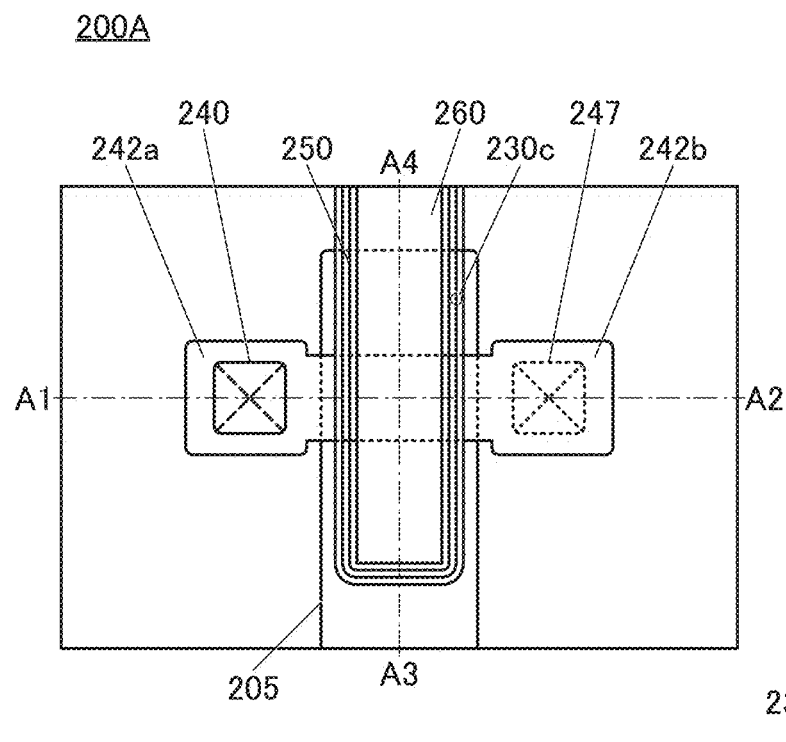
FIG. 11 (A) A top view of a semiconductor device of one embodiment of the present invention. (B), (C) Cross-sectional views of the semiconductor device of one embodiment of the present invention.
Figure 11C:
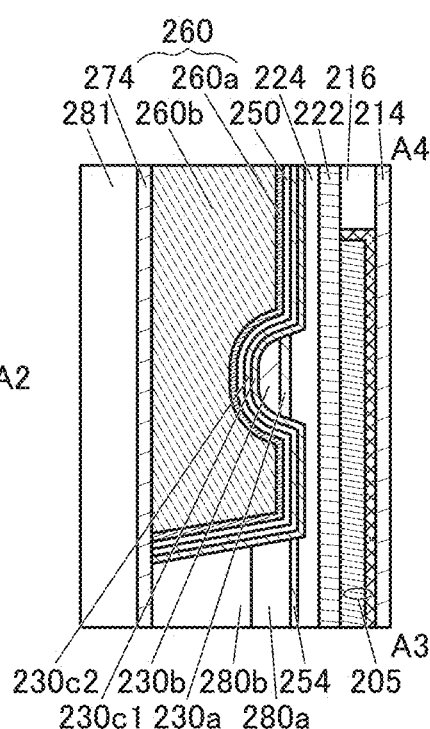
Figure 11B:
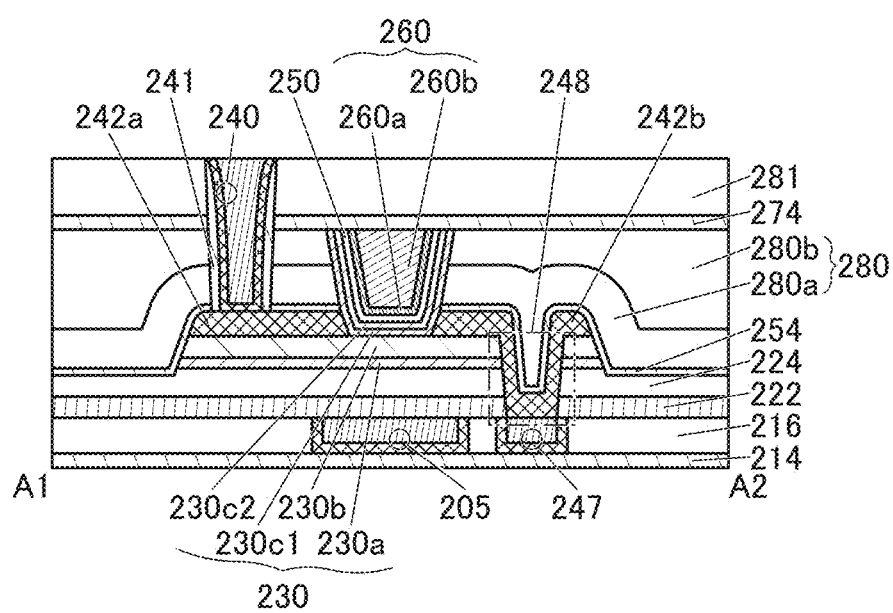

FIGS. 11(A) to 11(C) are a top view and cross-sectional views of a transistor 200A of one embodiment of the present invention and the periphery of the transistor 200A. A semiconductor device and the transistor 200A shown in FIGS. 11(A) to 11(C) are modification examples of the semiconductor device and the transistor 200 shown in FIGS. 1(A) to 1(C).

FIG. 11(A) is a top view of the semiconductor device including the transistor 200A. FIGS. 11(B) and 11(C) are cross-sectional views of the semiconductor device. Here, FIG. 11(B) is a cross-sectional view of a portion indicated by the dashed-dotted line A1-A2 in FIG. 11(A), and is a cross-sectional view of the transistor 200A in the channel length direction. In addition, FIG. 11(C) is a cross-sectional view of a portion indicated by the dashed-dotted line A3-A4 in FIG. 11(A), and is a cross-sectional view of the transistor 200A in the channel width direction. Note that for clarity of the drawing, some components are omitted in the top view of FIG. 11(A).

Note that in the semiconductor device shown in FIGS. 11(A) to 11(C), components having the same functions as the components configuring the semiconductor device described in <Structure example 1 of semiconductor device> are denoted by the same reference numerals.

The structure of the semiconductor device is described below using FIGS. 11(A) to 11(C). Note that the materials described in detail in <Structure example 1 of semiconductor device> can also be used as constituent materials of the semiconductor devices in this section.

The semiconductor device of one embodiment of the present invention includes the transistor 200A, the insulator 214, the insulator 216, the insulator 280 (the insulator 280a and the insulator 280b), the insulator 274, and the insulator 281 functioning as interlayer films. The semiconductor device also includes the conductor 240 and a conductor 247 that are electrically connected to the transistor 200A and function as plugs. Note that the insulator 241 is provided in contact with the side surface of the conductor 240 functioning as a plug. The conductor 247 is formed to be embedded in the insulator 216.

[Transistor 200A]

As shown in FIGS. 11(A) to 11(C), the transistor 200A is provided over a substrate (not shown) and includes the conductor 205 to be embedded in the insulator 216; the insulator 222 positioned over the insulator 216 and the conductor 205; the insulator 224 positioned over the insulator 222; the oxide 230 (the oxide 230a, the oxide 230b, an oxide 230c1, and an oxide 230c2) positioned over the insulator 224; 250 positioned over the oxide 230; the conductor 260 (the conductor 260a and the conductor 260b) positioned over the insulator 250; the conductor 242a and the conductor 242b in contact with part of the top surface of the oxide 230b; and the insulator 254 positioned in contact with part of the top surface of the insulator 224, the side surface of the oxide 230a, the side surface of the oxide 230b, the side surface of the conductor 242a, the top surface of the conductor 242a, the side surface of the conductor 242b, and the top surface of the conductor 242b.

The semiconductor device shown in FIGS. 11(A) to 11(C) is different from the semiconductor device described in <Structure example 1 of semiconductor device> in that the insulator 280 has a structure in which two layers of the insulator 280a and the insulator 280b are stacked, and that the conductor 247 and an opening 248 are included. Furthermore, the transistor 200A has different from the transistor 200 in that the oxide 230c is a structure in which two layers of the oxide 230c1 and the oxide 230c2 are stacked, and that the conductor 242b is in contact with at least part of a top surface of the conductor 247 through the opening 248. Different points from the semiconductor device and the transistor 200 described in <Structure example 1 of semiconductor device> are described below.

The insulator 280 includes the insulator 280a and the insulator 280b over the insulator 280a as shown in FIGS. 11(B) and 11(C). The insulator 280a is provided in contact with part of the top surface of the insulator 224, the side surfaces of the oxide 230a and the oxide 230b, the side surface of the conductor 242a, the top surface of the conductor 242a, the side surface of the conductor 242b, and the top surface of the conductor 242b.

For example, the insulator 280a and the insulator 280b are preferably formed using an insulating material including an excess oxygen region or an insulating material in which an excess oxygen region can be easily formed. Specifically, silicon oxide deposited by a sputtering method is used as the insulator 280a and silicon oxynitride deposited by a CVD method is used as the insulator 280b. The thickness of the insulator 280a is preferably within the range of 30 nm to 100 nm, further preferably within the range of 40 nm to 80 nm. Such a stacked structure of two layers can improve the coverage of the insulator 280.

It is preferable that an insulating material including an excess-oxygen region or an insulating material in which an excess-oxygen region is likely to be formed be used as the insulator 280a, and an insulating material that is likely to form an excess-oxygen region in the film on which the material is formed be used as the insulator 280b. Specifically, silicon oxide deposited by a sputtering method is used as the insulator 280a, and aluminum oxide deposited by a sputtering method is used as the insulator 280b. The structure in which such two layers are stacked can efficiently supply excess oxygen contained in the insulator 280a to the oxide 230.

Note that the insulator 280 is not limited to the structure where the insulator 280a and the insulator 280b are stacked and may have a single-layer structure or a structure in which three or more layers are stacked. In the case where the insulator 280 has a structure in which two or more layers are stacked, a combination and the stacking order of insulating materials used as the insulator 280 are designed as appropriate depending on required transistor characteristics.

The oxide 230c includes, as shown in FIGS. 11(B) and 11(C), the oxide 230c1 and the oxide 230c2 over the oxide 230c1. The oxide 230c1 preferably contains at least one of the metal elements contained in the metal oxide used as the oxide 230b, and further preferably contains all of these metal elements. For example, it is preferable that an In—Ga—Zn oxide be used as the oxide 230c1 and an In—Ga—Zn oxide, a Ga—Zn oxide, or gallium oxide be used as the oxide 230c2. Accordingly, the density of defect states at the interface between the oxide 230b and the oxide 230c1 can be made low. The oxide 230c2 is preferably a metal oxide that inhibits diffusion or permeation of oxygen more than the oxide 230c1. Providing the oxide 230c2 between the insulator 250 and the oxide 230c1 can inhibit diffusion of oxygen contained in the insulator 280 into the insulator 250. Therefore, the oxygen is more likely to be supplied to the oxide 230 through the oxide 230c1.

The conduction band minimum of each of the oxide 230a and the oxide 230c2 is preferably closer to the vacuum level than the conduction band minimum of the oxide 230b and the oxide 230c1. In other words, the electron affinity of each of the oxide 230a and the oxide 230c2 is preferably smaller than the electron affinity of each of the oxide 230b and the oxide 230c1. In that case, it is preferable that a metal oxide that can be used as the oxide 230a be used as the oxide 230c2, and a metal oxide that can be used as the oxide 230b be used as the oxide 230c1.

It is preferable that the oxide 230c1 and the oxide 230c2 have crystallinity, and it is more preferable that the crystallinity of the oxide 230c2 be higher than that of the oxide 230c1. In particular, a CAAC-OS is preferably used as the oxide 230c1 and the oxide 230c2; the coaxes of crystals included in the oxide 230c1 and the oxide 230c2 are preferably aligned in a direction substantially perpendicular to the formation surfaces or the top surfaces of the oxide 230c1 and the oxide 230c2. The CAAC-OS has a property in which oxygen is less likely to be moved in the c-axis direction. Therefore, providing the oxide 230c2 between the oxide 230c1 and the insulator 250 can inhibit diffusion of oxygen contained in the oxide 230c1 into the insulator 250 and efficiently supply the oxygen to the oxide 230.

Specifically, a metal oxide with In:Ga:Zn=4:2:3 [atomic ratio] is used as the oxide 230c1 and a metal oxide with In:Ga:Zn=1:3:4 [atomic ratio], Ga:Zn=2:1 [atomic ratio], or Ga:Zn=2:5 [atomic ratio], or a metal oxide such as gallium oxide is used as the oxide 230c2. When the atomic ratio of In to the metal element of the main component in the metal oxide used as the oxide 230c2 is smaller than the atomic ratio of In to the metal element of the main component in the metal oxide used as the oxide 230c1, the diffusion of In into the insulator 250 side can be inhibited. Since the insulator 250 functions as a gate insulator, the transistor exhibits poor characteristics when In enters the insulator 250 and the like. Thus, when the oxide 230c has a stacked-layer structure, a highly reliable semiconductor device can be provided.

At this time, not only the oxide 230b but also the first oxide of the oxide 230c1 serves as a main carrier path in some cases. When the oxide 230a, the oxide 230b, the oxide 230c1, and the oxide 230c2 have the above structure, the density of defect states at the interface between the oxide 230a and the oxide 230b, between the oxide 230b and the oxide 230c1, and between the oxide 230c1 and the oxide 230c2 can be made low. Thus, the influence of interface scattering on carrier conduction is small, and the transistor 200A can have high on-state current and high frequency characteristics.

The semiconductor device shown in FIGS. 11(A) to 11(C) includes the conductor 247 and the opening 248. Furthermore, the conductor 242b is in contact with at least part of the top surface of the conductor 247 through the opening 248.

The conductor 247 is provided in the opening formed in the insulator 216. It is preferable that at least part of the top surface of the conductor 247 be exposed from the insulator 216, and the top surface of the conductor 247 be substantially aligned with a top surface of the insulator 216.

Here, the conductor 247 functions as a plug which electrically connects the transistor 200A to a circuit element such as a switch, a transistor, a capacitor, an inductor, a resistor, and a diode, a wiring, an electrode, or a terminal which are provided below the insulator 214. A structure may be employed where the conductor 247 is electrically connected to one of electrodes of a capacitor provided below the insulator 214, for example. A structure may be employed where the conductor 247 is electrically connected to a gate of a transistor provided below the insulator 214, for example. A structure may be employed where the conductor 247 is electrically connected to a wiring provided below the insulator 214, for example. Note that the conductor 247 may be extended to function as a wiring.

Note that it is preferable that, at least part of a circuit element such as a switch, a transistor, a capacitor, an inductor, a resistor, or a diode, a wiring, an electrode, or a terminal which is electrically connected to the conductor 247 overlaps with the oxide 230. This can reduce the area occupied by the transistor 200, the above-mentioned circuit element, the wiring, the electrode, or the terminal in a top view, so that the semiconductor device of this embodiment can achieve miniaturization or higher integration.

In addition, the opening 248 from which at least part of the conductor 247 is exposed is formed in the insulator 222, the insulator 224, the oxide 230a, and the oxide 230b.

The conductor 242b is provided over the oxide 230b, and is in contact with at least part of the top surface of the conductor 247 through the opening 248. By connecting the conductor 242b and the conductor 247 in such a manner, electrical resistance between the conductor 247 and a source or a drain of the transistor 200A can be reduced.

Note that the conductor 242b is provided to be in contact with the side surface of the oxide 230a and the side surface of the oxide 230b in the opening 248.

Although the conductor 247 is provided under the conductor 242b in FIGS. 11(A) and 11(B), the semiconductor device described in this embodiment is not limited thereto.

For example, the conductor 247 may be provided under the conductor 242a or the conductor 247 may be provided under both of the conductor 242a and the conductor 242b.

With such a structure, frequency characteristics of a semiconductor device including the transistor 200A can be improved and favorable electric characteristics can be achieved.

Furthermore, in the transistor 200A, an oxide may be provided between the oxide 230b and the conductor 242 (the conductor 242a and the conductor 242b) functioning as a source electrode and a drain electrode. This structure in which the conductor 242 and the oxide 230 are not in contact with each other can prevent the conductor 242 from absorbing oxygen in the oxide 230. That is, preventing oxidization of the conductor 242 can prevent the decrease in conductivity of the conductor 242. Accordingly; the oxide preferably has a function of preventing oxidization of the conductor 242.

The oxide preferably has conductivity. When the oxide, which has conductivity, is provided between the conductor 242 that functions as a source electrode or a drain electrode, and the oxide 230b, the electrical resistance between the conductor 242 and the oxide 230b can be reduced, which is preferable. Such a structure improves the electrical characteristics and reliability of the transistor 200A. Note that the oxide may have a crystal structure.

As the oxide, an oxide containing zinc can be used. For example, zinc oxide, gallium zinc oxide, indium zinc oxide, or indium gallium zinc oxide can be used. Alternatively, indium oxide or indium tin oxide may be used. The above oxide is preferably an oxide including a metal atom having strong bond with an oxygen atom. The conductivity of the oxide is preferably higher than the conductivity of the oxide 230 (the oxide 230a, the oxide 230b, and the oxide 230c). The thickness of the oxide is preferably within the range of 1 nm to 10 nm, and more preferably, within the range of 1 nm to 5 nm. The oxide preferably has crystallinity. When the oxide has crystallinity, the release of oxygen from the oxide 230 can be inhibited. For example, when the oxide has a hexagonal crystal structure, the release of oxygen from the oxide 230 can sometimes be inhibited.

The structure, method, and the like described above in this embodiment can be used in appropriate combination with structures, methods, and the like described in the other embodiments and the examples.

Embodiment 2

In this embodiment, embodiments of semiconductor devices are described with reference to FIG. 12 to FIG. 19.
[Memory Device 1]

Figure 12:
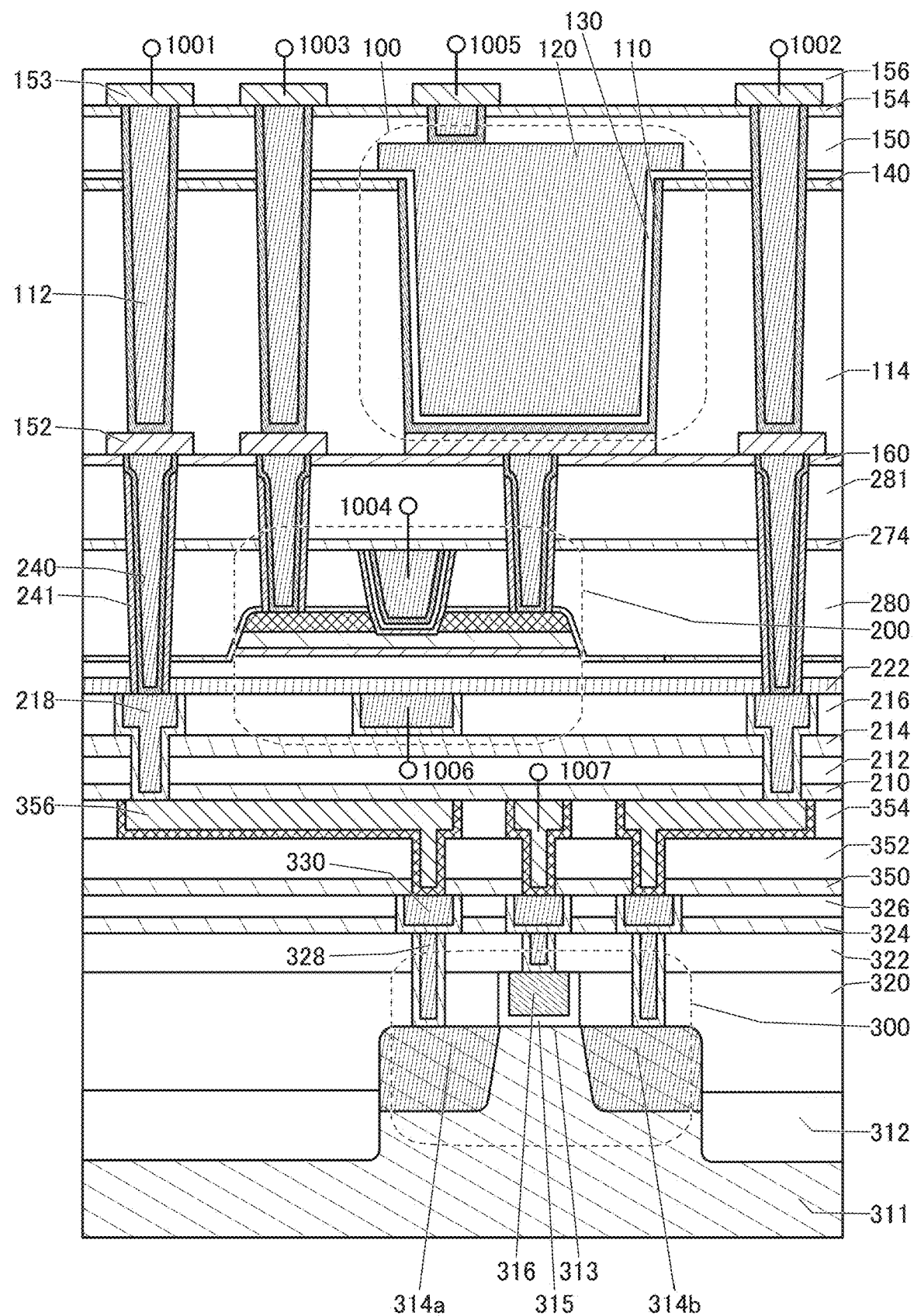
FIG. 12 A cross-sectional view showing a structure of a memory device of one embodiment of the present invention.

FIG. 12 shows an example of a semiconductor device (memory device) using the semiconductor device of one embodiment of the present invention. In the semiconductor device of one embodiment of the present invention, the transistor 200 is provided above the transistor 300, and the capacitor 100 is provided above the transistor 200. Preferably, at least part of the capacitor 100 or the transistor 300 overlaps with the transistor 200. Accordingly, the area occupied by the capacitor 100, the transistor 200, and the transistor 300 in a top view can be reduced, so that the semiconductor device of this embodiment can achieve miniaturization or higher integration. The semiconductor device in this embodiment can be applied to logic circuits typified by a CPU (Central Processing Unit) and a GPU (Graphics Processing Unit) and memory circuits typified by DRAM (Dynamic Random Access Memory) and NVM (Non-Volatile Memory), for example.

Note that the transistor 200 described in the above embodiment can be used as the transistor 200. Therefore, for the transistor 200 and layers including the transistor 200, the description in the above embodiment can be referred to.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device. The transistor 200 exhibits favorable electrical characteristics at high temperatures, in comparison with a transistor including silicon in a semiconductor layer. For example, the transistor 200 has favorable electrical characteristics even within the temperature range of 125° C. to 150° C. Moreover, the transistor 200 has an on/off ratio of 10 digits or larger within the temperature range of 125° C. to 150° C. In other words, in comparison with a transistor including silicon in a semiconductor layer, the transistor 200 excels in characteristics such as on-state current and frequency characteristics at higher temperatures.

In the semiconductor device shown in FIG. 12, a wiring 1001 is electrically connected to a source of the transistor 300, a wiring 1002 is electrically connected to a drain of the transistor 300, and a wiring 1007 is electrically connected to a gate of the transistor 300. A wiring 1003 is electrically connected to one of the source and the drain of the transistor 200. A wiring 1004 is electrically connected to a first gate (also referred to as top gate) of the transistor 200. A wiring 1006 is electrically connected to a second gate (also referred to as back gate) of the transistor 200. The other of the source and the drain of the transistor 200 is electrically connected to one of the electrodes of the capacitor 100, and a wiring 1005 is electrically connected to the other electrode of the capacitor 100.

The memory device shown in FIG. 12 has characteristics of being able to retain charge stored in one of the electrodes of the capacitor 100 by switching of the transistor 200; thus, writing, retention, and reading of data can be performed. The transistor 200 is an element to which the back gate is provided in addition to the source, the gate (top gate), and the drain. That is, the transistor 200 is a four-terminal element; hence, its input and output can be controlled independently of each other in a simpler manner than that in two-terminal elements typified by MRAM (Magnetoresistive Random Access Memory) utilizing MTJ (Magnetic Tunnel Junction) properties, ReRAM (Resistive Random Access Memory), and phase-change memory. In addition, the structure of MRAM, ReRAM, and phase-change memory may change at the atomic level when data is rewritten. In contrast, in the semiconductor device in FIG. 12, data rewriting is performed by charging or discharging of electrons with the transistor and the capacitor; thus, the semiconductor device has characteristics such as high write endurance and a few structure changes.

Furthermore, by arranging the semiconductor devices shown in FIG. 12 in a matrix, a memory cell array can be formed. In this case, the transistor 300 can be used for a read circuit, a driver circuit, or the like that is connected to the memory cell array. Furthermore, the semiconductor device shown in FIG. 12 constitutes a memory cell array. When the semiconductor device in FIG. 12 is used as a memory element, for example, an operation frequency of 200 MHz or higher is achieved at a driving voltage of 2.5 V and an evaluation environment temperature within the range of −40° C. to 85° C.

<Transistor 300>

The transistor 300 is provided over a substrate 311 and includes a conductor 316 functioning as a gate electrode, an insulator 315 functioning as a gate insulator, a semiconductor region 313 that is a part of the substrate 311, and a low-resistance region 314*a* and a low-resistance region 314*b* functioning as the source region and the drain region.

Here, the insulator 315 is positioned over the semiconductor region 313, and the conductor 316 is positioned over the insulator 315. The transistors 300 formed in the same layer are electrically isolated from each other by an insulator 312 functioning as an element isolation insulating layer. The insulator 312 can be formed using an insulator similar to that used as an insulator 326 or the like described later. The transistor 300 may be a p-channel transistor or an n-channel transistor.

In the substrate 311, it is preferable that a region of the semiconductor region 313 where a channel is formed, a region in the vicinity thereof, the low-resistance region 314*a* and the low-resistance region 314*b* functioning as the source region and the drain region, and the like contain a semiconductor such as a silicon-based semiconductor; and it is also preferable that single crystal silicon is included therein. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron. Mobility Transistor) with GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Here, in the transistor 300 shown in FIG. 12, the semiconductor region 313 (part of the substrate 311) in which a channel is formed has a convex shape. Furthermore, the conductor 316 is provided so as to cover a side surface and top surface of the semiconductor region 313 with the insulator 315 positioned therebetween. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 shown in FIG. 12 is just an example and the structure is not limited thereto; an appropriate transistor can be used in accordance with a circuit configuration or a driving method.

As shown in FIG. 12, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device in FIG. 12, a silicon-based semiconductor material and an oxide semiconductor can be used in different layers. The semiconductor device shown in FIG. 12 can be manufactured in a process similar to that employing an apparatus for manufacturing a semiconductor device containing a silicon-based semiconductor material, and can be highly integrated.

<Capacitor>

The capacitor 100 includes a conductor 110 in an opening formed in an insulator 114 and an insulator 140, an insulator 130 over the conductor 110 and the insulator 140, and a conductor 120 over the insulator 130. Here, at least parts of the conductor 110, the insulator 130, and the conductor 120 are positioned in the opening formed in the insulator 114 and the insulator 140.

The conductor 110 functions as a lower electrode of the capacitor 100, the conductor 120 functions as an upper electrode of the capacitor 100, and the insulator 130 functions as a dielectric of the capacitor 100. In the capacitor 100, the upper electrode and the lower electrode face each other with the dielectric positioned therebetween on the side surface as well as the bottom surface of the opening in the insulator 114 and the insulator 140; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of a semiconductor device.

The insulator 114 is provided over the insulator 160. An insulator 150 is provided over the conductor 120 and the insulator 130. An insulator that can be used as the insulator 280 can be used as the insulator 114 and the insulator 150. The insulator 140 is provided over the insulator 114. The insulator 140 preferably functions as an etching stopper at the time of forming the opening in the insulator 114 and is formed using an insulator that can be used as the insulator 214.

The shape of the opening formed in the insulator 114 and the insulator 140 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably larger in the top view. Such a structure can reduce the area occupied by the semiconductor device including the capacitor 100 and the transistor 200.

The conductor 110 is provided in contact with the opening formed in the insulator 140 and the insulator 114. Preferably, a top surface of the conductor 110 is substantially aligned with a top surface of the insulator 140. A conductor 152 provided over the insulator 160 is in contact with the bottom surface of the conductor 110. The conductor 110 is preferably formed by an ALD method, a CVD method, or the like and is deposited using a conductor that can be used as the conductor 205, for example.

The insulator 130 is positioned to cover the conductor 110 and the insulator 140. The insulator 130 is preferably deposited by an ALD method or a CVD method, for example. The insulator 130 can be provided to have a single-layer structure or a stacked-layer structure using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in this order can be used, for instance.

Furthermore, for the insulator 130, a stacked-layer structure using a material with high dielectric strength such as silicon oxynitride or a high dielectric constant (high-k) material is preferably used. Alternatively, a stacked structure of a material with high dielectric strength and a material with a high dielectric constant (high-k).

Examples of the insulator with a high dielectric constant (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material can secure a sufficient capacitance of the capacitor 100 even if the insulator 130 has a large thickness. When the insulator 130 has a large thickness, leakage current generated between the conductor 110 and the conductor 120 can be inhibited.

Examples of the material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a PEALD method, and silicon nitride ($SiN_x$) deposited by an ALD method are stacked in this order. The use of such an insulator having high dielectric strength can increase the dielectric strength of the capacitor 100 and inhibit electrostatic breakdown of the capacitor 100.

The conductor 120 is positioned to fill the opening formed in the insulator 140 and the insulator 114. The conductor 120 is electrically connected to the wiring 1005 through a conductor 112 and a conductor 153. The conductor 120 is preferably deposited by an ALD method, a CND method, or the like and is formed using a conductor that can be used as the conductor 205, for example.

Since the transistor 200 has a structure in which an oxide semiconductor is used, the transistor 200 is highly compatible with the capacitor 100. Specifically, since the transistor 200 containing an oxide semiconductor has a low off state current, a combination of the transistor 200 and the capacitor 100 enables stored data to be retained for a long time.

<Wiring Layer>

Wiring layers provided with an interlayer film, a wiring, a plug, and the like may be provided between the components. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are sequentially stacked over the transistor 300 as interlayer films. Moreover, a conductor 328, a conductor 330, and the like that are electrically connected to the conductor 153 functioning as a terminal are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 12, an insulator 350, an insulator 352, and an insulator 354 are provided to be stacked in this order. Furthermore, a conductor 356 is formed in the insulator 350, the insulator 352, and the insulator 354. The conductor 356 functions as a plug or a wiring.

An insulator 210, an insulator 212, the insulator 214, and the insulator 216 are stacked over the insulator 354 and the conductor 356 in this order. In addition, a conductor 218, a conductor (the conductor 205) included in the transistor 200, and the like are embedded in the insulator 210, the insulator 212, the insulator 214, and the insulator 216. Note that the conductor 218 functions as a plug or a wiring that is electrically connected to the transistor 300.

The conductor 112, conductors included in the capacitor 100 (the conductor 120 and the conductor 110) and the like are embedded in the insulator 114, the insulator 140, the insulator 130, the insulator 150, and an insulator 154. Note that the conductor 112 functions as a plug or a wiring that electrically connects the capacitor 100, the transistor 200 or the transistor 300 to the conductor 153 functioning as a terminal.

The conductor 153 is provided over the insulator 154 and is covered with an insulator 156. Here, the conductor 153 is in contact with a top surface of the conductor 112 and functions as a terminal of the capacitor 100, the transistor 200, or a transistor 300.

Examples of an insulator that can be used as an interlayer film include an oxide, a nitride, an oxynitride, a nitride oxide, a metal oxide, a metal oxynitride, and a metal nitride oxide, each of which has an insulating property. For example, when a material having a low relative permittivity is used as the insulator functioning as an interlayer film, the parasitic capacitance generated between wirings can be reduced. Thus, a material is preferably selected depending on a function of an insulator.

For example, for the insulator 320, the insulator 322, the insulator 326, the insulator 352, the insulator 354, the insulator 212, the insulator 114, the insulator 150, the insulator 156, and the like, an insulator with low relative permittivity is preferably used. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity Examples of the resin include polyester, polyolefin, polyamide (e.g., nylon and aramid), polyimide, polycarbonate, and acrylic.

It is preferable that the resistivity of an insulator provided over or under the conductor 152 or the conductor 153 be within the range of $1.0 \times 10^{12}$ Ωcm to $1.0 \times 10^{15}$ Ωcm, preferably within the range of $5.0 \times 10^{12}$ Ωcm to $1.0 \times 10^{14}$ Ωcm, further preferably within the range of $1.0 \times 10^{13}$ Ωcm and to $5.0 \times 10^{13}$ Ωcm. When the resistivity of the insulator provided over or under the conductor 152 or the conductor 153 is within the above range, the insulator can disperse charge accumulated between the transistor 200, the transistor 300, the capacitor 100, the conductor 152, and the like and can prevent poor characteristics and electrostatic breakdown of the transistor and a semiconductor device including the transistor due to the charge, while maintaining the insulating property, which is preferable. For such an insulator, silicon nitride or silicon nitride oxide can be used. For example, the resistivity of the insulator 160 and the insulator 154 can be set within the above range.

Furthermore, when a transistor using an oxide semiconductor is surrounded by an insulator having a function of inhibiting the transmission of oxygen and impurities such as hydrogen, the electrical characteristics of the transistor can be stable. Thus, an insulator having a function of inhibiting the transmission of oxygen and impurities such as hydrogen is used as the insulator 324, the insulator 350, the insulator 210, and the like.

As the insulator having a function of inhibiting the transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting the transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

As the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, as the conductor 328, the conductor 330, the conductor 356, the conductor 218, the conductor 112, the conductor 152, the conductor 153, and the like, a single layer or stacked layers of a conductive material such as a metal material, an alloy material, a metal nitride material, or a metal oxide material which is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Wiring or Plug in Layer Provided with Oxide Semiconductor>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, the insulator 241 is preferably provided between the insulator 280 including excess oxygen and the conductor 240 in FIG. 12. Since the insulator 241 is provided in contact with the insulator 274, the conductor 240 and the transistor 200 can be sealed by the insulators having a barrier property.

That is, when the insulator 241 is provided, absorption of excess oxygen contained in the insulator 280 by the conductor 240 can be inhibited. In addition, when the insulator 241 is included, diffusion of hydrogen, which is an impurity, into the transistor 200 through the conductor 240 can be inhibited.

Here, the conductor 240 functions as a plug or a wiring that is electrically connected to the transistor 200 or the transistor 300.

The above is the description of the structure example. With the use of this structure, the semiconductor device using the transistor including an oxide semiconductor can be miniaturized or highly integrated. Furthermore, a change in electrical characteristics can be reduced and reliability can be improved in a semiconductor device using a transistor including an oxide semiconductor. Alternatively, a transistor including an oxide semiconductor with a high on-state current can be provided. Alternatively, a transistor including an oxide semiconductor with low off-state current can be provided. Alternatively, a semiconductor device with low power consumption can be provided.

Figure 13:
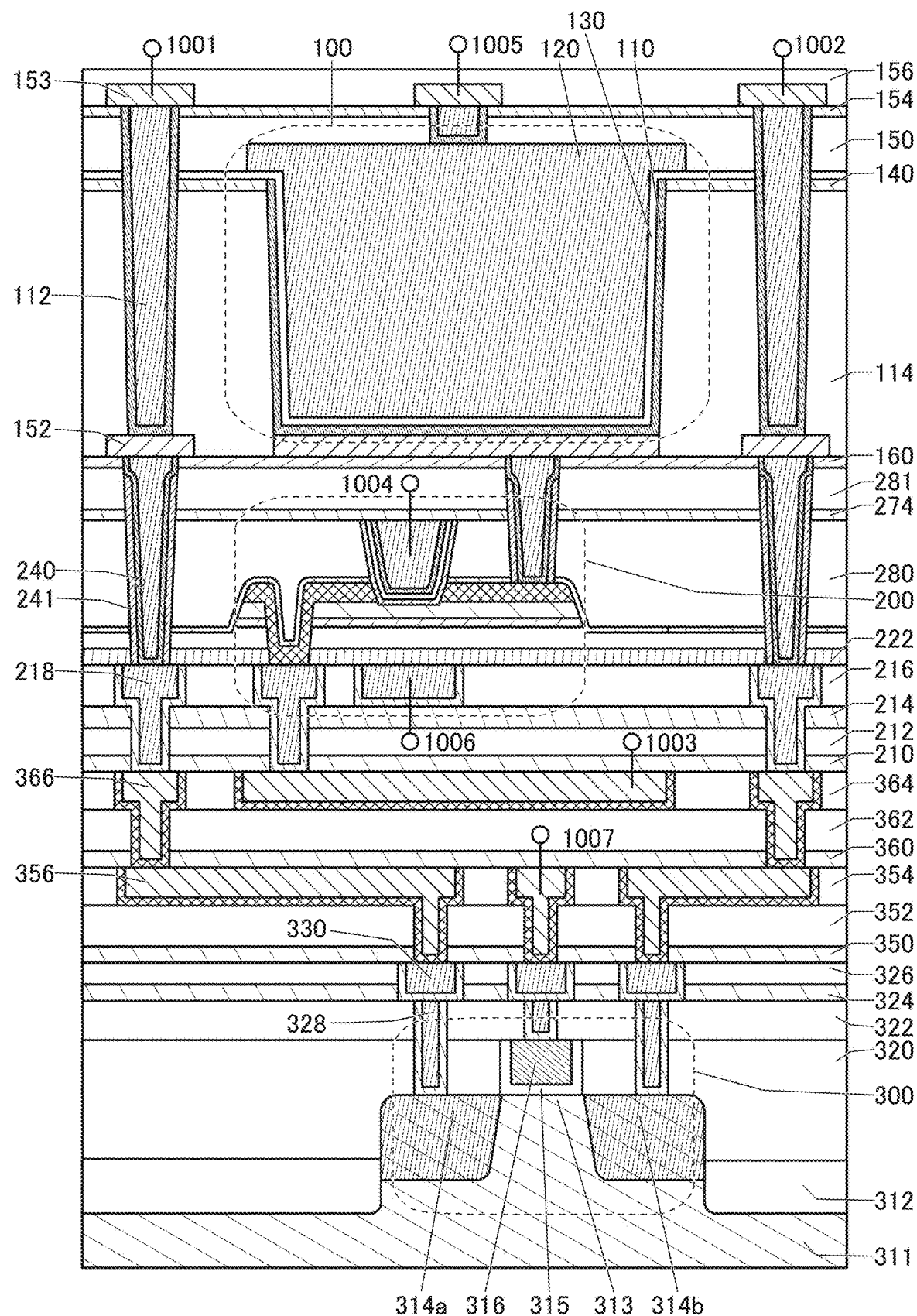
FIG. 13 A cross-sectional view showing a structure of a memory device of one embodiment of the present invention.

In FIG. 12, an example is shown in which a conductor electrically connected to the wiring 1003 is in contact with at least part of a top surface of the conductor functioning as one of the source and the drain of the transistor 200; however, the semiconductor device shown in this embodiment is not limited thereto. For example, as shown in FIG. 13, a conductor functioning as a wiring may be provided under the transistor 200, and a conductor functioning as one of the source and the drain of the transistor 200 may be in contact with at least part of a top surface of the conductor electrically connected to the wiring 1003 through an opening formed in the insulator 222, the insulator 224, the oxide 230a, and the oxide 230b.

An insulator 360 is positioned over the insulator 354, an insulator 362 is positioned over the insulator 360, an insulator 364 is positioned over the insulator 362, and the insulator 210 is positioned over the insulator 364. An insulator that can be used as the insulator 350 and the like can be used as the insulator 360. For the insulator 362 and the insulator 364, an insulator that can be used as the insulator 352 or the like can be used.

An opening is formed in the insulator 362 or the insulator 364, and a conductor 366 is positioned in the opening. The conductor 366 functions as a plug or a wiring. In FIG. 13, the conductor 366 is electrically connected to the conductor that functions as one of the source and the drain of the transistor 200. In that case, the conductor 366 also functions as a wiring connected to one of the source and the drain of the transistor 200. For the conductor 366, a conductor that can be used as the conductor 356 and the like can be used.

With the above structure, the capacitor 100 can have a large area overlapping with the transistor 200 in the top view of the capacitor 100 and the transistor 200, and thus, the capacitance can be larger.

Figure 14:
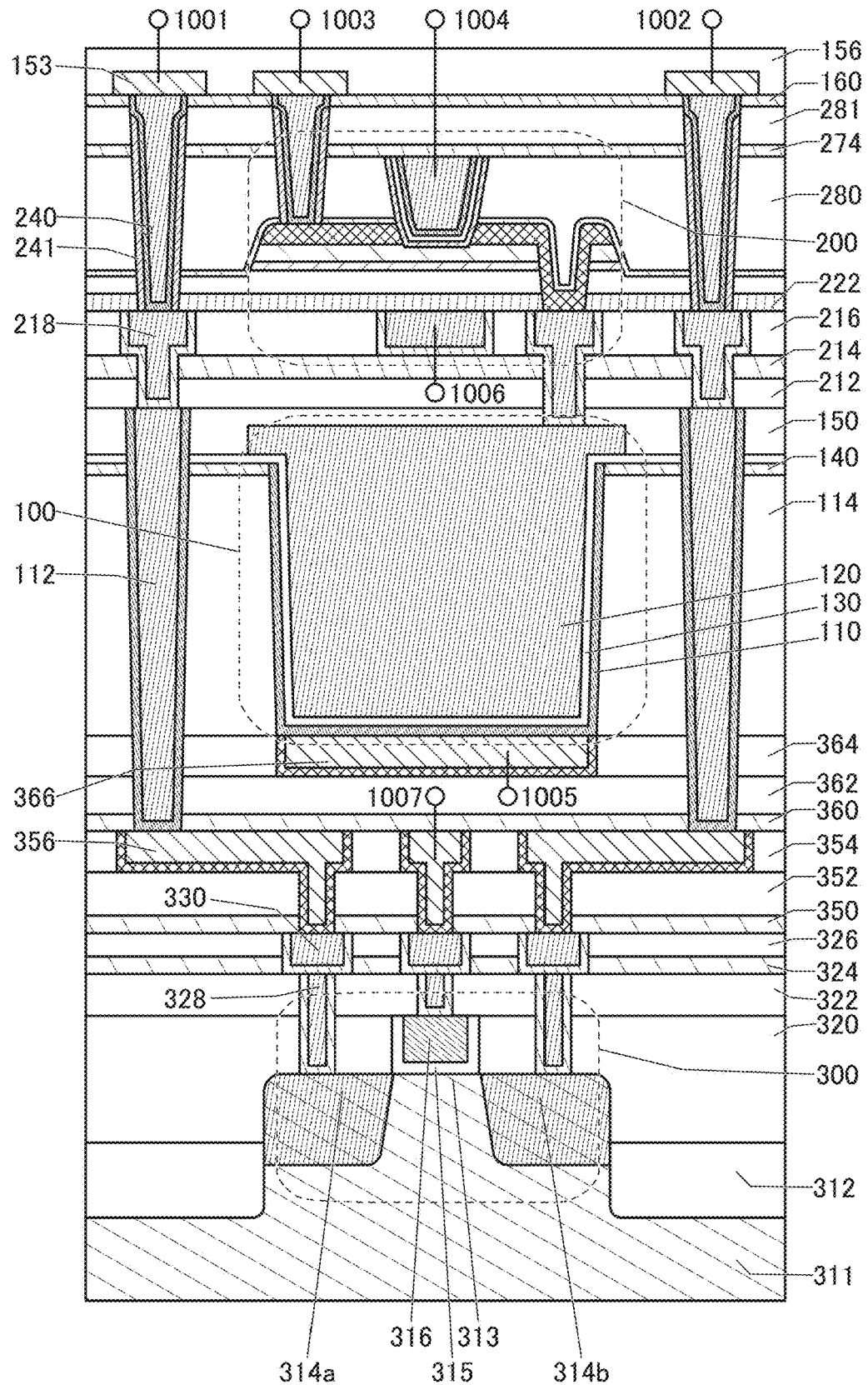
FIG. 14 A cross-sectional view showing a structure of a memory device of one embodiment of the present invention.

Although the capacitor 100 is provided above the transistor 200 in FIG. 12, the semiconductor device in this embodiment is not limited thereto. For example, as shown in FIG. 14, the capacitor 100 may be provided above the transistor 300 and the transistor 200 may be provided above the capacitor 100 and the transistor 300. Preferably, at least part of the capacitor 100 or the transistor 300 overlaps with the transistor 200. Accordingly, the area occupied by the capacitor 100, the transistor 200, and the transistor 300 in a top view can be reduced, so that miniaturization or higher integration of the semiconductor device can be achieved.

In the fabrication process of the capacitor 100, high-temperature heat treatment of higher than 700° C. is needed in some cases. When such a high-temperature heat treatment is performed after the formation of the transistor 200, the oxide 230 might be affected by the diffusion of oxygen or impurities such as hydrogen or water, which might degrade the electrical characteristics of the transistor 200.

However, when the transistor 200 is formed over the capacitor 100 as described in this modification example, the thermal budget in the fabrication process of the capacitor 100 does not affect the transistor 200. Thus, degradation in electrical characteristics of the transistor 200 can be prevented and a semiconductor device having stable electrical characteristics can be provided.

FIG. 12 shows an example in which the capacitor 100 is provided above the transistor 200 and FIG. 14 shows an example in which the capacitor 100 is provided below the transistor 200; however, the semiconductor device shown in this embodiment is not limited thereto. For example, as shown in FIG. 15, the capacitor 100a may be provided above the transistor 200a, and the capacitor 100b may be provided below the transistor 200b in the adjacent memory cells.

Figure 15:
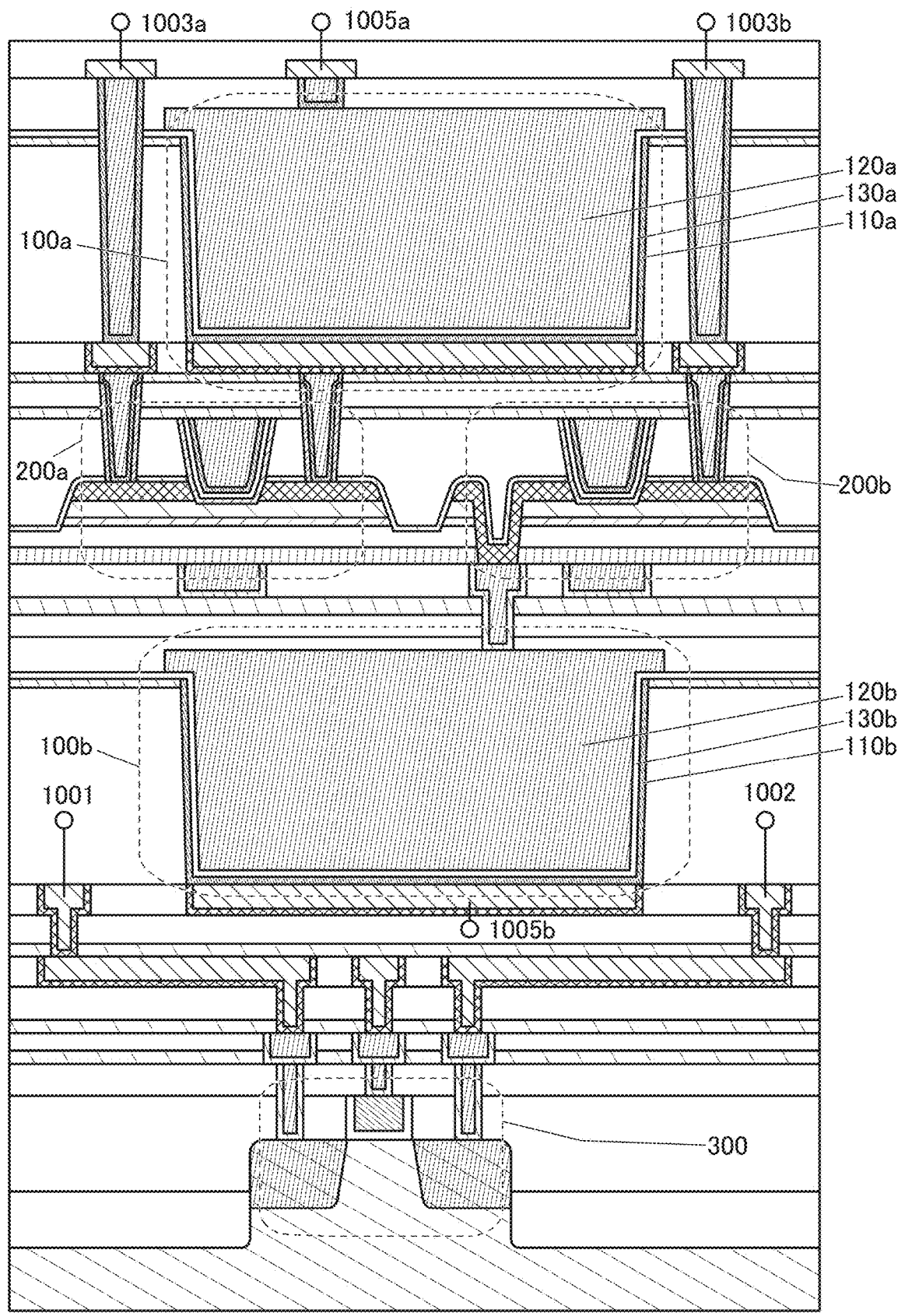
FIG. 15 A cross-sectional view showing a structure of a memory device of one embodiment of the present invention.

In the memory device shown in FIG. 15, the wiring 1001 is electrically connected to the source of the transistor 300, and the wiring 1002 is electrically connected to the drain of the transistor 300. A wiring 1003a is electrically connected to one of a source and a drain of the transistor 200a. The other of the source and the drain of the transistor 200a is electrically connected to one of the electrodes of the capacitor 100a, and a wiring 1005a is electrically connected to the other electrode of the capacitor 100a. A wiring 1003b is electrically connected to one of the source and the drain of the transistor 200b. The other of the source and the drain of the transistor 200b is electrically connected to one of the electrodes of the capacitor 100b, and a wiring 1005b is electrically connected to the other electrode of the capacitor 100b.

FIG. 15 shows the transistor 200a and the capacitor 100a and the transistor 200b and the capacitor 100b, which are included in the memory cells adjacent to each other. The transistors 200a and 200b have the same structure as the transistor 200 and the transistor 200A.

The capacitor 100a and the capacitor 100b have the same structure as the capacitor 100. In other words, the capacitor 100a includes a conductor 110a, an insulator 130a, and a conductor 120a, and the capacitor 100b includes a conductor 110b, an insulator 130b, and a conductor 120b. The conductor 110a and the conductor 110b have the same structure as the conductor 110. The insulator 130a and the insulator 130b have the same structure as the insulator 130. The conductor 120a and the conductor 120b have the same structure as the conductor 120.

Here, the capacitor 100a preferably overlaps with the transistor 200a and the transistor 200b, for example, and the capacitor 100a preferably overlaps with the channel formation region of the transistor 200a and the channel formation region of the transistor 200b. Furthermore, the capacitor 100b preferably overlaps with the transistor 200a and the transistor 200b, and, for example, the capacitor 100b preferably overlaps with the channel formation region of the transistor 200a and the channel formation region of the transistor 200b.

By providing the capacitor 100a and the capacitor 100b in this manner, the capacitance of the capacitor 100a and the capacitor 100b can be increased without increasing the area occupied by the capacitor 100a, the capacitor 100b, the transistor 200a, and the transistor 200b in a top view. As a result, the semiconductor device of this embodiment can be miniaturized or highly integrated.

Figure 16:
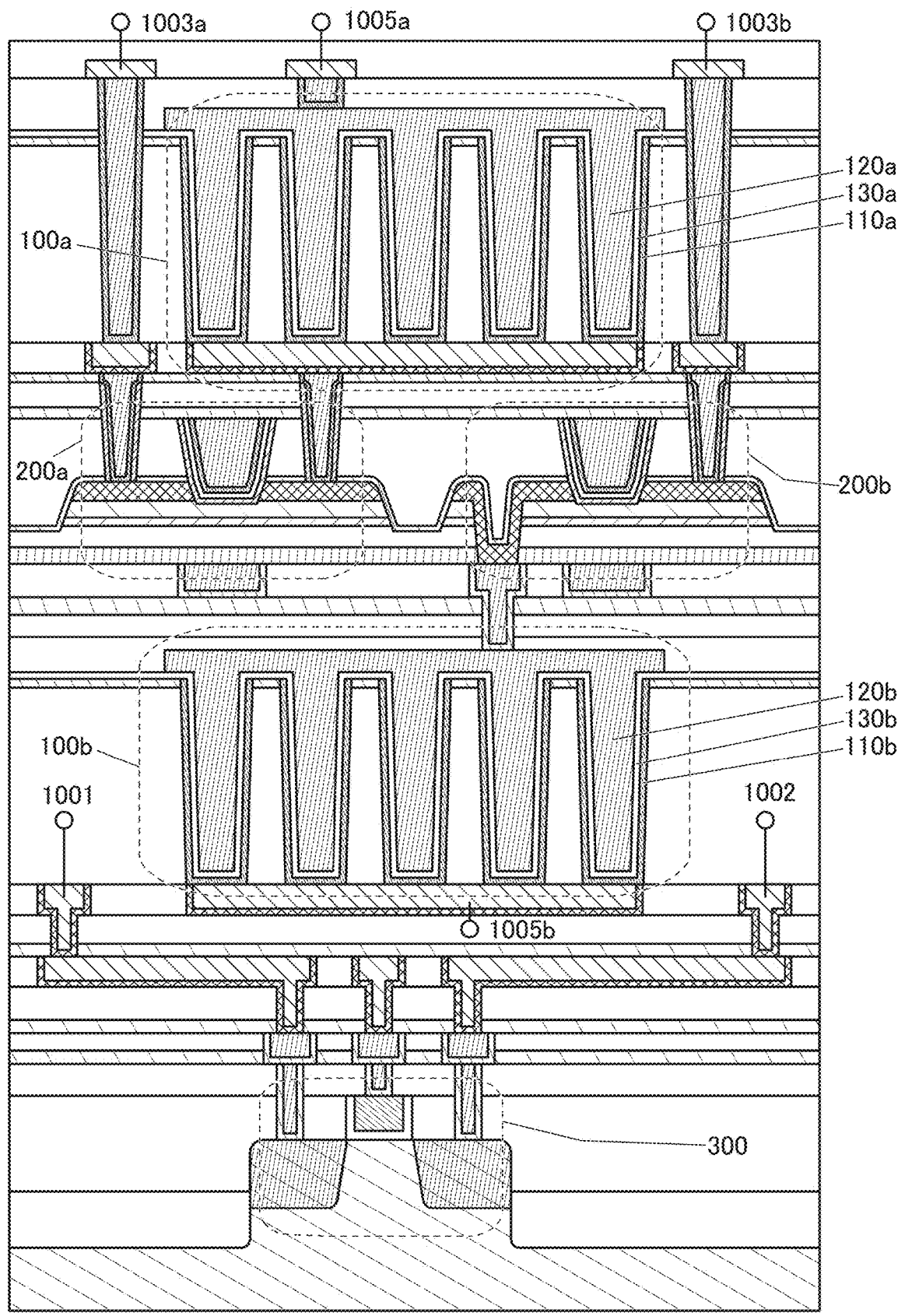
FIG. 16 A cross-sectional view showing a structure of a memory device of one embodiment of the present invention.

As shown in FIG. 16, a plurality of openings in which the capacitor 100a and capacitor 100b are provided may be provided. The conductor 110a may be separately provided by each opening. Similarly, the conductor 110b may be separated to be provided by each opening. Thus, the capacitor 100a and the capacitor 100b can be formed on the side surface of each opening. Accordingly, the capacitor 100a and the capacitor 100b shown in FIG. 16 can have larger capacitance than the capacitor 100a and the capacitor 100b in FIG. 15 while the area occupied can be approximately the same.

[Memory Device 2]

Figure 17:
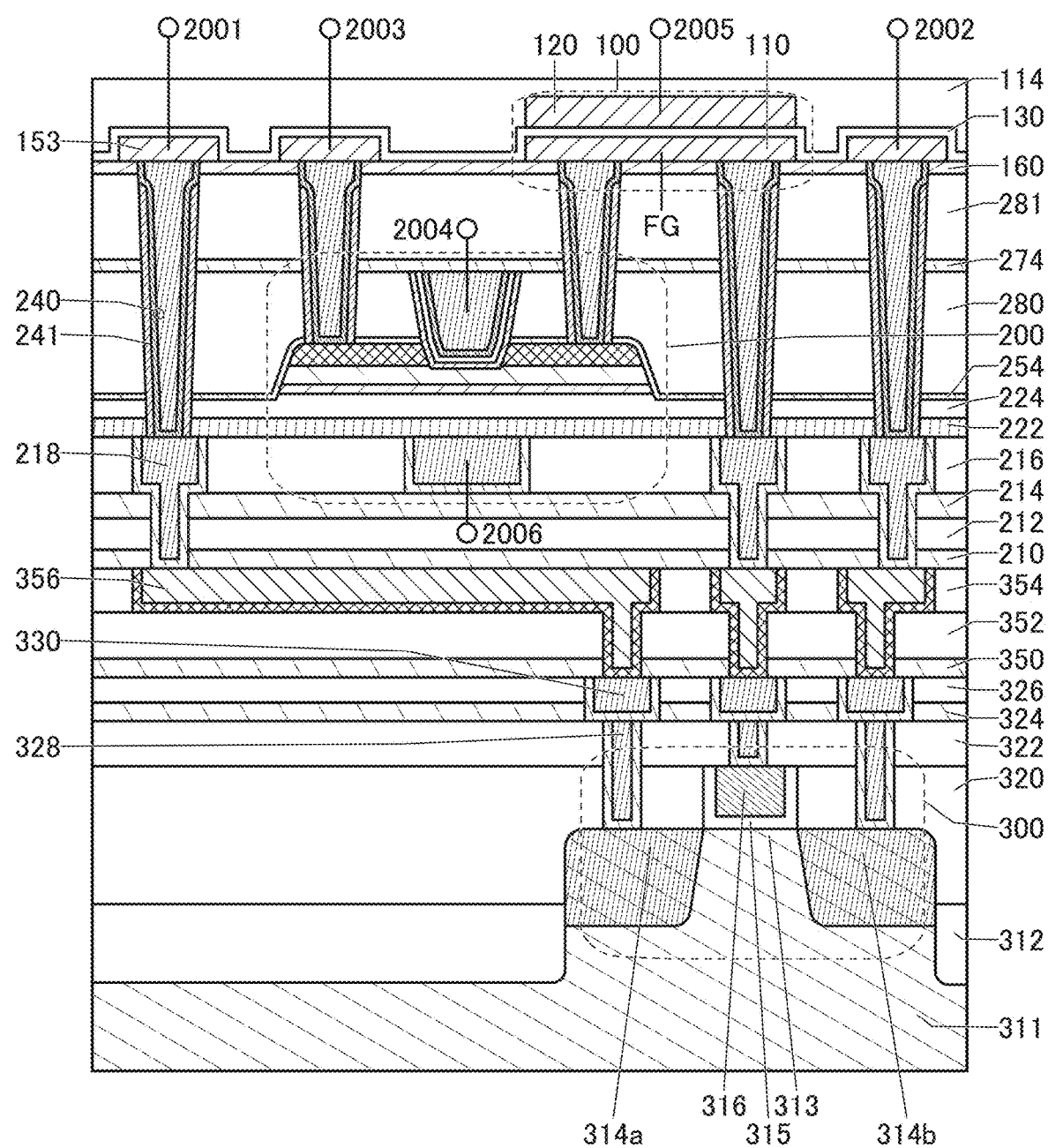
FIG. 17 A cross-sectional view showing a structure of a memory device of one embodiment of the present invention.

FIG. 17 shows an example of a semiconductor device (memory device) using the semiconductor device of one embodiment of the present invention. Like the semiconductor device shown in FIG. 12, the semiconductor device shown in FIG. 17 includes the transistor 200, the transistor 300, and the capacitor 100. Note that the semiconductor device in FIG. 17 differs from the semiconductor device in FIG. 12 in that the capacitor 100 is a planar capacitor and that the transistor 200 is electrically connected to the transistor 300.

In the semiconductor device of one embodiment of the present invention, the transistor 200 is provided above a transistor 300, and a capacitor 100 is provided above the transistor 300 and the transistor 200. Preferably, at least part of the capacitor 100 or the transistor 300 overlaps with the transistor 200. Accordingly, the area occupied by the capacitor 100, the transistor 200, and the transistor 300 in a top view can be reduced, so that the semiconductor device of this embodiment can achieve miniaturization or higher integration.

Note that the transistor 200 and the transistor 300 mentioned above can be used as the transistor 200 and the transistor 300, respectively. Therefore, the above description can be referred to for the transistor 200, the transistor 300, and the layers including thereof.

In the semiconductor device shown in FIG. 17, a wiring 2001 is electrically connected to the source of the transistor 300, and a wiring 2002 is electrically connected to the drain of the transistor 300. A wiring 2003 is electrically connected to one of the source and the drain of the transistor 200, a wiring 2004 is electrically connected to a first gate of the transistor 200, and a wiring 2006 is electrically connected to a second gate of the transistor 200. A gate of the transistor 300 and the other of the source and the drain of the transistor 200 are electrically connected to one of the electrodes of the capacitor 100. The wiring 2005 is electrically connected to the other electrode of the capacitor 100. Note that a node where the gate of the transistor 300, the other of the source and the drain of the transistor 200, and the one electrode of the capacitor 100 are connected to each other is hereinafter referred to as a node FG in some cases.

The semiconductor device shown in FIG. 17 can write, store, and read data using the characteristics that the potential of the gate (node FG) of the transistor 300 can be retained by switching of the transistor 200.

By arranging the semiconductor devices shown in FIG. 17 in a matrix, a memory cell array can be formed.

The layers including the transistor 300 has the same structure as that in the semiconductor device shown in FIG. 12, and therefore the above description can be referred to for the structure below the insulator 354.

The insulator 210, the insulator 212, the insulator 214, and the insulator 216 are provided over the insulator 354. Thus, an insulator having a function of preventing the transmission of oxygen and impurities such as hydrogen like the insulator 350 is preferably used as the insulator 210.

The conductor 218 is embedded in the insulator 210, the insulator 212, the insulator 214, and the insulator 216. The conductor 218 functions as a plug or a wiring that is electrically connected to the capacitor 100, the transistor 200, or the transistor 300. For example, the conductor 218 is electrically connected to the conductor 316 functioning as a gate electrode of the transistor 300.

The conductor 240 functions as a plug or a wiring that is electrically connected to the transistor 200 or the transistor 300. For example, the conductor 240 electrically connects the conductor 242b functioning as the other of the source and the drain of the transistor 200 and the conductor 110 functioning as one of the electrodes of the capacitor 100 through the conductor 240.

The planar capacitor 100 is provided above the transistor 200. The capacitor 100 includes the conductor 110 functioning as a first electrode, the conductor 120 functioning as a second electrode, and the insulator 130 functioning as a dielectric. Note that as the conductor 110, the conductor 120, and the insulator 130, those described above in <Memory device 1> can be used.

The conductor 153 and the conductor 110 are provided in contact with the top surface of the conductor 240. The conductor 153 is in contact with the top surface of the conductor 240 and functions as a terminal of the transistor 200 or the transistor 300.

The conductor 153 and the conductor 110 are covered with the insulator 130, and the conductor 120 is provided to overlap with the conductor 110 with the insulator 130 placed therebetween. In addition, the insulator 114 is provided over the conductor 120 and the insulator 130.

Although FIG. 17 shows an example where a planar capacitor is used as the capacitor 100, the semiconductor device of this embodiment is not limited thereto. For example, as shown in FIG. 18, the capacitor 100 may be a cylinder capacitor 100 like that shown in FIG. 12.

Here, the description of FIG. 12 can be referred to for the details of the capacitor 100. As shown in FIG. 18, the conductor 152 is preferably provided over the conductor 240, and the conductor 112 is preferably provided over the conductor 152. Such a structure enables the conductor 240 to be electrically connected to the conductor 112 with more certainty.

The insulator 154 is preferably provided over the insulator 150. An insulator that can be used as the insulator 160 can be used as the insulator 154. The conductor 153 is provided in contact with the top surface of the conductor 112. Here, the conductor 153 is in contact with the top surface of the conductor 112 and functions as a terminal of the capacitor 100, the transistor 200, or the transistor 300. In addition, the insulator 156 is provided over the conductor 153 and the insulator 154.

Figure 18:
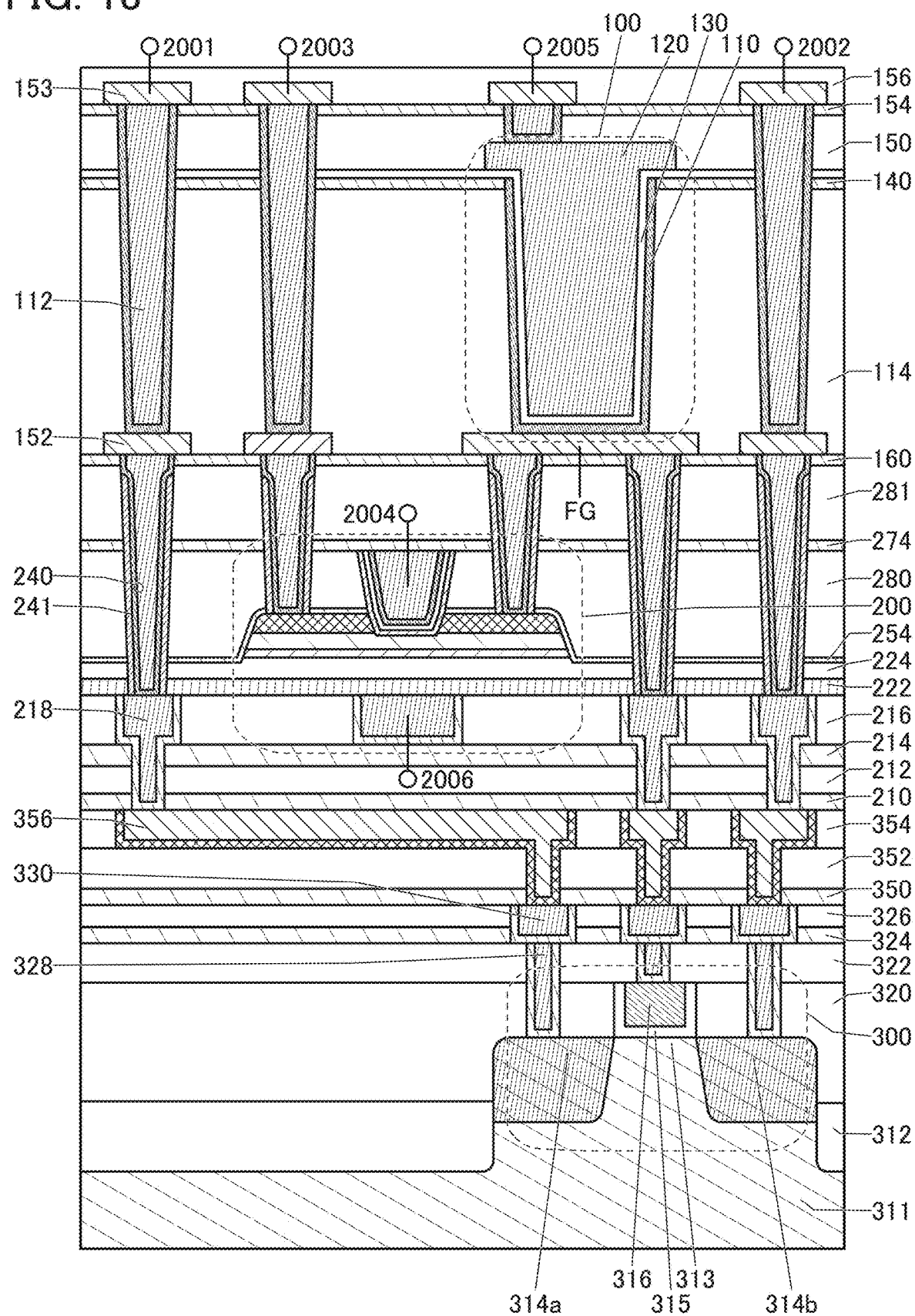
FIG. 18 A cross-sectional view showing a structure of a memory device of one embodiment of the present invention.
Figure 19:
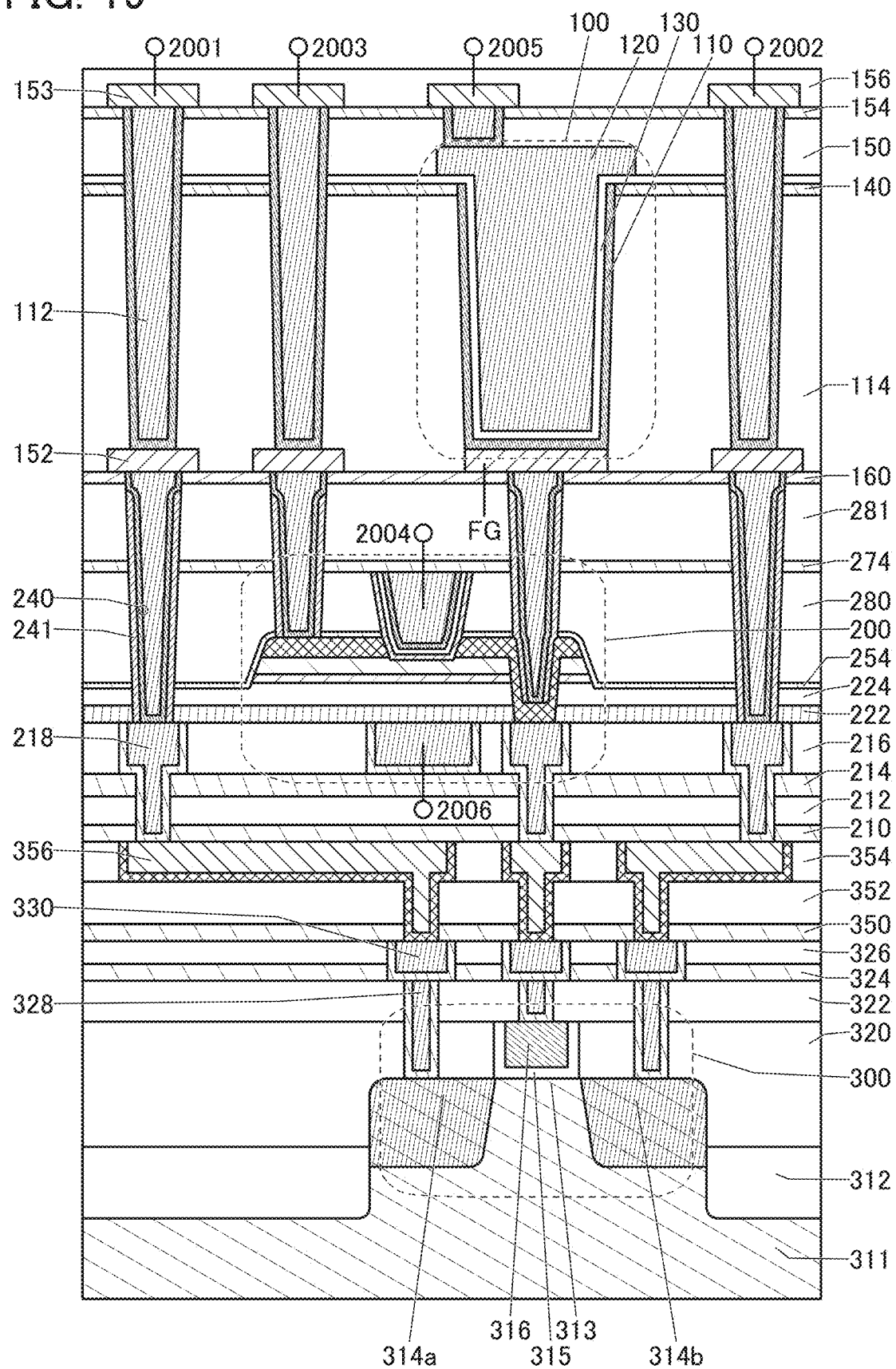
FIG. 19 A cross-sectional view showing a structure of a memory device of one embodiment of the present invention.

In the example of FIG. 18, the gate of the transistor 300 is electrically connected to the other of the source and the drain of the transistor 200 through one of the electrodes of the capacitor 100; however, the semiconductor device of this embodiment is not limited thereto. For example, as shown in FIG. 19, the gate of the transistor 300 may be electrically connected to the one of the electrodes of the capacitor 100 through the other of the source and the drain of the transistor 200. Accordingly, the area occupied by the capacitor 100, the transistor 200, and the transistor 300 in a top view can be reduced, so that the semiconductor device of this embodiment can achieve miniaturization or higher integration.

This embodiment can be implemented in an appropriate combination with the structures described in the other embodiments, examples, and the like.

Embodiment 3

In this embodiment, a memory device of one embodiment of the present invention including a transistor in which an oxide is used as a semiconductor (hereinafter referred to as an OS transistor in some cases) and a capacitor (hereinafter referred to as an OS memory device in some cases), is described with reference to FIGS. 20(A) and 20(B) and FIGS. 21(A) to 21(H). The OS memory device includes at least a capacitor and the OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 20A:
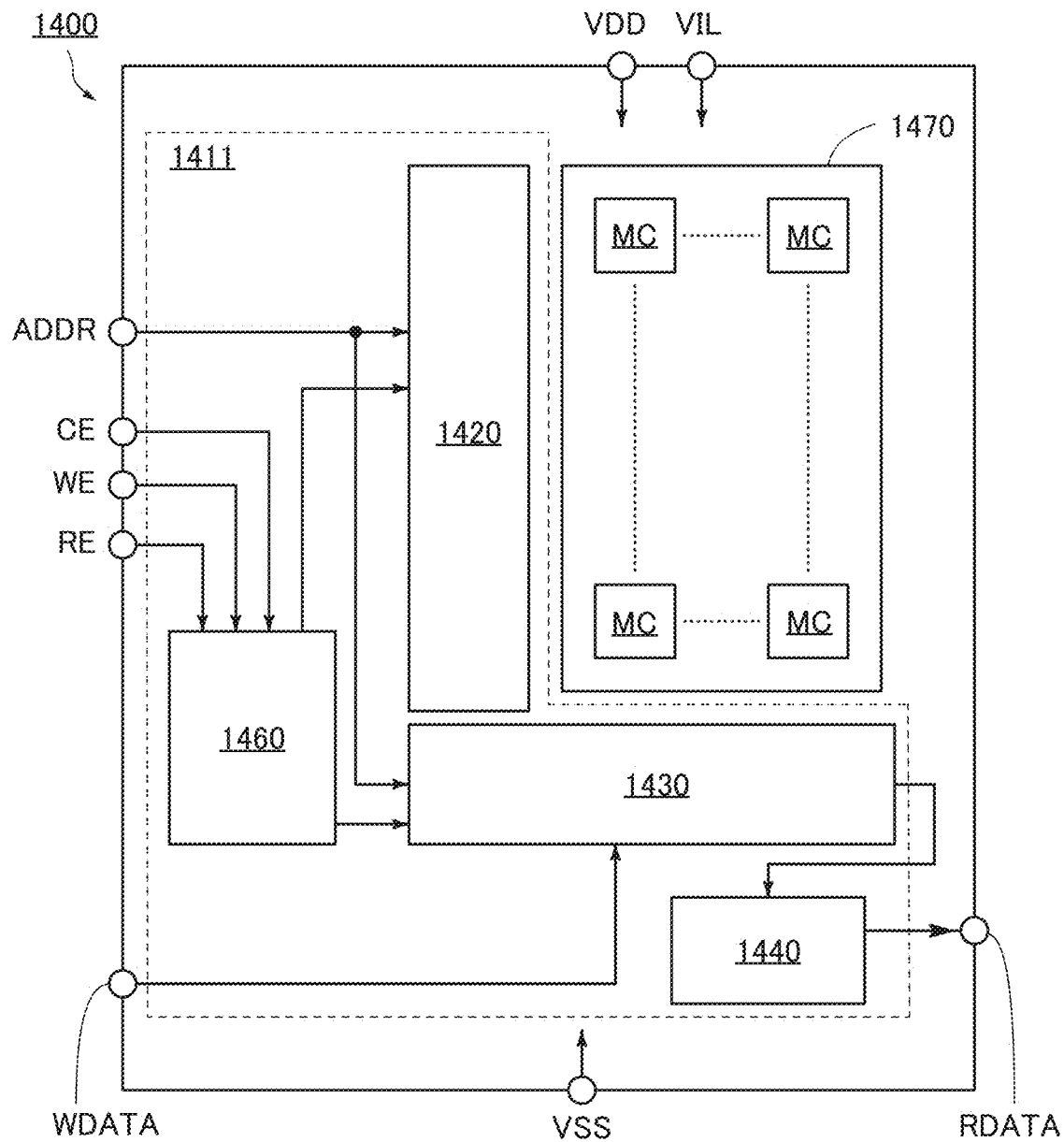
FIG. 20 (A) A block diagram showing a structure example of a memory device of one embodiment of the present invention. (B) A schematic view showing a structure example of a memory device of one embodiment of the present invention.

FIG. 20(A) shows a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the signals (CE, WE, and RE) input from the outside, and generates control signals for the row decoder and the column decoder. The input signal CE is a chip enable signal, the input signal WE is a write enable signal, and the input signal RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the structure of the memory cell. MC, the number of the memory cells MC in a column, and the like. The number of the wirings that connect the memory cell array 1470 to the column circuit 1430 depends on the structure of the memory cell MC, the number of the memory cells MC in a row, and the like.

Figure 20B:
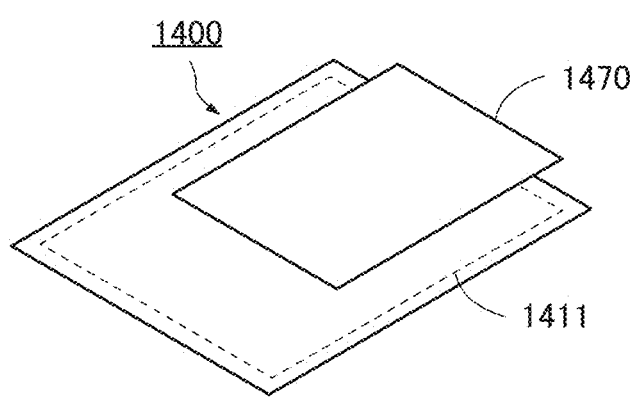

Note that MG. 20(A) shows an example in which the peripheral circuit 1411 and the memory cell array 1470 are formed on the same plane; however, this embodiment is not limited thereto. For example, as shown in FIG. 20(B), the memory cell array 1470 may be provided over the peripheral circuit 1411 to partly overlap with the peripheral circuit 1411. For example, the sense amplifier may be provided below the memory cell array 1470 so that they overlap with each other.

FIGS. 21(A) to 21(H) show structure examples of a memory cell that can be applied to the memory cell MC.

[DOSRAM]

Figure 21A:
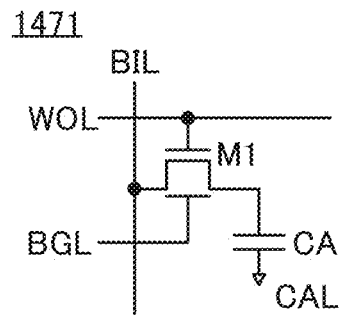
FIG. 21 (A) to (H) Circuit diagrams showing structure examples of a memory device of one embodiment of the present invention.
Figure 21B:
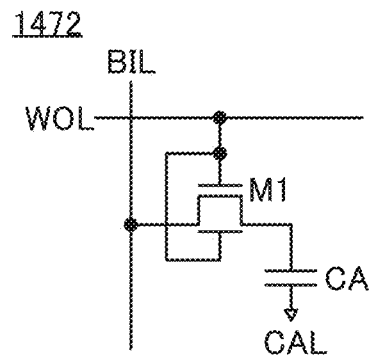
Figure 21C:
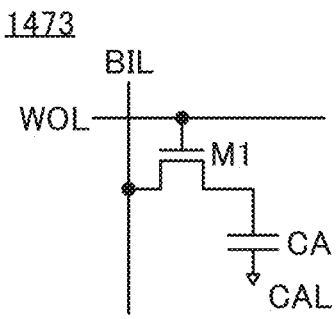

FIGS. 21(A) to 21(C) shows a circuit structure example of a memory cell of a DRAM. In this specification and the like, a DRAM using a memory cell including one OS transistor and one capacitor is referred to as DOSRAM (registered trademark) (Dynamic Oxide Semiconductor Random Access Memory) in some cases. A memory cell 1471 shown in FIG. 21(A) includes a transistor M1 and a capacitor CA. Note that the transistor M1 includes a gate (also referred to as a top gate in some cases) and a back gate.

A first terminal of the transistor M1 is connected to a first terminal of the capacitor CA. A second terminal of the transistor M1 is connected to a wiring BIL. A gate of the transistor M1 is connected to a wiring WOL. A back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 shown in FIG. 21(A) corresponds to the memory device shown in FIG. 12. That is, the transistor M1, the capacitor CA, the wiring BIL, the wiring WOL, the wiring BGL, and the wiring CAL correspond to the transistor 200, the capacitor 100, the wiring 1003, the wiring 1004, the wiring 1006, and the wiring 1005, respectively. Note that the transistor 300 shown in FIG. 12 corresponds to a transistor provided in the peripheral circuit 1411 of the memory device 1400 shown in FIG. 20(B).

The memory cell MC is not limited to the memory cell 1471, and the circuit structure can be changed. For example, as in a memory cell 1472 shown in FIG. 21(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 shown in FIG. 21(C).

In the case where the semiconductor device described in the above embodiment is used in the memory cell 1471 or the like, the transistor 200 can be used as the transistor M1, and the capacitor 100 can be used as the capacitor CA. When an OS transistor is used as the transistor M1, the leakage current of the transistor M1 can be extremely low. That is, written data can be retained for a long time with the transistor M1; thus, the frequency of refresh of the memory cell can be reduced. Alternatively, the refresh operation of the memory cell can be omitted. In addition, since the transistor M1 has an extremely low leakage current, multi-level data or analog data can be retained in the memory cell 1471, the memory cell 1472, and the memory cell 1473.

In addition, in the DOSRAM, when the sense amplifier is provided below the memory cell array 1470 to overlap with the memory cell array 1470 as described above, the bit line can be shortened. This reduces bit line capacity, which reduces the storage capacity of the memory cell.

[NOSRAM]

FIGS. 21(D) to 21(G) each show a circuit structure example of a gain-cell memory cell including two transistors and one capacitor. A memory cell 1474 shown in FIG. 21(D) includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as NOSRAM (registered trademark) (Non-volatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to the wiring RBL, a second terminal of the transistor M3 is connected to the wiring SL, and a gate of the transistor M3 is connected to the first terminal of the capacitor CB.

The wiring WBL functions as a write bit line. The wiring RBL functions as a read bit line. The wiring WOL functions as a word line. The wiring CAL functions as a wiring for applying a predetermined potential to the second terminal of the capacitor CR During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 21D:
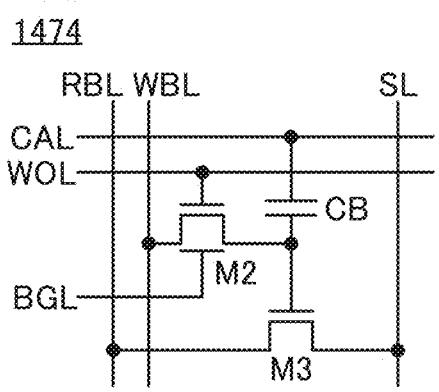
Figure 21E:
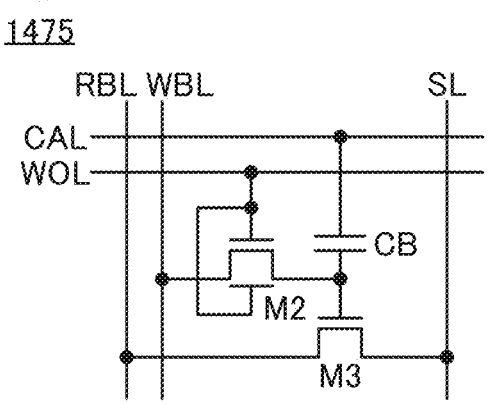
Figure 21F:
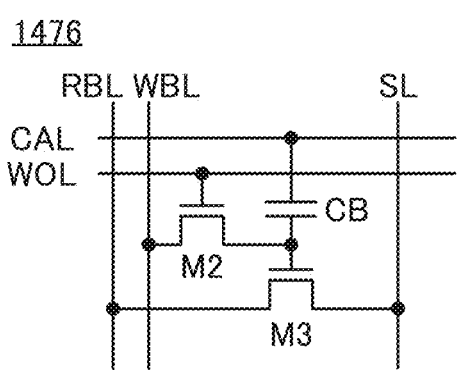
Figure 21G:
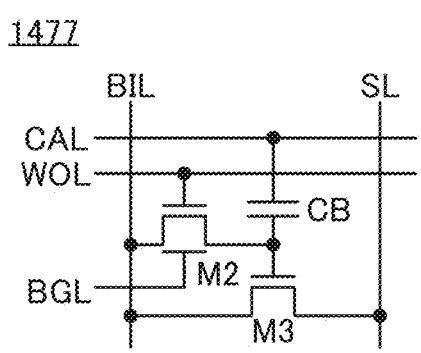

Here, the memory cell 1474 shown in FIG. 21(D) corresponds to the memory device shown in FIG. 17. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 2003, the wiring 2004, the wiring 2006, the wiring 2005, the wiring 2002, and the wiring 2001, respectively.

In addition, the memory cell MC is not limited to the memory cell 1474, and the circuit structure can be changed as appropriate. For example, as in a memory cell 1475 shown in FIG. 21(E), the back gate of the transistor M2 may be connected not to the wiring BGL but to the wiring WOL in the memory cell MC. Alternatively, for example, the memory cell MC may be a memory cell including a single-gate transistor, that is, the transistor M2 not including a back gate, as in a memory cell 1476 shown in FIG. 21(F). Alternatively, for example, in the memory cell MC, the wiring WBL and the wiring RBL may be combined into one wiring BIL, as in a memory cell 1477 shown in FIG. 21(G).

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the transistor M2; thus, the frequency of refresh of the memory cell can be reduced. Alternatively, the refresh operation of the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When an OS transistor is used as each of the transistor M2 and the transistor M3, the circuit of the memory cell array 1470 can be formed using only n-channel transistors.

Figure 21H:
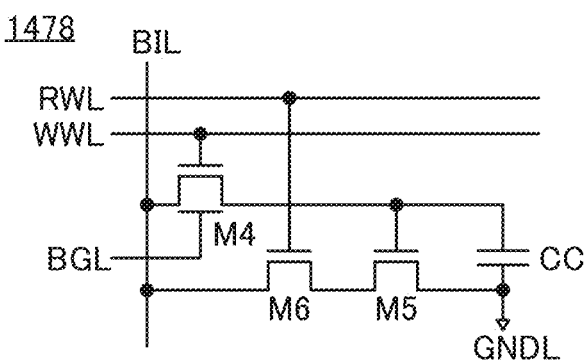

FIG. 21(H) shows an example of a gain-cell memory cell including three transistors and one capacitor. A memory cell 1478 shown in FIG. 21(H) includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

The structure described in this embodiment can be used in an appropriate combination with the structures described in the other embodiments, examples, and the like.

Embodiment 4

In this embodiment, an example of a chip 1200 on which the semiconductor device of the present invention is mounted is described with reference to FIGS. 22(A) and 22(B). A plurality of circuits (systems) are mounted on the chip 1200. A technique for integrating a plurality of circuits (systems) into one chip is referred to as system on chip (SoC) in some cases.

Figure 22A:
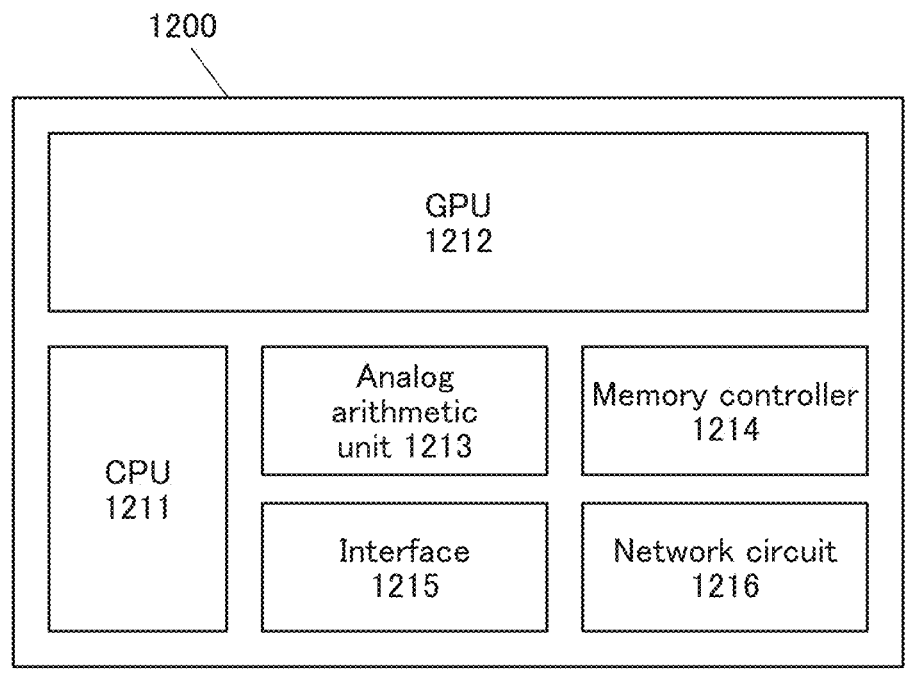
FIG. 22 (A), (B) Schematic views of a semiconductor device of one embodiment of the present invention.

As shown in FIG. 22(A), the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 22B:
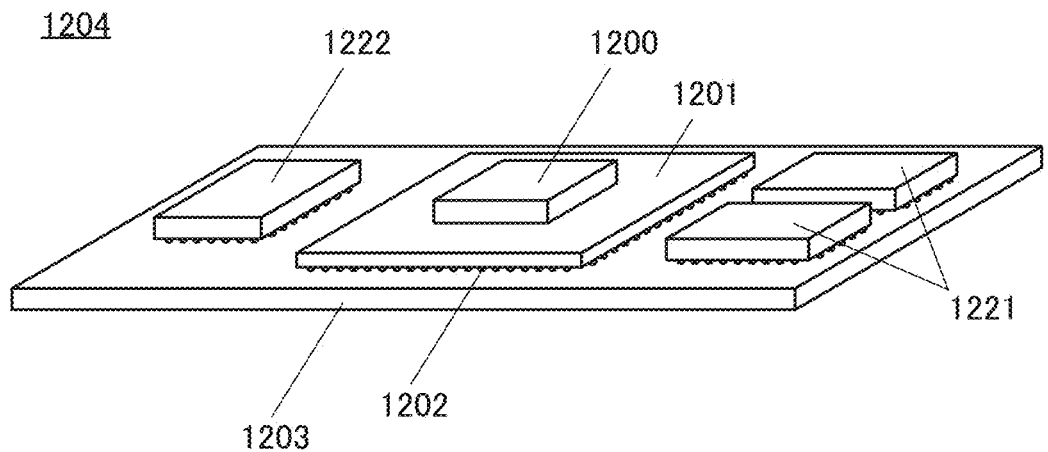

A bump (not shown) is provided on the chip 1200, and as shown in FIG. 22(B), the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Memory devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition. Multimedia Interface), or the like can be used.

The network circuit 1216 includes a circuit for a network such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of manufacturing processes; thus, the chip 1200 can be fabricated at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments, examples, and the like.

Embodiment 5

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIGS. 23(A) to 23(E) schematically show some structure examples of removable memory devices. The semiconductor device described in the above embodiment is processed into a packaged memory chip and used in a variety of storage devices and removable memories, for example.

FIG. 23(A) is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

FIG. 23(B) is a schematic external view of an SD card, and FIG. 23(C) is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

FIG. 23(D) is a schematic external view of an SSD, and FIG. 23(E) is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments, examples, and the like.

Embodiment 6

The semiconductor device of one embodiment of the present invention can be used as a processor such as a CPU and a GPU or a chip. FIGS. 24(A) to 24(H) shows specific examples of electronic devices including a chip or a processor such as a CPU or a GPU of one embodiment of the present invention.

<Electronic Device and System>

The GPU or the chip according to one embodiment of the present invention can be mounted on a variety of electronic devices. Examples of electronic devices include electronic devices with relatively large screens (e.g., television devices, monitors for desktop or laptop information terminals and the like, digital signage, and large game machines such as pachinko machines), cameras such as digital cameras and digital video cameras, digital photo frames, e-book readers, mobile phones, portable game machines, portable information terminals, and audio reproducing devices. In addition, when a GPU or a chip according to one embodiment of the present invention is provided in the electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIGS. 24(A) to 24(H) show examples of electronic devices.

[Information Terminal]

Figure 24A:
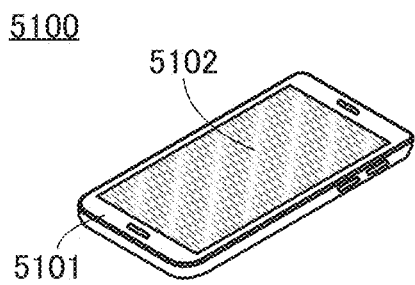
FIG. 24 (A) to (H) Diagrams showing electronic devices of one embodiment of the present invention.

FIG. 24A shows a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 24B:
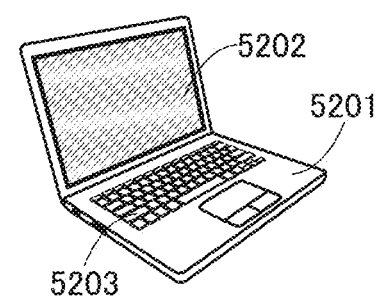

FIG. 24(B) shows a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with use of the notebook information terminal 5200, novel artificial intelligence can be developed.

Note that although FIGS. 24(A) and 24(B) show a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 24C:
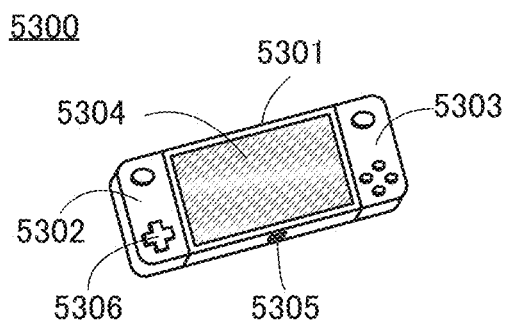

FIG. 24(C) shows a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not shown), an image to be output to the display portion 5304 can be output to another video device (not shown). In that case, the housing 5302 and the housing 5303 can each function as an operating unit. Thus, a plurality of players can perform a game at the same time. The chip described in the above embodiment can be incorporated into the chip provided on a substrate in the housing 5301, the housing 5302 and the housing 5303.

Figure 24D:
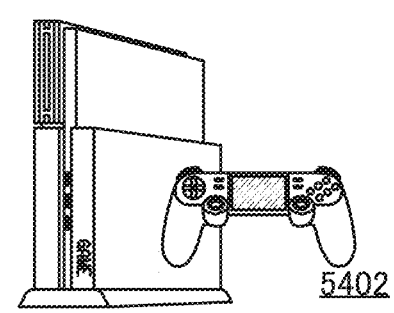

FIG. 24(D) shows a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIGS. 23(C) and 24(D), the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 24E:
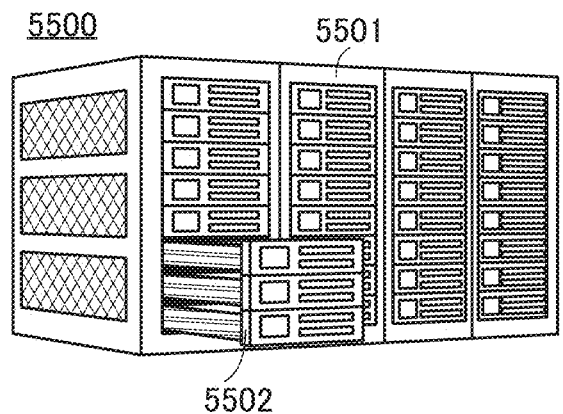
Figure 24F:
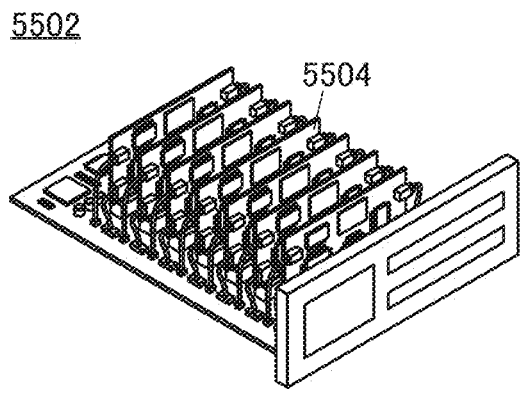

FIG. 24(E) shows a supercomputer 5500 as an example of a large computer. FIG. 24(F) shows a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is shown as an example of a large computer in FIGS. 24(E) and 24(F), a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 24G:
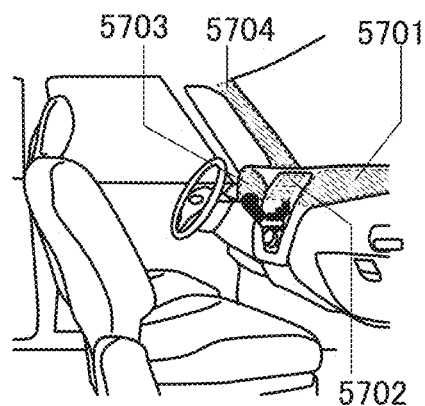

FIG. 24(G) shows an area around a windshield inside an automobile, which is an example of a moving vehicle. FIG. 24(G) shows a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not shown) provided for the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 24H:
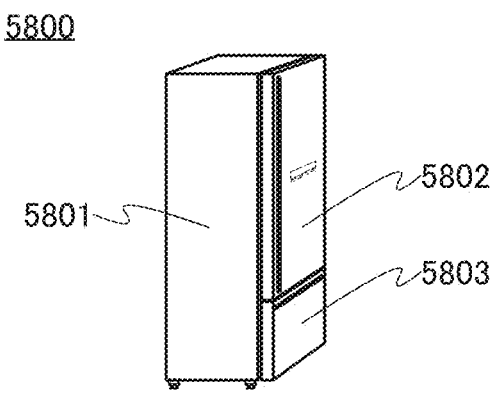

FIG. 24(H) shows an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments, examples, and the like.

EXAMPLE

Part of the transistor described in the above embodiments were fabricated, and the crystallinity and the impurities were evaluated in this example. Specifically, a plurality of samples (Sample 1A to Sample 3A) which have a structure similar to that of part of the transistor 200 shown in FIGS. 1(A) to 1(C) were fabricated, and the cross section was observed by cross-sectional SEEM and elemental analysis was performed by EDX.

Note that the cleaning process before forming the oxide 230c was different between Sample 1A to Sample 3A. Specifically, Sample 1A was not subjected to the cleaning process. For Sample 2A, the cleaning process was performed using diluted hydrofluoric acid whose hydrofluoric acid concentration was 2 ppm. For Sample 3A, the cleaning process was performed using diluted ammonia water whose ammonia concentration was 0.29%.

Next, a structure of Sample 1A to Sample 3A is described below. Note that Sample 1A to Sample 3A have the same structure. As shown in FIGS. 1(A) to 1(C), Sample 1A to Sample 3A include the oxide 230a over a base film, the oxide 230b over the oxide 230a, the conductor 242a and the conductor 242b positioned apart from each other and over the oxide 230b, the insulator 254 over the conductor 242a, the conductor 242b, and the insulator 224, the insulator 280 over the insulator 254, the oxide 230c over the oxide 230b, the insulator 250 over the oxide 230c, the conductor 260 (the conductor 260a and the conductor 260b) over the insulator 250, and the insulator 274 over the insulator 280 and the conductor 260.

As the oxide 230a, a 5-nm-thick In—Ga—Zn oxide deposited by a DC sputtering method was used. In the deposition of the oxide 230a, an oxide target with In:Ga:Zn=1:3:4 [atomic ratio] was used; an oxygen gas at 45 sccm was used as a deposition gas; the deposition pressure was 0.7 Pa; the deposition power was 500 W; the substrate temperature was 200° C.; and the target-substrate distance was 60 mm.

As the oxide 230b, a 15-nm-thick In—Ga—Zn oxide deposited by a DC sputtering method was used. In the deposition of the oxide 230b, an oxide target with In:Ga:Zn=4:2:4.1 [atomic ratio] was used; an oxygen gas at 45 sccm was used as the deposition gas; the deposition pressure was 0.7 Pa; the deposition power was 500 W; the substrate temperature was 200° C.; and the target-substrate distance was 60 mm.

As each of the conductor 242a and the conductor 242b, a 25-nm-thick tantalum nitride was used. As the insulator 254, a stacked film of a 5-nm-thick aluminum oxide deposited by a sputtering method and a 3-nm-thick aluminum oxide deposited thereover by an ALD method was used.

Silicon oxynitride deposited by a PECVD method was used as the insulator 280.

The oxide 230c was stacked films including a first layer and a second layer over the first layer. As the first layer of the oxide 230c, a 3-nm-thick In—Ga—Zn oxide deposited by a DC sputtering method was used. In the deposition of the first layer of the oxide 230c, an oxide target with In:Ga:Zn=4:2:4.1 [atomic ratio] was used; an oxygen gas at 45 sccm was used as the deposition gas; the deposition pressure was 0.7 Pa; the deposition power was 500 W; the substrate temperature was 200° C.; and the target-substrate distance was 60 mm.

As the second layer of the oxide 230c, a 3-nm-thick In—Ga—Zn oxide deposited by a DC sputtering method was used. In the deposition of the second layer of the oxide 230c, an oxide target with In:Ga:Zn=1:3:4 [atomic ratio] was used; an oxygen gas at 45 sccm was used as a deposition gas; the deposition pressure was 0.7 Pa; the deposition power was 500 W; the substrate temperature was 200° C.; and the target-substrate distance was 60 mm.

As the insulator 250, a 6-nm-thick silicon oxynitride was used. As the conductor 260a, a 5-nm-thick titanium nitride was used. As the conductor 260b, tungsten was used.

A 40-nm-thick aluminum oxide was used as the insulator 274 formed by an RF sputtering method. The insulator 274 was formed under the following conditions: an $Al_2O_3$ target was used, an argon gas at 25 sccm and an oxygen gas at 25 sccm were used as the deposition gases, the deposition pressure was 0.4 Pa, the deposition power was 2500 W, the substrate temperature was 250° C., and the target-substrate distance was 60 mm. Then, as the insulator 281, silicon oxynitride was used formed by a PECVD method.

Sample 1A to Sample 3A having the structure above were designed to have a channel length of 60 nm and a channel width of 60 nm. After being fabricated, Sample 1A to Sample 3A were subjected to heat treatment at 400° C. for 4 hours in a nitrogen atmosphere.

Figure 25:
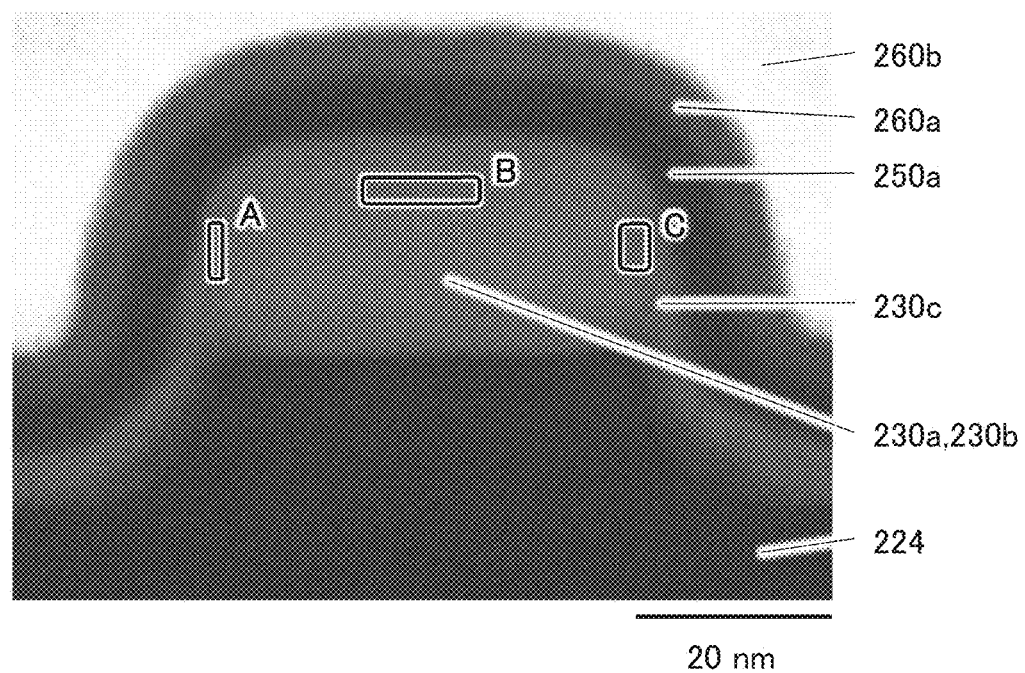
FIG. 25 A cross-sectional STEM image of a sample of the example.

Next, cross-sectional observation and elemental analysis of Sample 1A to Sample 3A were performed. As an apparatus for cross-sectional observation and EDX measurement, HD-2700 manufactured by Hitachi High-Technologies Corporation was used. As an apparatus for elementary analysis, an EDX Si(Li) detector manufactured by EDAX Inc. was used. FIG. 25 is a cross-sectional STEM image of the channel formation region and the vicinity thereof of Sample 1A in the channel width direction. Note that the structure shown in FIG. 25 was also observed in Sample 2A and Sample 3A.

Here, a region A in FIG. 25 corresponds to the left end portion and the vicinity thereof of the oxide 230b in contact with the oxide 230c. A region B in FIG. 25 corresponds to the top end portion and the vicinity thereof of the oxide 230b in contact with the oxide 230c. A region C ria FIG. 25 corresponds to the right end portion and the vicinity thereof of the oxide 230b in contact with the oxide 230c.

Figure 26:
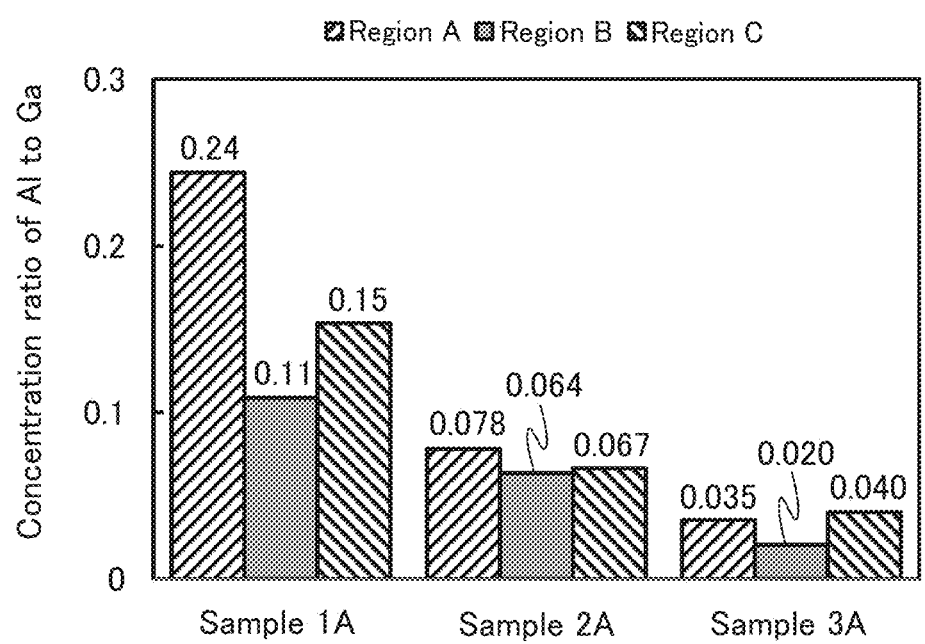
FIG. 26 A chart showing the EDX results of the samples of the example.

Next, FIG. 26 shows calculation results of the concentration ratio of aluminum (A1) to gallium (Ga) in the region. A to the region C in Sample 1A to Sample 3C. The vertical axis in FIG. 26 is the concentration ratio of aluminum to gallium (dimensionless unit).

FIG. 26 shows that the concentration ratio of aluminum to gallium was greater than or equal to 0.11 in Sample 1A, less than 0.1 in Sample 2A, and less than 0.05 in Sample 3A. In each of the region A to the region C, Sample 1A had the largest aluminum concentration ratio to gallium, Sample 2A had the second largest aluminum concentration ratio to gallium, and Sample 3A had the least aluminum concentration ratio to gallium. Thus, it was found that before the oxide 230c was formed, cleaning treatment using diluted hydrofluoric acid or diluted ammonia water was performed, whereby impurities at the interface between the oxide 230b and the oxide 230c and the vicinity thereof can be removed.

Figure 27A:
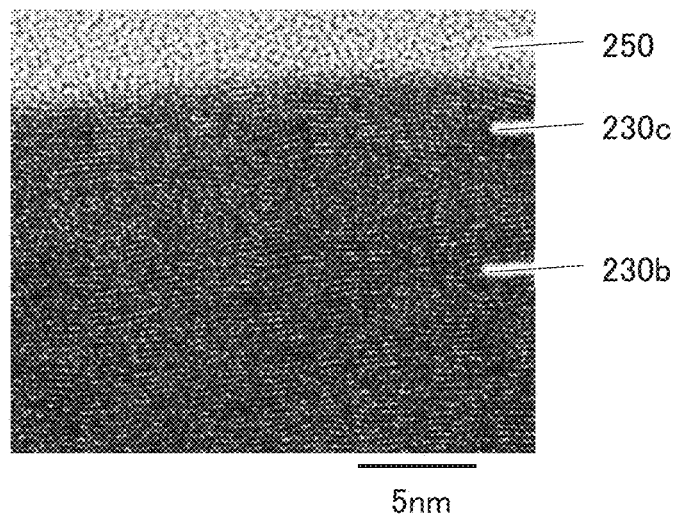
FIG. 27 (A) to (C) Cross-sectional TEM images of the samples of the example.
Figure 27B:
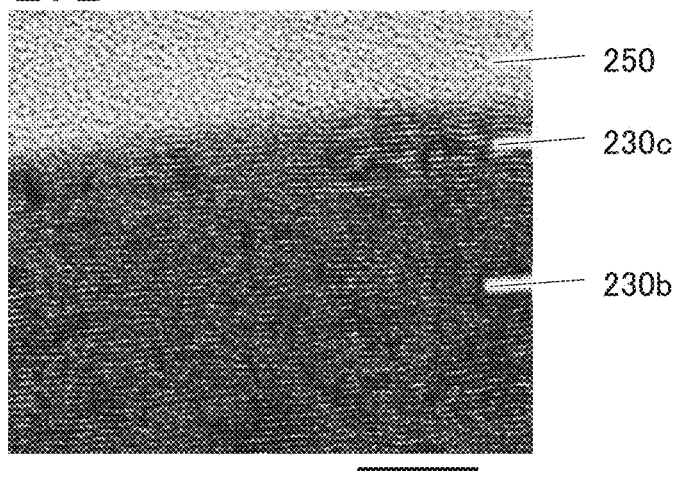
Figure 27C:
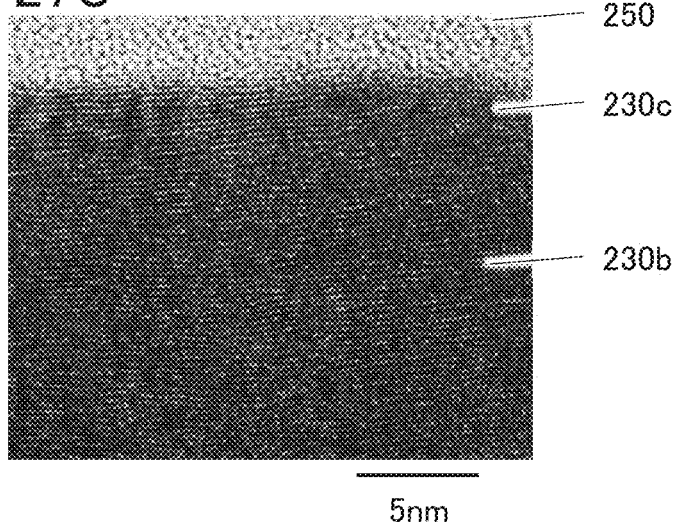

Next, the crystallinity at the interface between the oxide 230b and the oxide 230c and the vicinity thereof of Sample 1A to Sample 3A were evaluated. FIGS. 27(A) to 27(C) show enlarged cross-sectional TEM images of the region B shown in FIG. 25. FIG. 27(A) is an enlarged cross-sectional TEM image of the region B of Sample 1A, FIG. 27(B) is an enlarged cross-sectional TEM image of the region B of Sample 2A, and FIG. 27(C) is an enlarged cross-sectional TEM image of the region B of Sample 3A.

FIG. 27(A) shows that a region difficult to identify as a layered structure was observed at the interface and the vicinity thereof between the oxide 230b and the oxide 230c in Sample 1A. The region is regarded as a low crystallinity region. Furthermore, FIGS. 27(B) and 27(C) show that regions having layered structures were observed at the interface and the vicinity thereof between the oxide 230b and the oxide 230c in Sample 2A and Sample 3A. Therefore, it was found that the region having a layered structure of the oxide 230b and the region having a layered structure of the oxide 230c have continuity.

As described above, impurities at the interface and the vicinity thereof between the oxide 230b and the oxide 230c are removed, whereby the crystallinity of the interface and the vicinity thereof between the oxide 230b and the oxide 230c can be increased.

At least part of the structure, the method, and the like described above in this example can be implemented in appropriate combination with other embodiments and examples described in this specification.

REFERENCE NUMERALS 100 capacitor, 100a capacitor, 100b capacitor, 110 conductor, 110a conductor, 110b conductor, 112 conductor, 114 insulator, 120 conductor, 120a conductor, 120b conductor, 130 insulator, 130a insulator, 130b insulator, 140 insulator, 150 insulator, 152 conductor, 153 conductor, 154 insulator, 156 insulator, 160 insulator, 200 transistor, 200A transistor, 200a transistor, 200b transistor, 205 conductor, 210 insulator, 212 insulator, 214 insulator, 216 insulator, 218 conductor, 222 insulator, 224 insulator, 230 oxide, 230a oxide, 230A oxide film, 230b oxide, 230B oxide film, 230c oxide, 230c1 oxide, 230c2 oxide, 230C oxide film, 240 conductor, 240a conductor, 240b conductor, 241 insulator, 241a insulator, 241b insulator, 242 conductor, 242a conductor, 242A conductive film, 242b conductor, 242B conductive layer, 247 conductor, 248 opening, 250 insulator, 250A insulating film, 254 insulator, 254A insulating film, 260 conductor, 260a conductor, 260A conductive film, 260b conductor, 260B conductive film, 274 insulator, 280 insulator, 280a insulator, 280b insulator, 281 insulator, 300 transistor, 311 substrate, 312 insulator, 313 semiconductor region, 314a low-resistance region, 314b low-resistance region, 315 insulator, 316 conductor, 320 insulator, 322 insulator, 324 insulator, 326 insulator, 328 conductor, 330 conductor, 350 insulator, 352 insulator, 354 insulator, 356 conductor, 360 insulator, 362 insulator, 364 insulator, 366 conductor, 1001 wiring, 1002 wiring, 1003 wiring, 1003a wiring, 1003b wiring, 1004 wiring, 1005 wiring, 1005a wiring, 1005b wiring, 1006 wiring, 1007 wiring, 2001 wiring, 2002 wiring, 2003 wiring, 2004 wiring, 2005 wiring, 2006 wiring

The invention claimed is:

1. A semiconductor device comprising:
a fourth conductor functioning as a bottom gate electrode;
a fifth insulator over the fourth conductor;
a third insulator over the fifth insulator;
a third oxide over the third insulator;
a first oxide over the third oxide, the first oxide comprising a channel formation region;
a first conductor over and in contact with a top surface of the first oxide, the first conductor functioning as one of a source electrode and a drain electrode;
a second conductor over and in contact with the top surface of the first oxide, the second conductor functioning as the other of the source electrode and the drain electrode;
a first insulator over the first conductor and the second conductor;
a second oxide in contact with the top surface of the first oxide;
a second insulator over the second oxide, the second insulator functioning as a gate insulator;
a third conductor over the second insulator, the third conductor functioning as a gate electrode; and
a fourth insulator over the first insulator,
wherein the second oxide, the second insulator, the third conductor are positioned inside an opening in the first insulator and an opening in the fourth insulator,
wherein the first insulator comprises aluminum,
wherein the first oxide comprises indium, an element M, and zinc,
wherein the element M is gallium, yttrium, or tin,
wherein the first oxide comprises a first region overlapping with the third conductor, and
wherein the first region comprises a region in which an atomic ratio of aluminum to the element M is less than 0.1.

2. The semiconductor device according to claim 1,
wherein the first oxide further comprises:
a second region in contact with the first conductor; and
a third region in contact with the second conductor,
wherein a thickness of the first oxide in the first region is smaller than a thickness of the first oxide in the second region, and
wherein a thickness of the first oxide in the first region is smaller than a thickness of the first oxide in the third region.

3. The semiconductor device according to claim 1,
wherein each of the first oxide and the second oxide comprises a c-axis aligned crystal.

4. The semiconductor device according to claim 1,
wherein the first region comprises a first end portion, a second end portion, and a top end portion between the first end portion and the second end portion, and
wherein an atomic ratio of aluminum to the element M in the top end portion is smaller than an atomic ratio of aluminum to the element M in each of the first end portion and the second end portion.

5. A semiconductor device comprising:
a first oxide comprising a channel formation region;
a first conductor over and in contact with a top surface of the first oxide, the first conductor functioning as one of a source electrode and a drain electrode;
a second conductor over and in contact with the top surface of the first oxide, the second conductor functioning as the other of the source electrode and the drain electrode;
a first insulator over the first conductor and the second conductor;
a second oxide in contact with the top surface of the first oxide;
a second insulator over the second oxide, the second insulator functioning as a gate insulator; and
a third conductor over the second insulator, the third conductor functioning as a gate electrode,
wherein the first insulator comprises aluminum,
wherein the first oxide comprises indium, an element M, and zinc,
wherein the element M is gallium, yttrium, or tin,
wherein the first oxide comprises a first region overlapping with the third conductor, and
wherein the first region comprises a region in which an atomic ratio of aluminum to the element M is less than 0.1.

6. The semiconductor device according to claim 5,
wherein the first oxide further comprises:
a second region in contact with the first conductor; and
a third region in contact with the second conductor,
wherein a thickness of the first oxide in the first region is smaller than a thickness of the first oxide in the second region, and
wherein a thickness of the first oxide in the first region is smaller than a thickness of the first oxide in the third region.

7. The semiconductor device according to claim 5,
wherein each of the first oxide and the second oxide comprises a c-axis aligned crystal.

8. The semiconductor device according to claim 5,
wherein the first region comprises a first end portion, a second end portion, and a top end portion between the first end portion and the second end portion, and
wherein an atomic ratio of aluminum to the element M in the top end portion is smaller than an atomic ratio of aluminum to the element M in each of the first end portion and the second end portion.

9. A fabrication method of a semiconductor device comprising a first oxide, a second oxide, a third oxide, a first conductor, a second conductor, a third conductor, a first insulator, a second insulator, a third insulator, and a fourth insulator, comprising:
forming the third insulator;
forming the third oxide over the third insulator;
forming the first oxide over the third oxide;
forming a conductive film over the first oxide;
forming the first insulator over the third insulator and the conductive film;
forming the fourth insulator over the first insulator;
forming an opening from which the first oxide is exposed in the fourth insulator, the first insulator, and the conductive film, so that the first conductor and the second conductor are formed;
removing part of the exposed first oxide;
forming the second oxide over the first oxide and the fourth insulator;
forming the second insulator over the second oxide;
forming the third conductor over the second insulator; and
removing part of the second oxide, the second insulator, and the third conductor to expose part of the fourth insulator, wherein the first insulator comprises aluminum,
wherein the first oxide comprises indium, an element M, and zinc, and
wherein the element M is gallium, yttrium, or tin.

10. The fabrication method of the semiconductor device according to claim 9,
wherein the first oxide comprises a region in which an atomic ratio of aluminum to the element M is less than 0.1.

11. The fabrication method of the semiconductor device according to claim 9,
wherein the step of removing part of the exposed first oxide is performed by diluted ammonia water.

12. The fabrication method of the semiconductor device according to claim 11,
wherein an ammonia concentration of the diluted ammonia water is greater than or equal to 0.1% and less than or equal to 0.5%.

* * * * *